(12) United States Patent
Katayama et al.

(10) Patent No.: US 9,117,984 B2
(45) Date of Patent: Aug. 25, 2015

(54) ENCAPSULATING LAYER-COVERED OPTICAL SEMICONDUCTOR ELEMENT, PRODUCING METHOD THEREOF, AND OPTICAL SEMICONDUCTOR DEVICE

(71) Applicant: NITTO DENKO CORPORATION, Ibaraki-shi, Osaka (JP)

(72) Inventors: Hiroyuki Katayama, Osaka (JP); Hiroshi Noro, Osaka (JP); Hisataka Ito, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/141,607

(22) Filed: Dec. 27, 2013

(65) Prior Publication Data
US 2014/0183593 A1 Jul. 3, 2014

(30) Foreign Application Priority Data
Dec. 28, 2012 (JP) ................................ 2012-287919

(51) Int. Cl.
*H01L 33/50* (2010.01)
*H01L 33/52* (2010.01)
*H01L 33/60* (2010.01)

(52) U.S. Cl.
CPC ............... *H01L 33/52* (2013.01); *H01L 33/50* (2013.01); *H01L 33/60* (2013.01); *H01L 33/501* (2013.01); *H01L 2933/005* (2013.01); *H01L 2933/0041* (2013.01)

(58) Field of Classification Search
CPC ................... H01L 33/52; H01L 33/501; H01L 2933/0041; H01L 2933/005; H01L 33/50; H01L 33/60
USPC ........................................ 257/100; 438/26, 27
See application file for complete search history.

(56) References Cited

U.S. PATENT DOCUMENTS

| 7,259,030 B2 * | 8/2007 | Daniels et al. ................... 438/22 |
| 2002/0011655 A1 | 1/2002 | Nishiyama et al. |
| 2003/0092252 A1 | 5/2003 | Nishiyama et al. |
| 2005/0215033 A1 | 9/2005 | Yamamoto et al. |
| 2011/0193114 A1 * | 8/2011 | Lerman et al. ................... 257/91 |
| 2013/0264589 A1 * | 10/2013 | Bergmann et al. .............. 257/88 |

FOREIGN PATENT DOCUMENTS

| JP | 2001-308116 A | 11/2001 |
| JP | 2005-286003 A | 10/2005 |
| JP | 2012-039013 A | 2/2012 |

* cited by examiner

*Primary Examiner* — Roy Potter
*Assistant Examiner* — Paul Patton
(74) *Attorney, Agent, or Firm* — Sughrue Mion, PLLC

(57) ABSTRACT

A method for producing an encapsulating layer-covered optical semiconductor element includes a disposing step of disposing an encapsulating layer at one side in a thickness direction of a support and a covering step of, after the disposing step, covering an optical semiconductor element with the encapsulating layer so as to expose one surface thereof to obtain an encapsulating layer-covered optical semiconductor element.

5 Claims, 20 Drawing Sheets

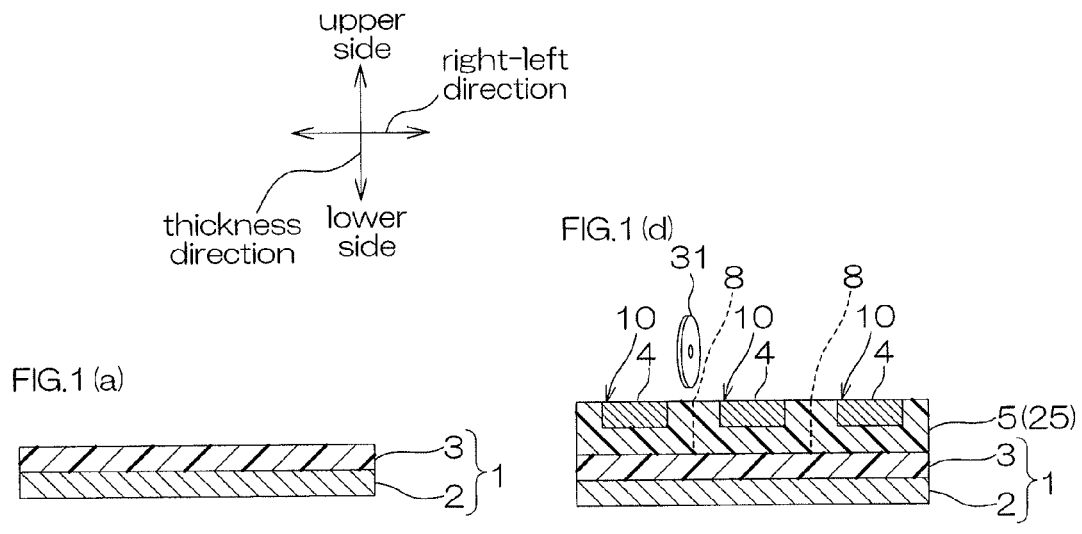
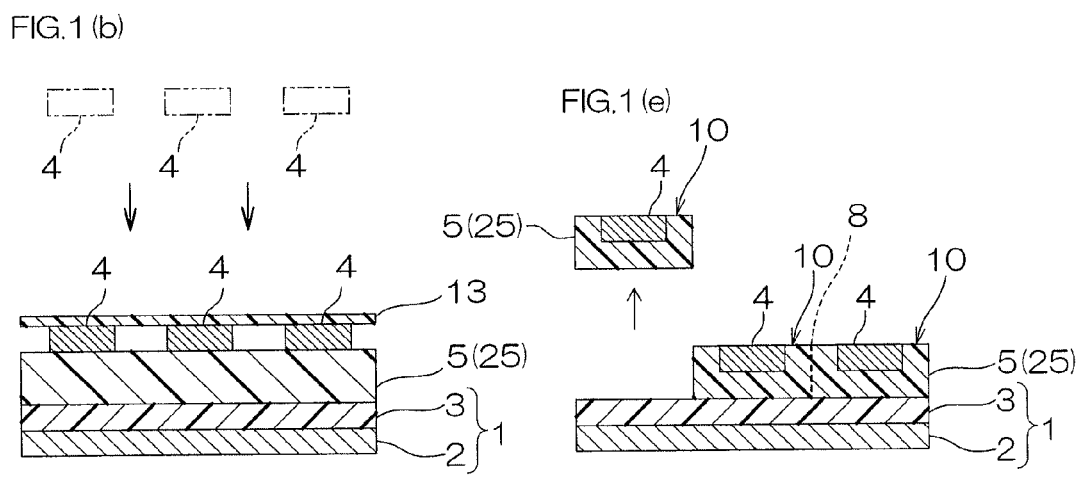
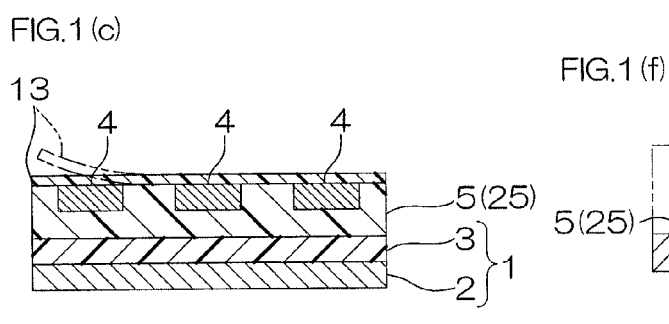

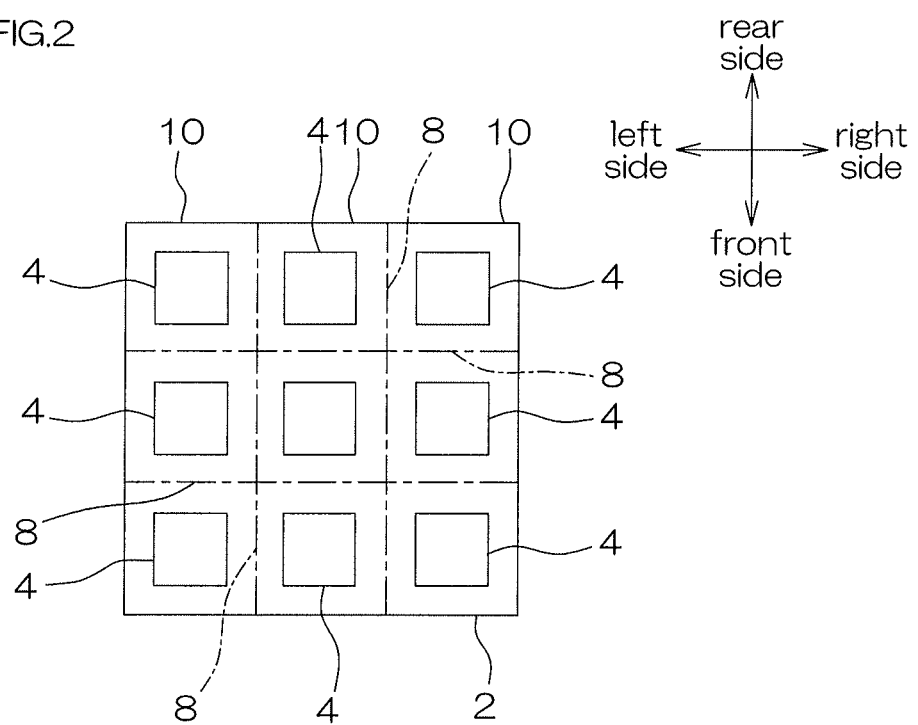

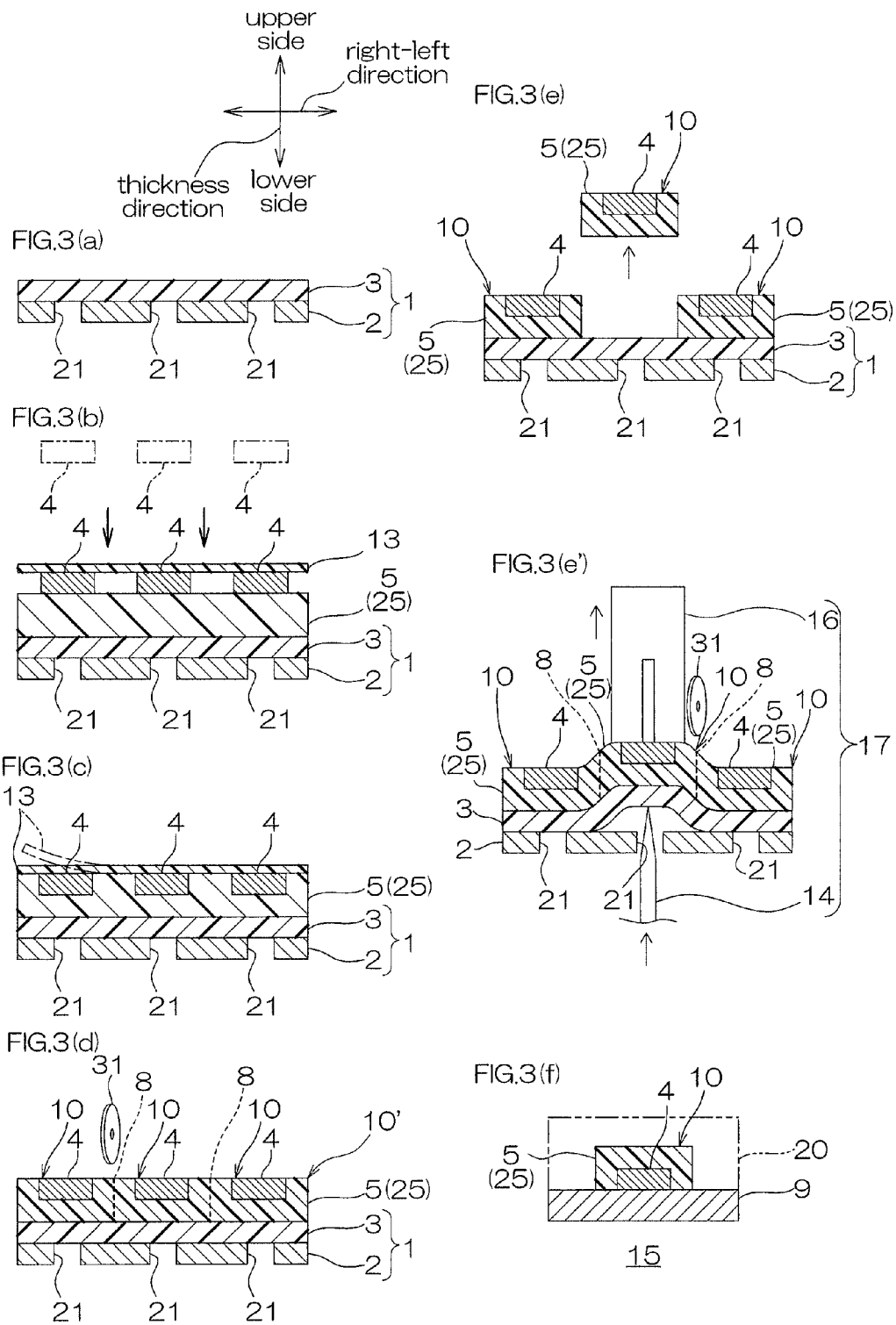

FIG.4
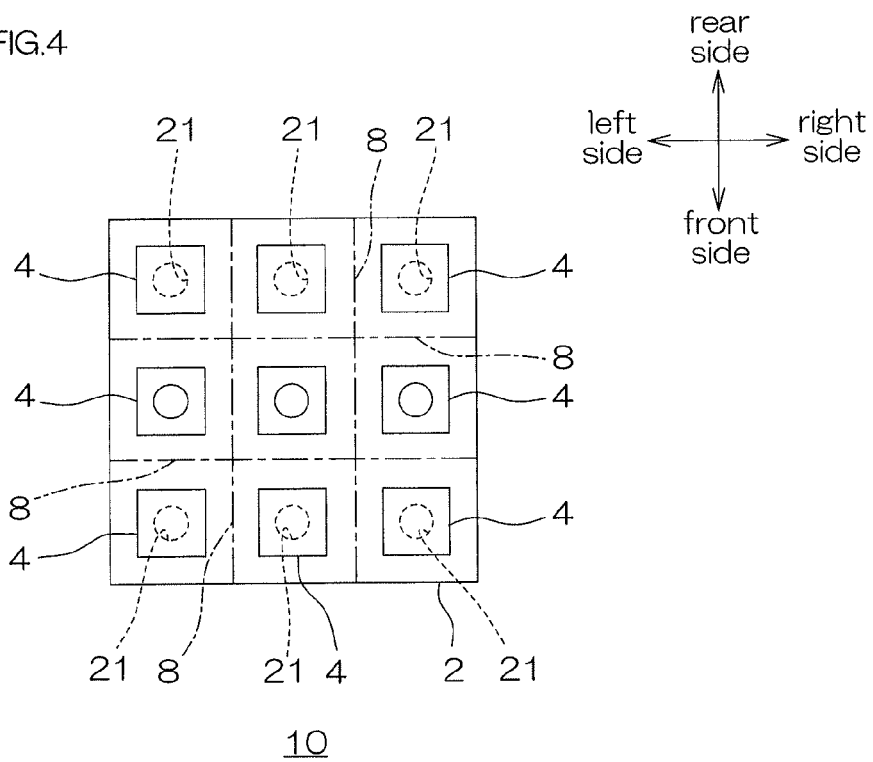
FIG.5 modified example
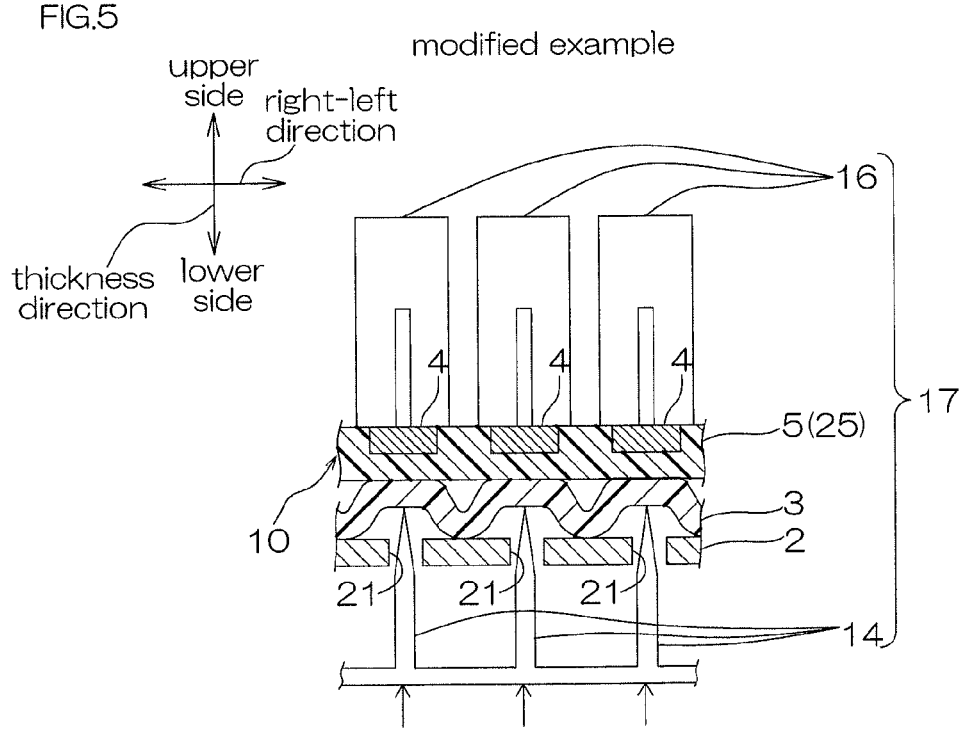

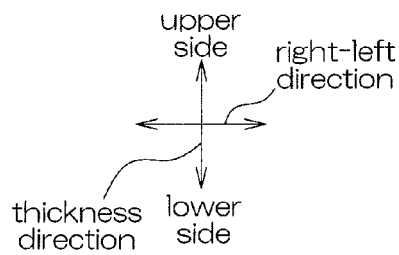
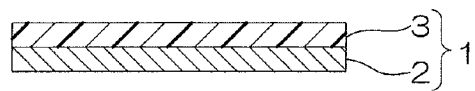
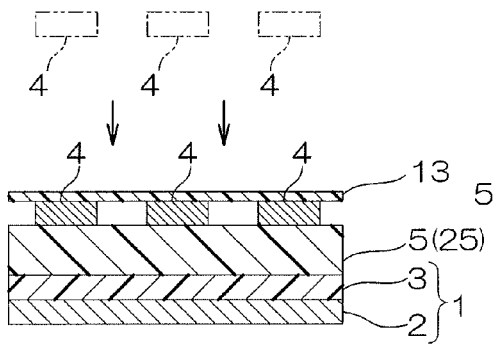
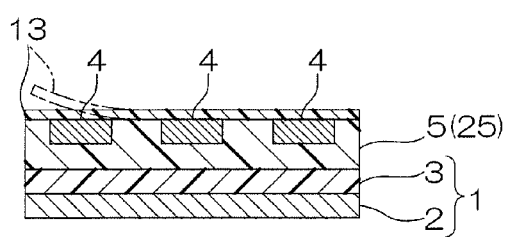
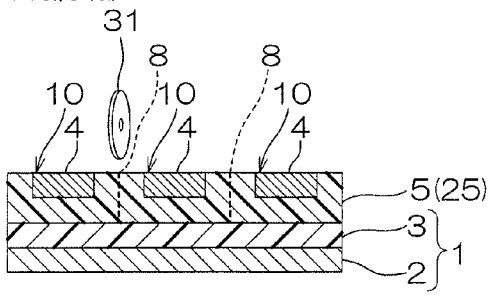
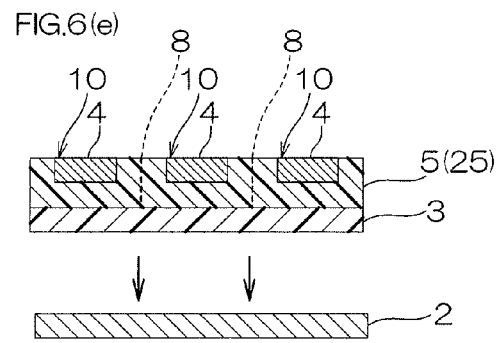
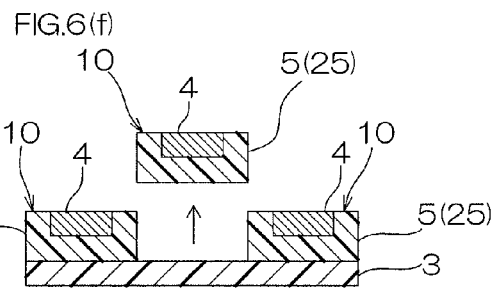
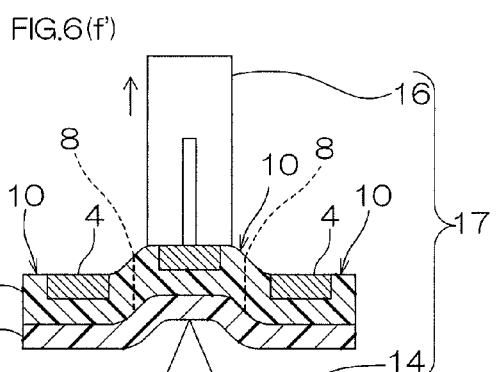

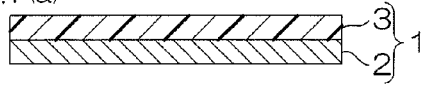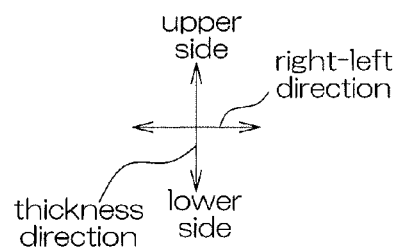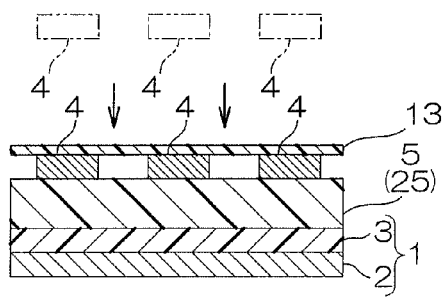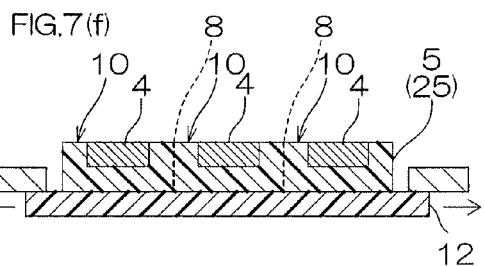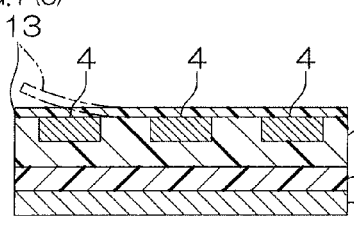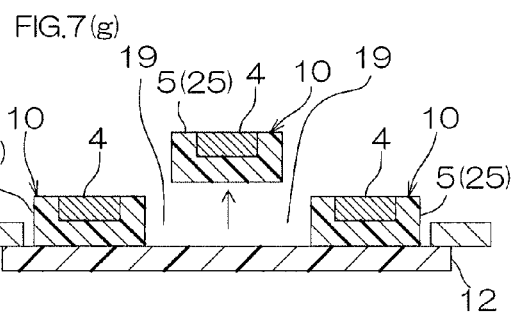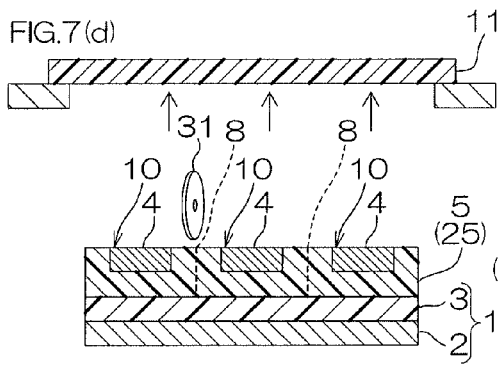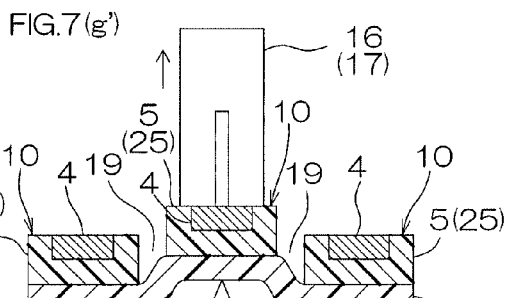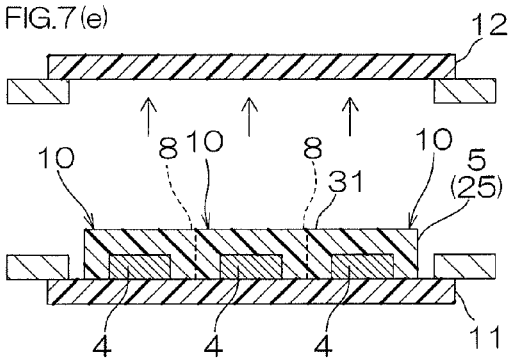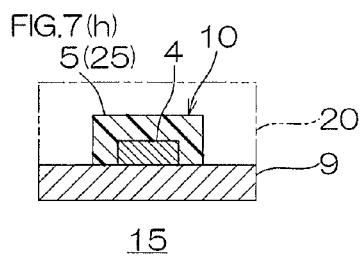

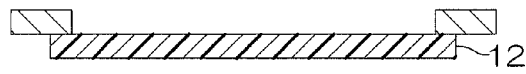
FIG.8(a)
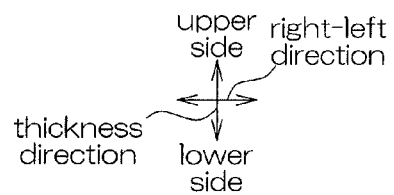
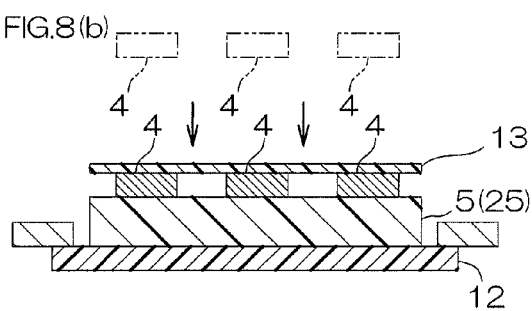
FIG.8(b)
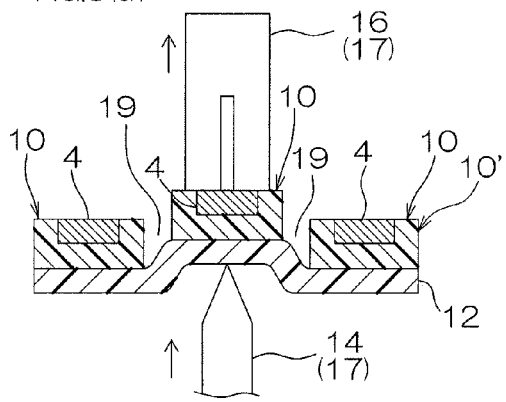
FIG.8(d')
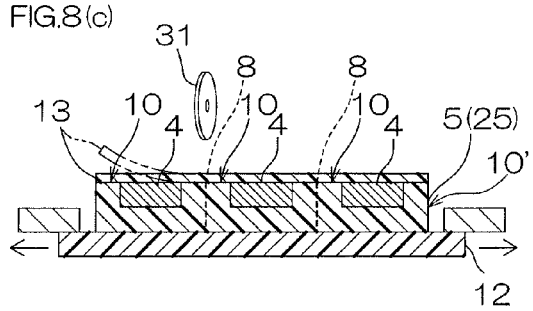
FIG.8(c)
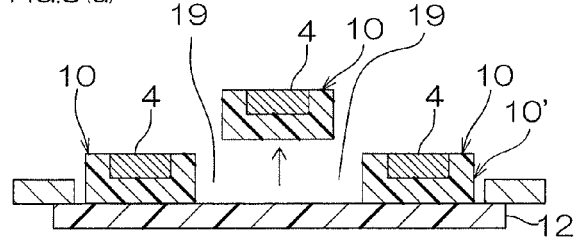
FIG.8(d)
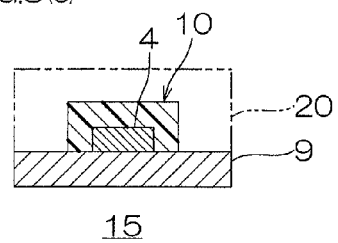
FIG.8(e)

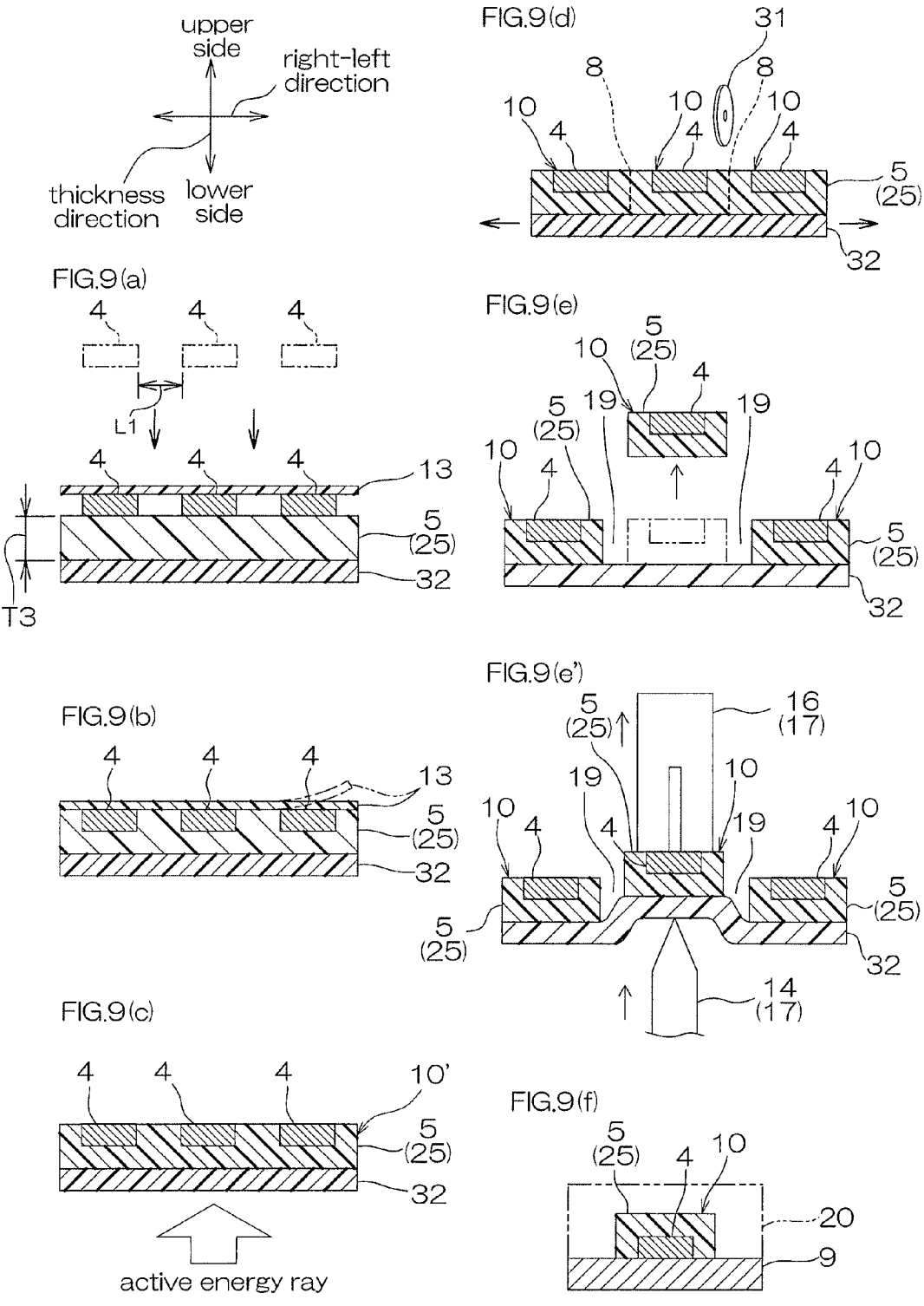

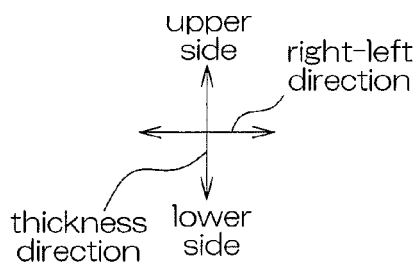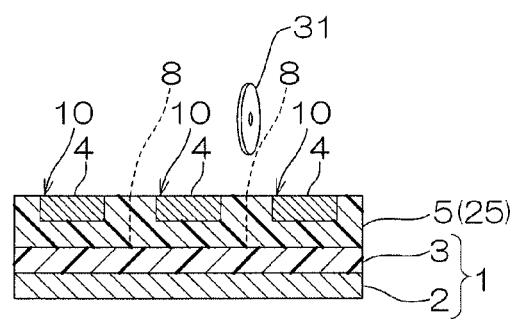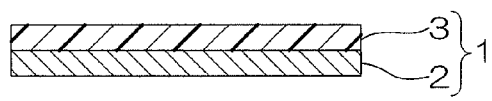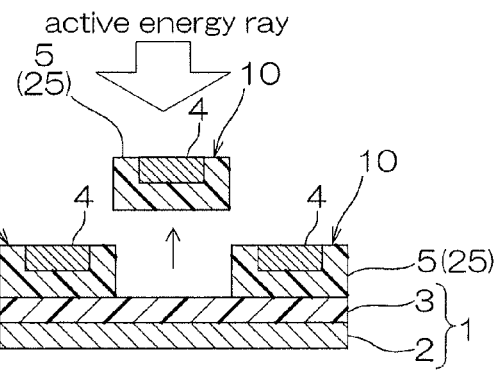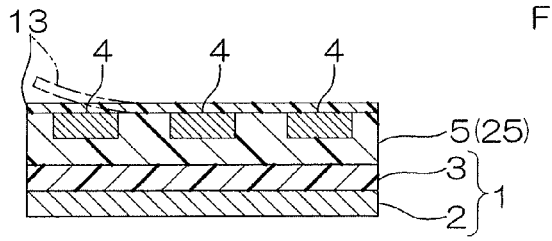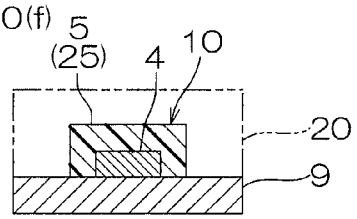

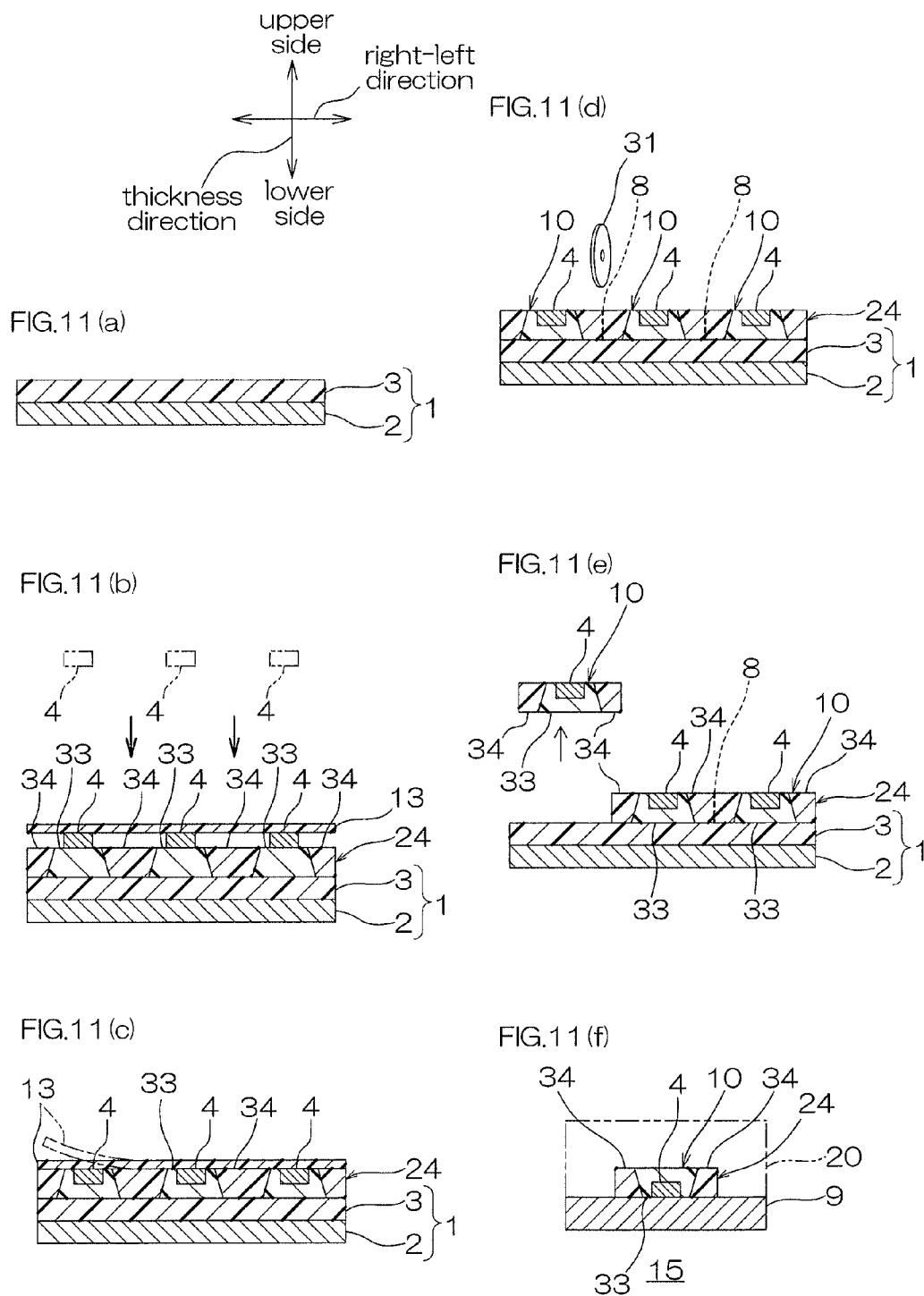

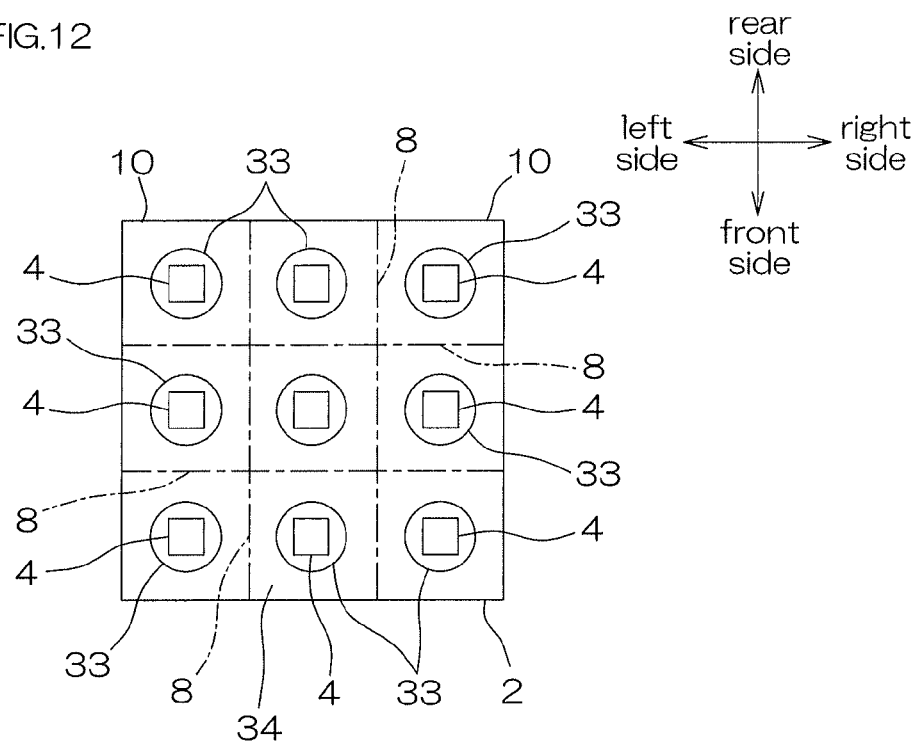

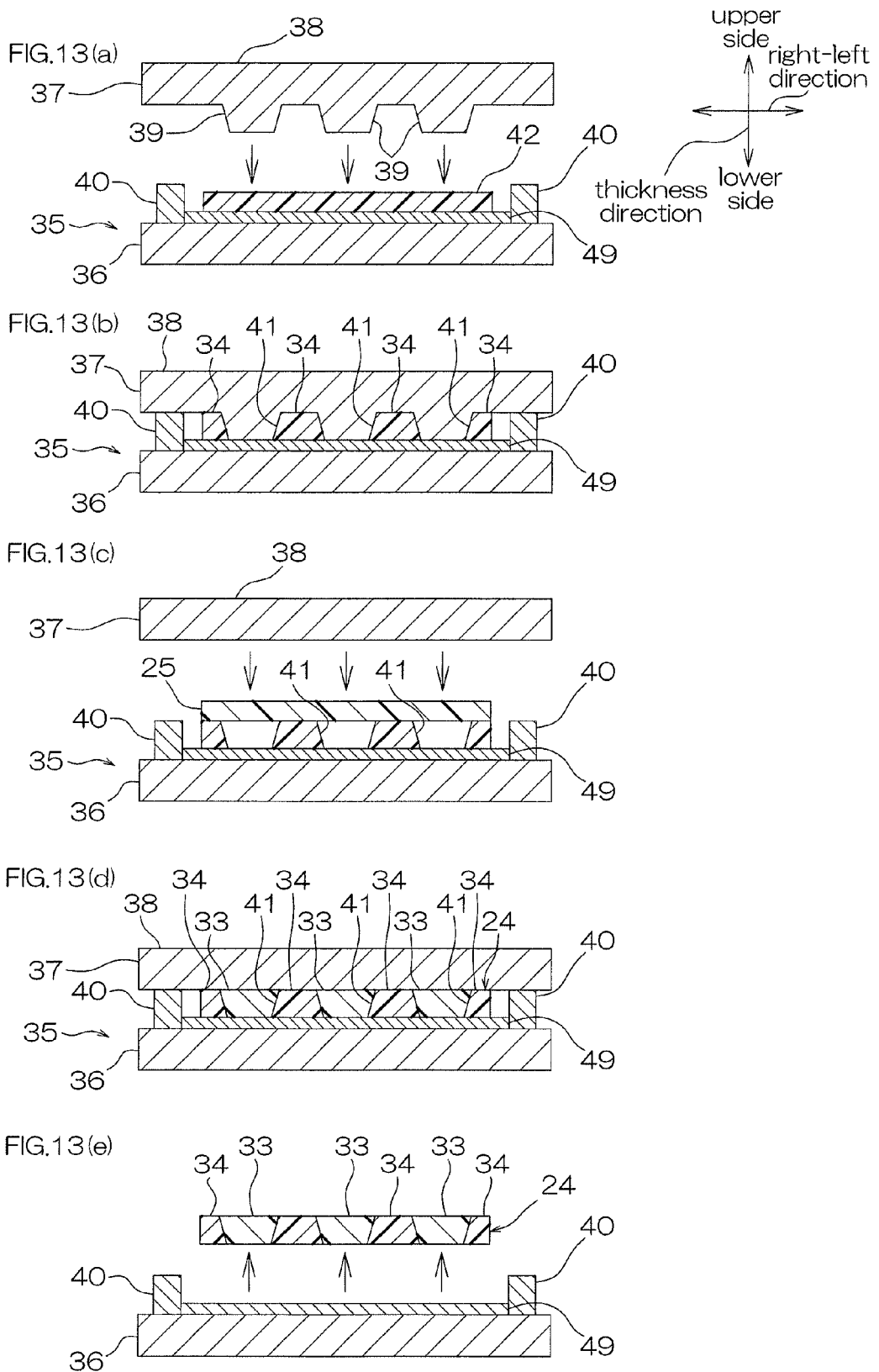

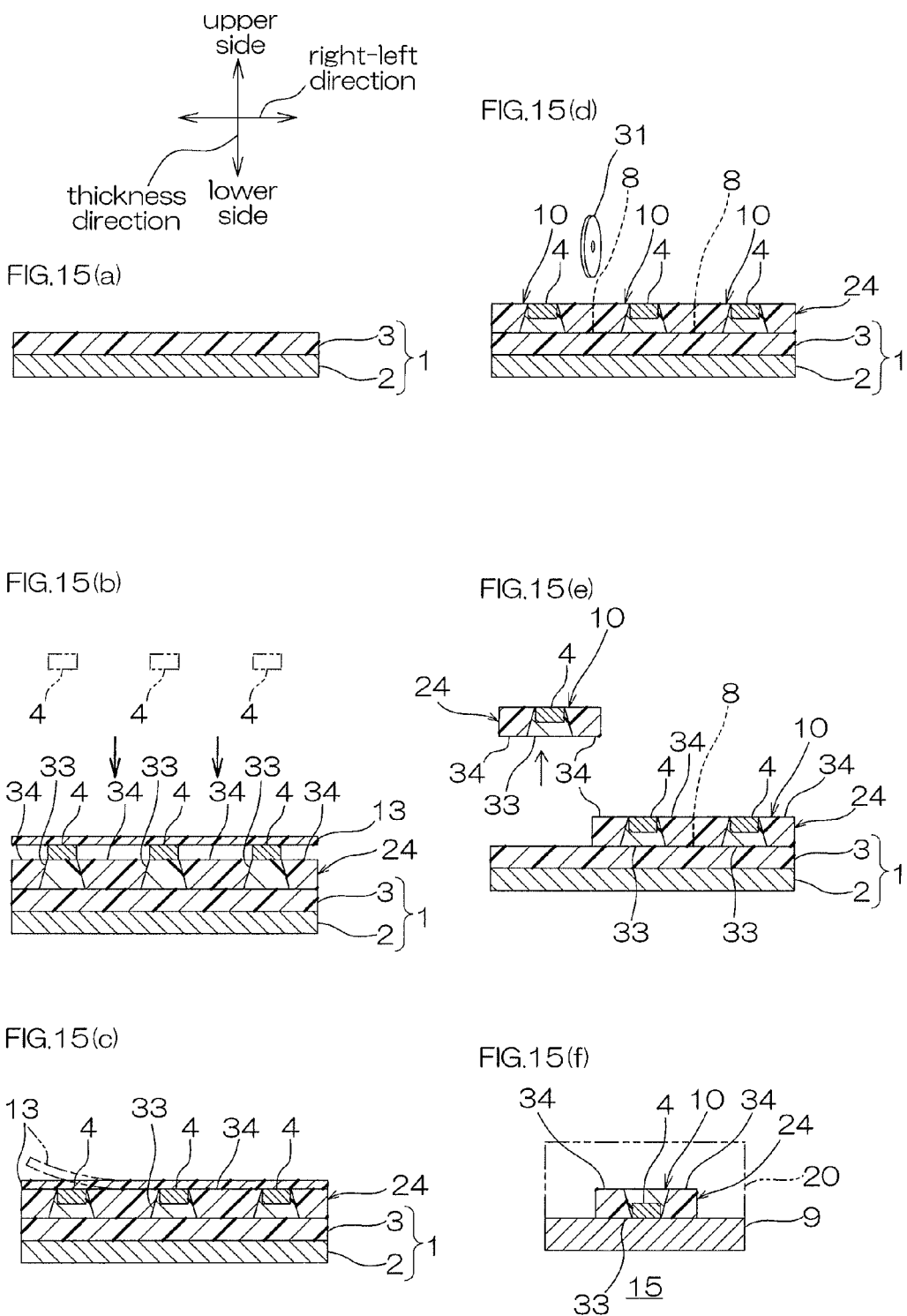

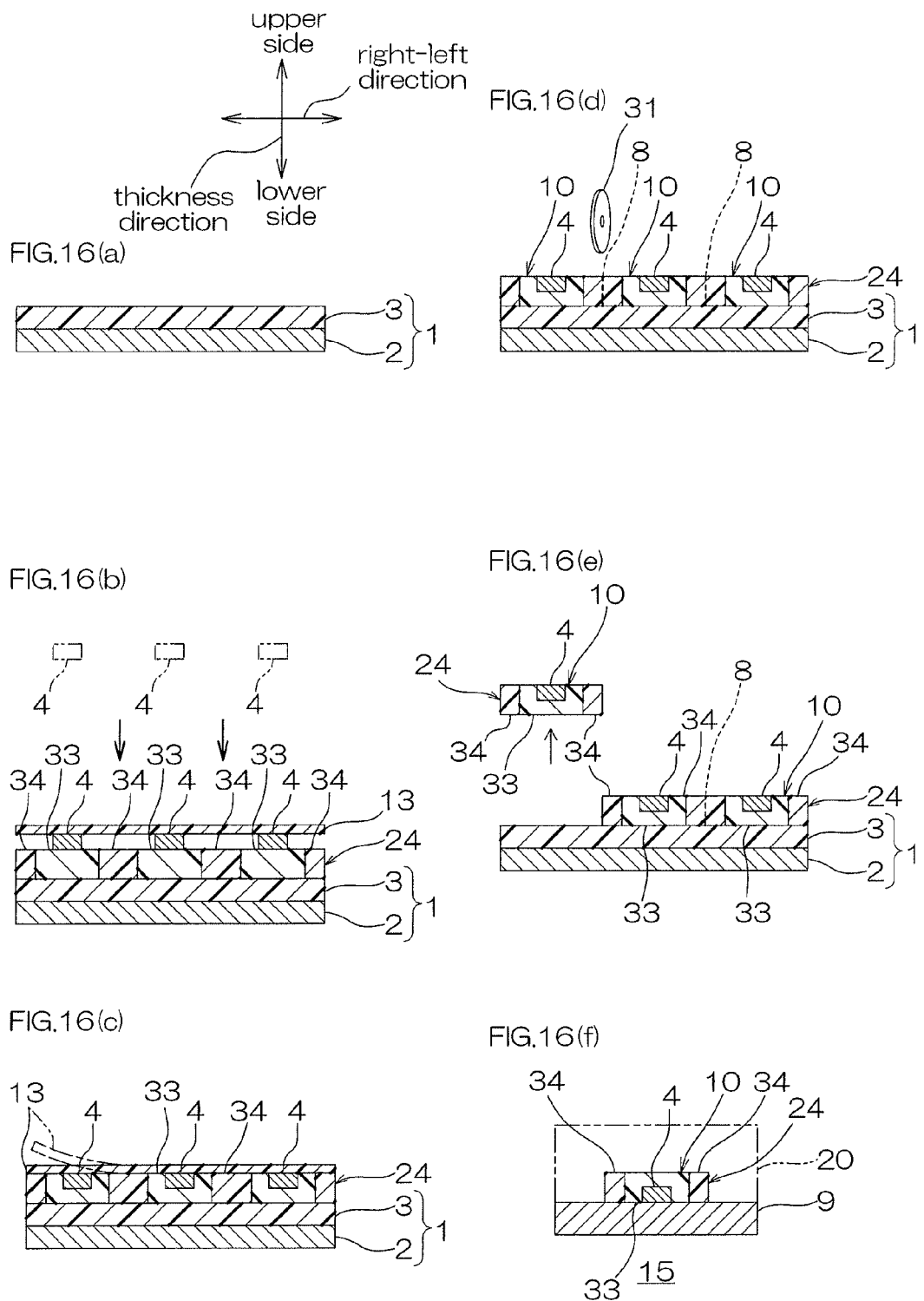

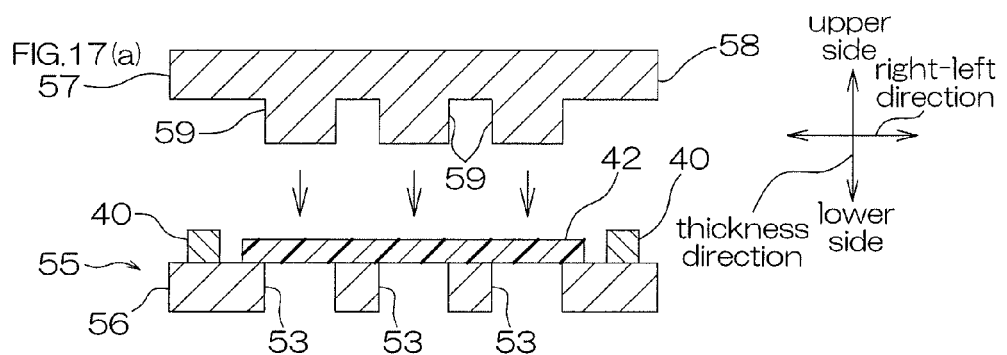
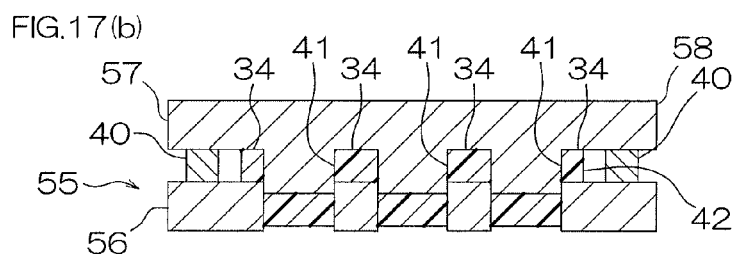
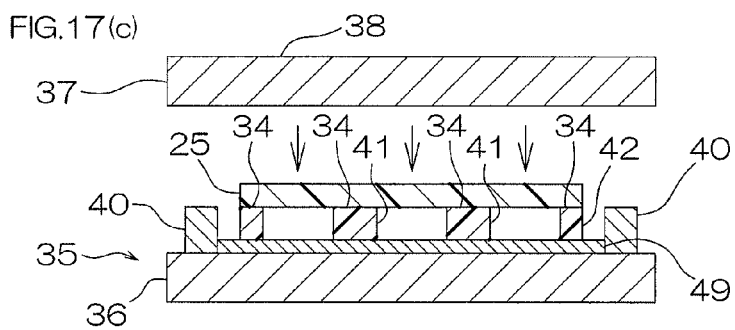
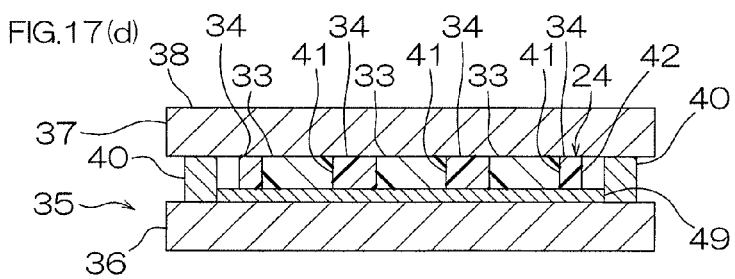
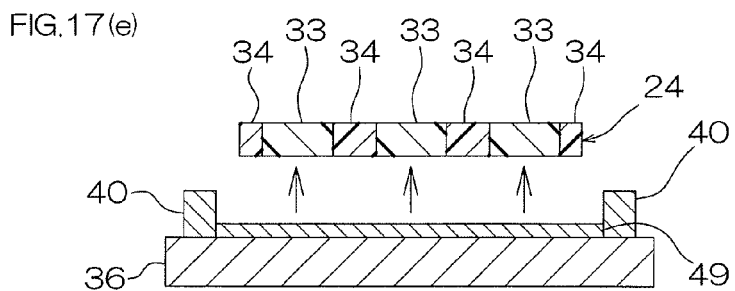

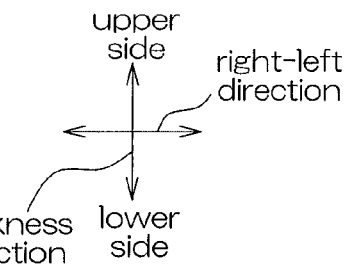
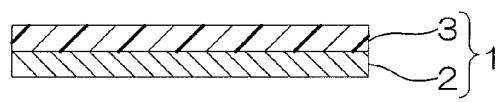
FIG.19(a)
FIG.19(d)
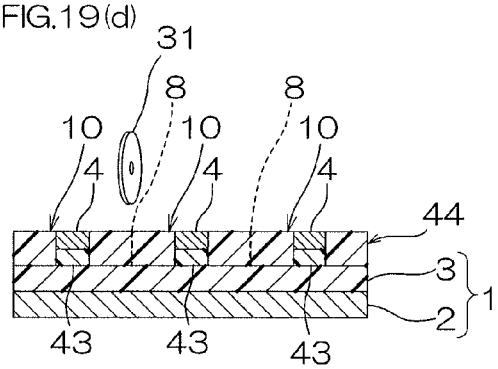
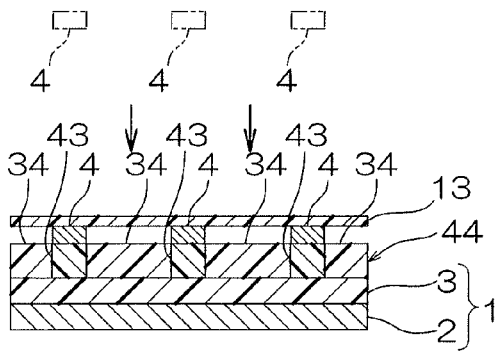
FIG.19(b)
FIG.19(e)
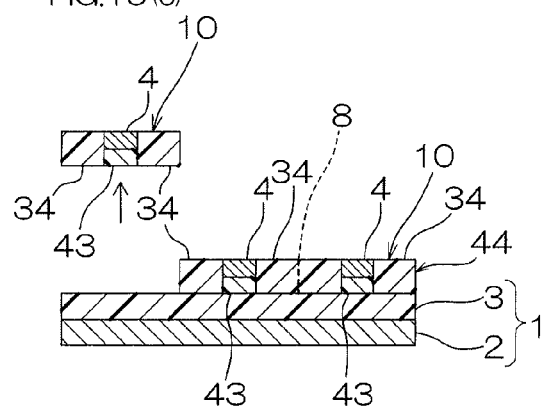
FIG.19(c)
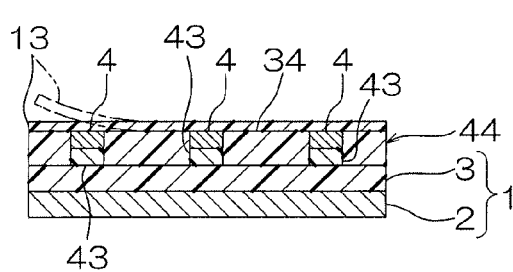
FIG.19(f)
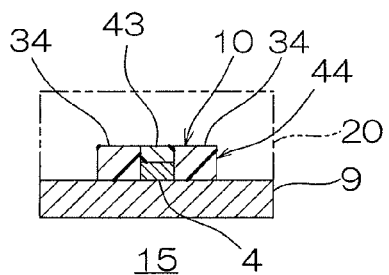

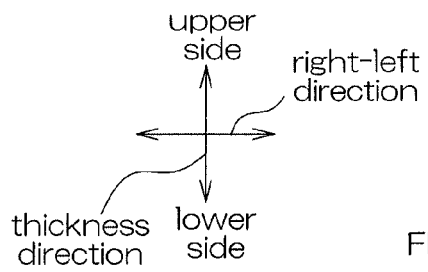
FIG.20(a)
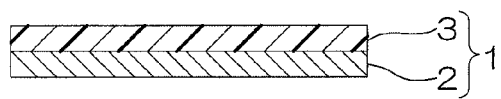
FIG.20(b)
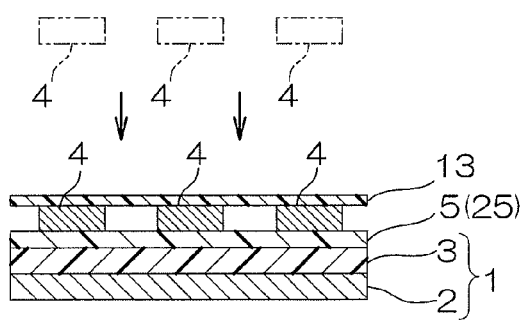
FIG.20(d)
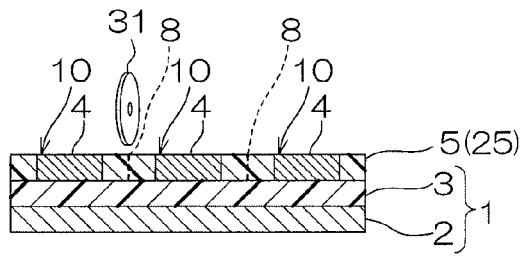
FIG.20(e)
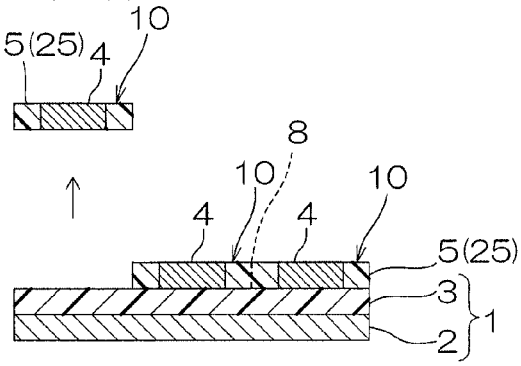
FIG.20(c)
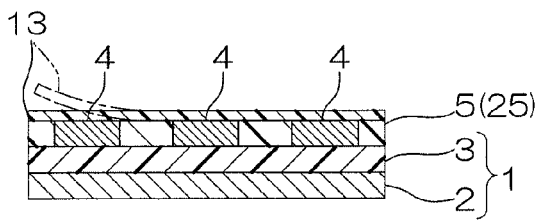
FIG.20(f)
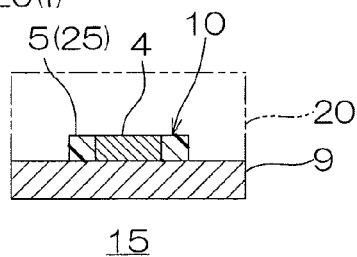

ENCAPSULATING LAYER-COVERED OPTICAL SEMICONDUCTOR ELEMENT, PRODUCING METHOD THEREOF, AND OPTICAL SEMICONDUCTOR DEVICE

CROSS-REFERENCE TO RELATED APPLICATION

The present application claims priority from Japanese Patent Application No. 2012-287919 filed on Dec. 28, 2012, the contents of which are hereby incorporated by reference into this application.

BACKGROUND OF THE INVENTION

1. Field of the Invention

The present invention relates to an encapsulating layer-covered optical semiconductor element, a producing method thereof, and an optical semiconductor device, to be specific, to a method for producing an encapsulating layer-covered optical semiconductor element, an encapsulating layer-covered optical semiconductor element obtained by the method, and an optical semiconductor device including the encapsulating layer-covered optical semiconductor element.

2. Description of Related Art

It has been known that, conventionally, an optical semiconductor device including a light emitting diode device (hereinafter, abbreviated as an LED device) is produced as follows: first, a plurality of optical semiconductor elements (including light emitting diode elements (hereinafter, abbreviated as LEDs)) are mounted on a substrate; next, an encapsulating layer is provided so as to cover a plurality of the optical semiconductor elements; and thereafter, the encapsulating layer is cut corresponding to each of the optical semiconductor elements to be singulated into individual optical semiconductor elements.

Among all, when the optical semiconductor element is an LED and the optical semiconductor device is an LED device, unevenness in emission wavelength and luminous efficiency is generated between a plurality of the LEDs, so that in such an LED device mounted with the LED, there is a disadvantage that unevenness in light emission is generated between a plurality of the LEDs.

In order to solve such a disadvantage, it has been considered that, for example, a plurality of LEDs are covered with a phosphor layer to fabricate a plurality of phosphor layer-covered LEDs and thereafter, the phosphor layer-covered LED is selected in accordance with the emission wavelength and the luminous efficiency to be then mounted on a substrate.

Also, an LED obtained by the following method has been proposed (ref: for example, Japanese Unexamined Patent Publication No. 2012-39013). In the method, first, for example, an LED is disposed on a pressure-sensitive adhesive sheet; next, a ceramic ink in which a phosphor is dispersed and mixed is applied thereto to be heated, so that the ceramic is temporarily cured; thereafter, the ceramic is subjected to dicing corresponding to the LED; and then, the obtained ceramic is fully cured to be vitrified so as to produce the LED. The LED in Japanese Unexamined Patent Publication No. 2012-39013 is to be then mounted on a substrate, so that an LED device is obtained.

SUMMARY OF THE INVENTION

In the method described in Japanese Unexamined Patent Publication No. 2012-39013, however, when the ceramic that is temporarily cured is subjected to dicing corresponding to each of the LEDs, the upper surfaces and the side surfaces of the LEDs are covered with the ceramic in which the phosphor is dispersed and mixed, so that the position thereof is not capable of being confirmed and thus, the ceramic is not capable of being accurately subjected to dicing. As a result, there is a disadvantage that dimension stability of the LED to be obtained is low and thus, optical stability of the LED device including the LED is reduced.

It is an object of the present invention to provide a method for producing an encapsulating layer-covered optical semiconductor element having excellent dimension stability, an encapsulating layer-covered optical semiconductor element obtained by the method, and an optical semiconductor device having excellent optical stability and including the encapsulating layer-covered optical semiconductor element.

A method for producing an encapsulating layer-covered optical semiconductor element of the present invention includes a disposing step of disposing an encapsulating layer at one side in a thickness direction of a support and a covering step of, after the disposing step, covering an optical semiconductor element with the encapsulating layer so as to expose one surface thereof to obtain an encapsulating layer-covered optical semiconductor element.

According to the method for producing an encapsulating layer-covered optical semiconductor element, in the covering step, the optical semiconductor element is covered with the encapsulating layer so as to expose the one surface thereof, so that after the covering step, the optical semiconductor element having one surface exposed is visually confirmed and the encapsulating layer is capable of being accurately cut corresponding to the optical semiconductor element. Thus, the encapsulating layer-covered optical semiconductor element to be obtained has excellent dimension stability. As a result, the optical semiconductor device including the encapsulating layer-covered optical semiconductor element has excellent luminous stability.

In the method for producing an encapsulating layer-covered optical semiconductor element of the present invention, it is preferable that the encapsulating layer contains a phosphor.

According to the method for producing an encapsulating layer-covered optical semiconductor element, the wavelength of light that is emitted from the optical semiconductor element is capable of being converted. Thus, luminous efficiency of the optical semiconductor device is capable of being improved.

In the method for producing an encapsulating layer-covered optical semiconductor element of the present invention, it is preferable that in the covering step, a plurality of the optical semiconductor elements are covered with the encapsulating layer so as to expose one surface of each of the optical semiconductor elements and after the covering step, a cutting step in which the encapsulating layer is cut corresponding to each of the optical semiconductor elements to obtain a plurality of the encapsulating layer-covered optical semiconductor elements is further included.

According to the method for producing an encapsulating layer-covered optical semiconductor element, in the covering step, a plurality of the optical semiconductor elements are covered with the encapsulating layer so as to expose one surface of each of the optical semiconductor elements and in the cutting step, the encapsulating layer is cut corresponding to each of the optical semiconductor elements to obtain a plurality of the encapsulating layer-covered optical semiconductor elements. That is, the encapsulating layer is cut corresponding to a plurality of the encapsulating layer-covered optical semiconductor elements, so that each of the singulated encapsulating layer-covered optical semiconductor elements having excellent dimension stability is capable of being obtained.

In the method for producing an encapsulating layer-covered optical semiconductor element of the present invention, it is preferable that the encapsulating layer includes a cover portion that covers the optical semiconductor element and a reflector portion that contains a light reflecting component and is formed so as to surround the cover portion.

According to the method for producing an encapsulating layer-covered optical semiconductor element, the encapsulating layer includes the cover portion that covers the optical semiconductor element and the reflector portion that contains the light reflecting component and is formed so as to surround the cover portion, so that light that is emitted from the optical semiconductor element is capable of being reflected by the reflector portion. Thus, the luminous efficiency of the optical semiconductor device is capable of being improved.

In the method for producing an encapsulating layer-covered optical semiconductor element of the present invention, it is preferable that the encapsulating layer contains a curable resin; in the covering step, the optical semiconductor element is covered with the encapsulating layer that is in a B-stage state; and after the covering step, an encapsulating step in which the encapsulating layer is cured to be brought into a C-stage state and the optical semiconductor element is encapsulated by the encapsulating layer in a C-stage state is further included.

According to the method for producing an encapsulating layer-covered optical semiconductor element, in the covering step, the optical semiconductor element is capable of being easily and surely covered with the encapsulating layer in a B-stage state and furthermore, in the encapsulating step, the encapsulating layer is cured to be brought into a C-stage state and the optical semiconductor element is capable of being surely encapsulated by the encapsulating layer in a C-stage state.

Thus, the encapsulating layer-covered optical semiconductor element having excellent reliability is capable of being obtained.

In the method for producing an encapsulating layer-covered optical semiconductor element of the present invention, it is preferable that the encapsulating layer is formed of an encapsulating sheet.

According to the method for producing an encapsulating layer-covered optical semiconductor element, the encapsulating layer is formed of the encapsulating sheet, so that a plurality of the optical semiconductor elements are capable of being collectively covered with the encapsulating sheet. Thus, production efficiency of the encapsulating layer-covered optical semiconductor element is capable of being improved.

An encapsulating layer-covered optical semiconductor element of the present invention is obtained by the above-described method for producing an encapsulating layer-covered optical semiconductor element.

The encapsulating layer-covered optical semiconductor element has excellent dimension stability.

An optical semiconductor device of the present invention includes a substrate and the above-described encapsulating layer-covered optical semiconductor element mounted on the substrate.

The optical semiconductor device includes the encapsulating layer-covered optical semiconductor element having excellent dimension stability, so that it has excellent luminous stability.

The optical semiconductor device of the present invention includes the encapsulating layer-covered optical semiconductor element having excellent luminous stability and dimension stability, so that it has excellent luminous stability.

BRIEF DESCRIPTION OF THE DRAWINGS

FIGS. 1 (a)-(f) show process drawings for illustrating a first embodiment of a method for producing an encapsulating layer-covered optical semiconductor element of the present invention:

FIG. 1 (a) illustrating a step of preparing a support sheet,

FIG. 1 (b) illustrating a step of disposing a phosphor layer on the support sheet (a disposing step), FIG. 1 (c) illustrating a step of embedding LEDs in the phosphor layer (an embedding step), FIG. 1 (d) illustrating a step of cutting the phosphor layer (a cutting step), FIG. 1 (e) illustrating a step of peeling phosphor layer-covered LEDs from the support sheet (a peeling step), and FIG. 1 (f) illustrating a step of mounting the phosphor layer-covered LED on a substrate (a mounting step).

FIG. 2 shows a plan view of the phosphor layer-covered LED shown in FIG. 1 (d).

FIGS. 3 (a)-(f) show process drawings for illustrating a second embodiment of a method for producing an encapsulating layer-covered optical semiconductor element of the present invention:

FIG. 3 (a) illustrating a step of preparing a support sheet,

FIG. 3 (b) illustrating a step of disposing a phosphor layer on the support sheet (a disposing step), FIG. 3 (c) illustrating a step of embedding LEDs in the phosphor layer (an embedding step), FIG. 3 (d) illustrating a step of cutting the phosphor layer (a cutting step), FIG. 3 (e) illustrating a step of peeling phosphor layer-covered LEDs from the support sheet (a peeling step), FIG. 3 (e') illustrating a step of describing the details of a state of peeling the phosphor layer-covered LEDs from a pressure-sensitive adhesive layer using a pick-up device in the peeling step in FIG. 3 (e), and FIG. 3 (f) illustrating a step of mounting the phosphor layer-covered LED on a substrate (a mounting step).

FIG. 4 shows a plan view of the phosphor layer-covered LED shown in FIG. 3 (e).

FIG. 5 shows a modified example of the peeling step shown in FIGS. 3 (e) and 3 (e') and shows a modified example of peeling a plurality of phosphor layer-covered LEDs that are not singulated.

FIGS. 6 (a)-(g) show process drawings for illustrating a third embodiment of a method for producing an encapsulating layer-covered optical semiconductor element of the present invention:

FIG. 6 (a) illustrating a step of preparing a support sheet,

FIG. 6 (b) illustrating a step of disposing a phosphor layer on the support sheet (a disposing step), FIG. 6 (c) illustrating a step of embedding LEDs in the phosphor layer (an embedding step), FIG. 6 (d) illustrating a step of cutting the phosphor layer (a cutting step), FIG. 6 (e) illustrating a step of peeling a support board from a pressure-sensitive adhesive layer (a support board peeling step), FIG. 6 (f) illustrating a step of peeling phosphor layer-covered LEDs from the pressure-sensitive adhesive layer (a peeling step), FIG. 6 (f) illustrating a step of describing the details of a state of peeling the phosphor layer-covered LEDs from the pressure-sensitive adhesive layer using a pick-up device in the peeling step in FIG. 6 (f), and FIG. 6 (g) illustrating a step of mounting the phosphor layer-covered LED on a substrate (a mounting step).

FIGS. 7 (a)-(h) show process drawings for illustrating a fourth embodiment of a method for producing an encapsulating layer-covered optical semiconductor element of the present invention:

FIG. 7 (a) illustrating a step of preparing a support sheet,

FIG. 7 (b) illustrating a step of disposing a phosphor layer on the support sheet (a disposing step), FIG. 7 (c) illustrating a step of embedding LEDs in the phosphor layer (an embedding step), FIG. 7 (d) illustrating a step of cutting the phosphor layer (a cutting step), FIG. 7 (e) illustrating a step of transferring phosphor layer-covered LEDs onto a transfer sheet (a first transfer step), FIG. 7 (f) illustrating a step of transferring the phosphor layer-covered LEDs onto a stretchable support sheet (a second transfer step), FIG. 7 (g) illustrating a step of peeling the phosphor layer-covered LEDs from the stretchable support sheet (a re-peeling step), FIG. 7 (g') illustrating a step of describing the details of a state of peeling the phosphor layer-covered LEDs from the stretchable support sheet using a pick-up device in the re-peeling step in FIG. 7 (g), and FIG. 7 (h) illustrating a step of mounting the phosphor layer-covered LED on a substrate (a mounting step).

FIGS. 8 (a)-(e) show process drawings for illustrating a fifth embodiment of a method for producing an encapsulating layer-covered optical semiconductor element of the present invention:

FIG. 8 (a) illustrating a step of preparing a stretchable support sheet,

FIG. 8 (b) illustrating a step of disposing a phosphor layer on the stretchable support sheet (a disposing step), FIG. 8 (c) illustrating a step of embedding LEDs in the phosphor layer (an embedding step) and a step of cutting the phosphor layer (a cutting step), FIG. 8 (d) illustrating a step of peeling phosphor layer-covered LEDs from the stretchable support sheet (a peeling step), FIG. 8 (d') illustrating a step of describing the details of a state of peeling the phosphor layer-covered LEDs from the stretchable support sheet using a pick-up device in the peeling step in FIG. 8 (d), and FIG. 8 (e) illustrating a step of mounting the phosphor layer-covered LED on a substrate (a mounting step).

FIGS. 9 (a)-(f) show process drawings for illustrating a sixth embodiment of a method for producing an encapsulating layer-covered optical semiconductor element of the present invention:

FIG. 9 (a) illustrating a step of preparing a support sheet,

FIG. 9 (b) illustrating a step of embedding LEDs in the phosphor layer (an embedding step), FIG. 9 (c) illustrating a step of curing the phosphor layer by applying an active energy ray to the phosphor layer and encapsulating the LEDs by the phosphor layer (an encapsulating step), FIG. 9 (d) illustrating a step of cutting the phosphor layer (a cutting step), FIG. 9 (e) illustrating a step of peeling phosphor layer-covered LEDs from the support sheet (a peeling step), FIG. 9 (e') illustrating a step of describing the details of a state of peeling the phosphor layer-covered LEDs from the support sheet using a pick-up device in the peeling step in FIG. 9 (e), and FIG. 9 (f) illustrating a step of mounting the phosphor layer-covered LED on a substrate (a mounting step).

FIGS. 10 (a)-(f) show process drawings for illustrating a seventh embodiment of a method for producing an encapsulating layer-covered optical semiconductor element of the present invention:

FIG. 10 (a) illustrating a step of preparing a support sheet,

FIG. 10 (b) illustrating a step of attaching a phosphor layer onto the support sheet (an attaching step), FIG. 10 (c) illustrating a step of embedding LEDs in the phosphor layer (an embedding step), FIG. 10 (d) illustrating a step of cutting phosphor layer-covered LEDs (a cutting step), FIG. 10 (e) illustrating a step of peeling the phosphor layer-covered LEDs from the support sheet (a peeling step), and FIG. 10 (f) illustrating a step of mounting the phosphor layer-covered LED on a substrate (a mounting step).

FIGS. 11 (a)-(f) show process drawings for illustrating an eighth embodiment of a method for producing an encapsulating layer-covered optical semiconductor element of the present invention:

FIG. 11 (a) illustrating a step of preparing a support sheet,

FIG. 11 (b) illustrating a step of disposing an embedding-reflector sheet on the support sheet (a disposing step), FIG. 11 (c) illustrating a step of embedding LEDs in embedding portions (an embedding step), FIG. 11 (d) illustrating a step of cutting a reflector portion (a cutting step), FIG. 11 (e) illustrating a step of peeling phosphor layer-covered LEDs each including the reflector portion from the support sheet (a peeling step), and FIG. 11 (f) illustrating a step of mounting the phosphor layer-covered LED including the reflector portion on a substrate (a mounting step).

FIG. 12 shows a plan view of the phosphor layer-covered LEDs shown in FIG. 11 (d).

FIGS. 13 (a)-(e) show process drawings for illustrating a method for producing the embedding-reflector sheet shown in FIG. 11 (b):

FIG. 13 (a) illustrating a step of disposing a reflector sheet on a pressing device, FIG. 13 (b) illustrating a step of pressing the reflector sheet to form a reflector portion, FIG. 13 (c) illustrating a step of disposing a phosphor sheet on the reflector portion, FIG. 13 (d) illustrating a step of pressing the phosphor sheet to form embedding portions, and FIG. 13 (e) illustrating a step of peeling the embedding-reflector sheet from a releasing sheet.

FIG. 14 (a) illustrating a step of disposing a reflector sheet on a pressing device, FIG. 14 (b) illustrating a step of pressing the reflector sheet to form a reflector portion, FIG. 14 (c) illustrating a step of potting a varnish of a phosphor resin composition into through holes, and FIG. 14 (d) illustrating a step of peeling the embedding-reflector sheet from a releasing sheet.

FIGS. 15 (a)-(f) show process drawings for illustrating a tenth embodiment of a method for producing an encapsulating layer-covered optical semiconductor element of the present invention:

FIG. 15 (a) illustrating a step of preparing a support sheet,

FIG. 15 (b) illustrating a step of disposing an embedding-reflector sheet on the support sheet (a disposing step), FIG. 15 (c) illustrating a step of embedding LEDs in embedding portions (an embedding step), FIG. 15 (d) illustrating a step of cutting a reflector portion (a cutting step), FIG. 15 (e) illustrating a step of peeling phosphor layer-covered LEDs each including the reflector portion from the support sheet (a peeling step), and FIG. 15 (f) illustrating a step of mounting the phosphor layer-covered LED including the reflector portion on a substrate (a mounting step).

FIGS. 16 (a)-(f) show process drawings for illustrating an eleventh embodiment of a method for producing an encapsulating layer-covered optical semiconductor element of the present invention:

FIG. 16 (a) illustrating a step of preparing a support sheet,

FIG. 16 (b) illustrating a step of disposing an embedding-reflector sheet on the support sheet (a disposing step), FIG. 16 (c) illustrating a step of embedding LEDs in embedding portions (an embedding step), FIG. 16 (d) illustrating a step of cutting a reflector portion (a cutting step), FIG. 16 (e) illustrating a step of peeling phosphor layer-covered LEDs each including the reflector portion from the support sheet (a peeling step), and FIG. 16 (f) illustrating a step of mounting the phosphor layer-covered LED including the reflector portion on a substrate (a mounting step).

FIGS. 17 (a)-(e) show process drawings for illustrating a method for producing an embedding-reflector sheet shown in FIG. 16 (b):

FIG. 17 (a) illustrating a step of disposing a reflector sheet on a punching device, FIG. 17 (b) illustrating a step of stamping out the reflector sheet to form a reflector portion, FIG. 17 (c) illustrating a step of disposing a phosphor sheet on the reflector portion, FIG. 17 (d) illustrating a step of pressing the phosphor sheet to form embedding portions, and FIG. 17 (e) illustrating a step of peeling the embedding-reflector sheet from a releasing sheet.

FIG. 18 (a) illustrating a step of disposing a reflector sheet on a punching device, FIG. 18 (b) illustrating a step of stamping out the reflector sheet to form a reflector portion, FIG. 18 (c) illustrating a step of potting a varnish of a phosphor resin composition into through holes, and FIG. 18 (d) illustrating a step of peeling the embedding-reflector sheet from a releasing sheet.

FIGS. 19 (a)-(f) show process drawings for illustrating a thirteenth embodiment of a method for producing an encapsulating layer-covered optical semiconductor element of the present invention:

FIG. 19 (a) illustrating a step of preparing a support sheet,

FIG. 19 (b) illustrating a step of disposing a cover-reflector sheet on the support sheet (a disposing step), FIG. 19 (c) illustrating a step of covering LEDs with cover portions (a covering step), FIG. 19 (d) illustrating a step of cutting a reflector portion (a cutting step), FIG. 19 (e) illustrating a step of peeling phosphor layer-covered LEDs each including the reflector portion from the support sheet (a peeling step), and FIG. 19 (f) illustrating a step of mounting the phosphor layer-covered LED including the reflector portion on a substrate (a mounting step).

FIGS. 20 (a)-(f) show process drawings for illustrating a fourteenth embodiment of a method for producing an encapsulating layer-covered optical semiconductor element of the present invention:

FIG. 20 (a) illustrating a step of preparing a support sheet,

FIG. 20 (b) illustrating a step of disposing a phosphor layer on the support sheet (a disposing step), FIG. 20 (c) illustrating a step of covering LEDs with the phosphor layer (a covering step), FIG. 20 (d) illustrating a step of cutting the phosphor layer (a cutting step), FIG. 20 (e) illustrating a step of peeling phosphor layer-covered LEDs from the support sheet (a peeling step), and FIG. 20 (f) illustrating a step of mounting the phosphor layer-covered LED on a substrate (a mounting step).

DETAILED DESCRIPTION OF THE INVENTION

First Embodiment

Figure 14A:
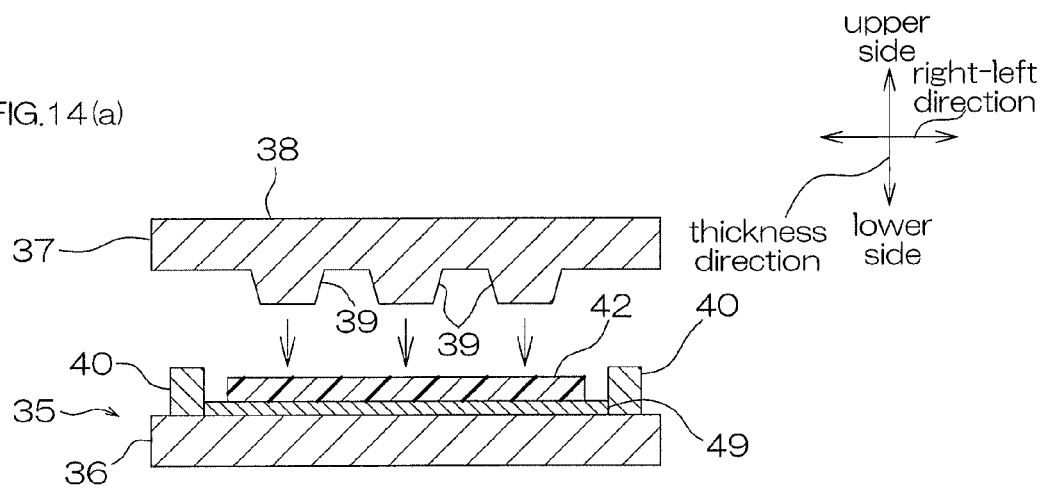
FIGS. 14 (a)-(d) show process drawings for illustrating a method for producing an embedding-reflector sheet used in a ninth embodiment of a method for producing an encapsulating layer-covered optical semiconductor element of the present invention.
Figure 14B:
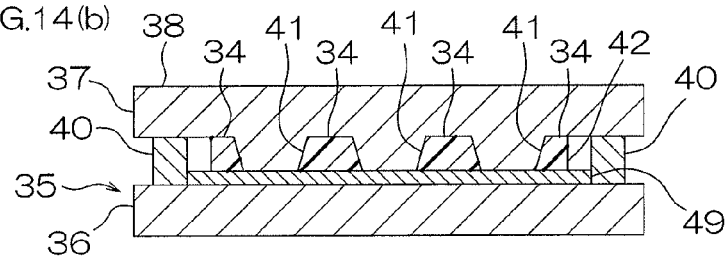
Figure 14C:
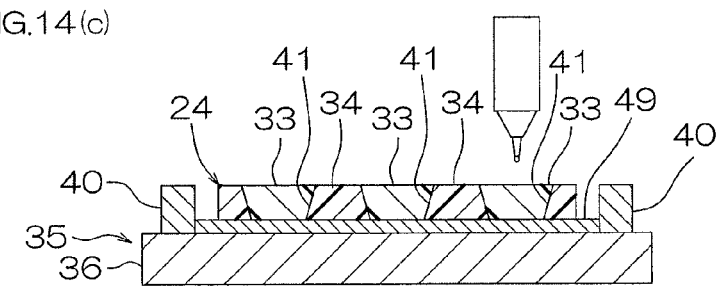
Figure 14D:
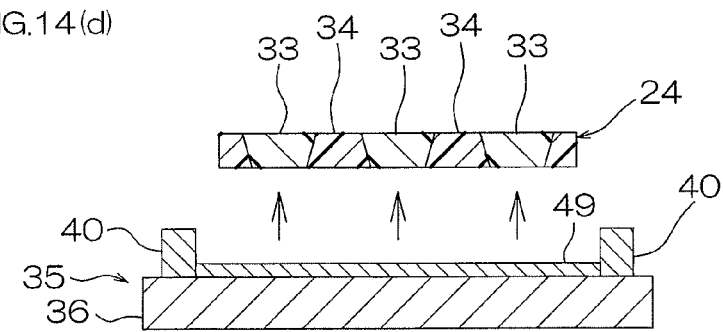
Figure 18A:
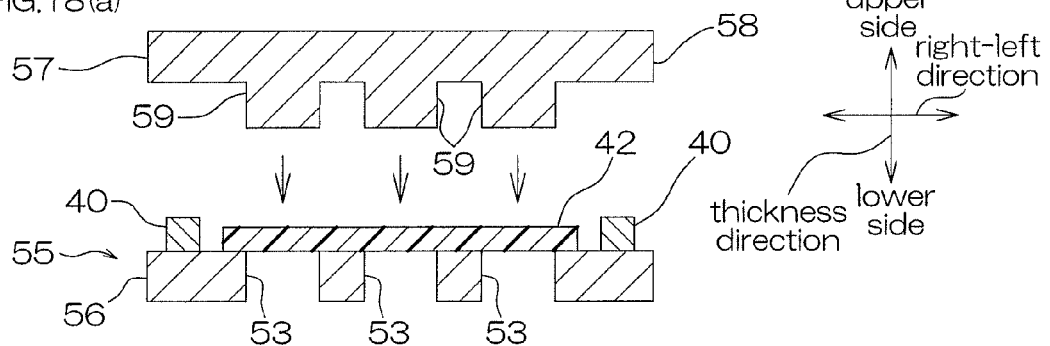
FIGS. 18 (a)-(d) show process drawings for illustrating a method for producing an embedding-reflector sheet used in a twelfth embodiment of a method for producing an encapsulating layer-covered optical semiconductor element of the present invention.
Figure 18B:
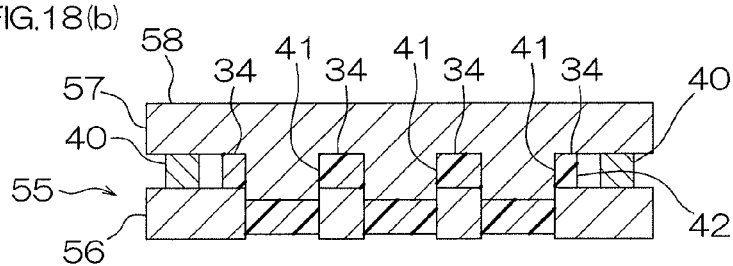
Figure 18C:
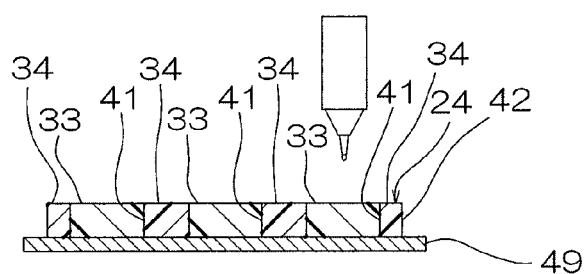
Figure 18D:
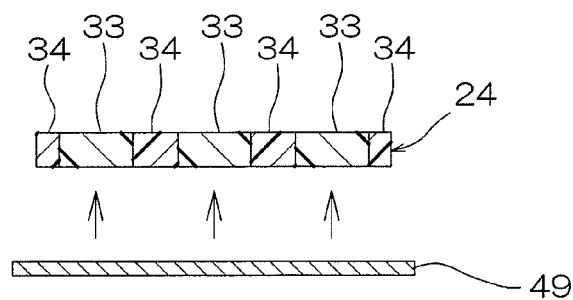

In FIGS. 1 (a)-(f), the up-down direction of the paper surface is referred to as an up-down direction (a first direction); the right-left direction of the paper surface is referred to as a right-left direction (a second direction, a direction perpendicular to the first direction); and the paper thickness direction of the paper is referred to as a front-rear direction (a third direction, a direction perpendicular to the first direction and the second direction). Directions and direction arrows in FIG. 2 and the subsequent figures are in conformity with the above-described directions and the direction arrows in FIGS. 1 (a)-(f).

A method for producing a phosphor layer-covered LED 10 as an encapsulating layer-covered optical semiconductor element includes a disposing step of disposing a phosphor layer 5 as an encapsulating layer on (at one side in the thickness direction of) a support sheet 1 as a support (ref: FIG. 1 (b)); an embedding step of, after the disposing step, embedding a plurality of LEDs 4 as optical semiconductor elements in the phosphor layer 5 so as to expose the upper surfaces thereof (ref: FIG. 1 (c), one example of a covering step); an encapsulating step of, after the embedding step, encapsulating a plurality of the LEDs 4 by the phosphor layer 5 (ref: FIG. 1 (c)); a cutting step of, after the encapsulating step, cutting the phosphor layer 5 corresponding to each of the LEDs 4 to produce a plurality of the phosphor layer-covered LEDs 10 (ref: FIG. 1 (d)); and a peeling step of peeling a plurality of the phosphor layer-covered LEDs 10 from the support sheet 1 (ref: FIG. 1 (e)).

In the following, the steps of the first embodiment are described in detail.

[Disposing Step]

In the disposing step, as shown in FIG. 1 (a), first, the support sheet 1 is prepared.

The support sheet 1 is formed into a sheet shape extending in the plane direction (a direction perpendicular to the thickness direction, that is, the right-left direction and the front-rear direction). The support sheet 1 is formed into, for example, a rectangular shape in plane view (a shape when projected in the thickness direction). The length of one side of the support sheet 1 is, for example, 10 mm or more and 300 mm or less.

The support sheet 1 is configured to be capable of supporting the phosphor layer 5 to be described next and includes, for example, a support board 2 and a pressure-sensitive adhesive layer 3 that is laminated on the upper surface of the support board 2.

The support board 2 is formed into a plate shape extending in the plane direction. The support board 2 is provided in the lower portion of the support sheet 1 and is formed to have the generally same shape as that of the support sheet 1 in plane view.

The support board 2 is formed of a hard material that is incapable of stretching in the plane direction. To be specific, examples of the material include an oxide such as a silicon oxide (silica or the like) and alumina, a metal such as stainless steel, and silicon.

The support board 2 has a Young's modulus at 23° C. of, for example, $10^6$ Pa or more, preferably $10^7$ Pa or more, or more preferably $10^8$ Pa or more, and of, for example, $10^{12}$ Pa or less. When the Young's modulus of the support board 2 is not less than the above-described lower limit, hardness of the support board 2 is secured and the phosphor layer 5 (ref: FIG. 1 (b)) to be described later can be further surely supported. The Young's modulus of the support board 2 is obtained by, for example, the compressive elastic modulus in JIS H 7902: 2008.

The thickness of the support board 2 is, for example, 0.1 mm or more, or preferably 0.3 mm or more, and is, for example, 5 mm or less, or preferably 2 mm or less.

The pressure-sensitive adhesive layer 3 is formed on the entire upper surface of the support board 2.

An example of a pressure-sensitive adhesive material for forming the pressure-sensitive adhesive layer 3 includes a pressure-sensitive adhesive such as an acrylic pressure-sensitive adhesive and a silicone pressure-sensitive adhesive. The pressure-sensitive adhesive layer 3 can be also formed of, for example, an active energy ray irradiation release sheet in which the pressure-sensitive adhesive force is capable of being reduced by application of an active energy ray (to be specific, an active energy ray irradiation release sheet described in Japanese Unexamined Patent Publication No. 2005-286003 or the like) or a thermal release sheet in which the pressure-sensitive adhesive force is capable of being reduced by heating (to be specific, a thermal release sheet such as REVALPHA (manufactured by NITTO DENKO CORPORATION)). To be specific, when a phosphor resin composition in the phosphor layer 5 (ref: FIG. 1 (b)) to be described later contains a thermosetting resin, preferably, the pressure-sensitive adhesive layer 3 is formed of an active energy ray irradiation release sheet. On the other hand, when the phosphor resin composition in the phosphor layer 5 to be described later contains an active energy ray curable resin, preferably, the pressure-sensitive adhesive layer 3 is formed of a thermal release sheet.

The thickness of the pressure-sensitive adhesive layer 3 is, for example, 0.1 mm or more, or preferably 0.2 mm or more, and is, for example, 1 mm or less, or preferably 0.5 mm or less.

In order to prepare the support sheet 1, for example, the support board 2 is attached to the pressure-sensitive adhesive layer 3. Also, the pressure-sensitive adhesive layer 3 can be directly laminated on the support board 2 by an application method or the like in which first, the support board 2 is prepared and next, a varnish is applied to the support board 2.

The thickness of the support sheet 1 is, for example, 0.2 mm or more, or preferably 0.5 mm or more, and is, for example, 6 mm or less, or preferably 2.5 mm or less.

As shown in FIG. 1 (b), the phosphor layer 5 is disposed on the prepared support sheet 1.

The phosphor layer 5 is, for example, formed of a phosphor sheet 25 as an encapsulating sheet.

The phosphor sheet 25 is formed from a phosphor resin composition containing a curable resin and a phosphor.

Examples of the curable resin include a thermosetting resin that is cured by heating and an active energy ray curable resin that is cured by application of an active energy ray (for example, an ultraviolet ray and an electron beam). Preferably, a thermosetting resin is used.

To be specific, an example of the curable resin includes a thermosetting resin such as a silicone resin, an epoxy resin, a polyimide resin, a phenol resin, a urea resin, a melamine resin, and an unsaturated polyester resin. Preferably, a silicone resin is used.

An example of the silicone resin includes a silicone resin such as a two-step curable type silicone resin and a one-step curable type silicone resin. Preferably, a two-step curable type silicone resin is used.

The two-step curable type silicone resin is a thermosetting silicone resin that has a two-step reaction mechanism and in which a silicone resin is brought into a B-stage state (a semi-cured state) in the first-step reaction and is brought into a C-stage state (a completely cured state) in the second-step reaction. On the other hand, the one-step curable type silicone resin is a thermosetting silicone resin that has a one-step reaction mechanism and in which a silicone resin is completely cured in the first-step reaction.

The B-stage state is a state between an A-stage state in which a thermosetting silicone resin is in a liquid state and a C-stage state in which the thermosetting silicone resin is completely cured. Also, the B-stage state is a state in which the curing and the gelation of the thermosetting silicone resin are slightly progressed and the compressive elastic modulus thereof is smaller than the elastic modulus thereof in a C-stage state.

An example of the two-step curable type silicone resin includes a condensation reaction and addition reaction curable type silicone resin that has two reaction systems of a condensation reaction and an addition reaction.

The mixing ratio of the curable resin with respect to the phosphor resin composition is, for example, 30 mass % or more, or preferably 50 mass % or more, and is, for example, 99 mass % or less, or preferably 95 mass % or less.

The phosphor has a wavelength conversion function and examples thereof include a yellow phosphor that is capable of converting blue light into yellow light and a red phosphor that is capable of converting blue light into red light.

Examples of the yellow phosphor include a garnet type phosphor having a garnet type crystal structure such as $Y_3Al_5O_{12}$:Ce (YAG (yttrium aluminum garnet):Ce) and $Tb_3Al_3O_{12}$:Ce (TAG (terbium aluminum garnet):Ce) and an oxynitride phosphor such as Ca-α-SiAlON.

An example of the red phosphor includes a nitride phosphor such as $CaAlSiN_3$:Eu and $CaSiN_2$:Eu.

Preferably, a yellow phosphor is used.

Examples of a shape of the phosphor include a sphere shape, a plate shape, and a needle shape. Preferably, in view of fluidity, a sphere shape is used.

The average value of the maximum length (in the case of a sphere shape, the average particle size) of the phosphor is, for example, 0.1 μm or more, or preferably 1 μm or more, and is, for example, 200 μm or less, or preferably 100 μm or less.

The mixing ratio of the phosphor with respect to 100 parts by mass of the curable resin is, for example, 0.1 parts by mass or more, or preferably 0.5 parts by mass or more, and is, for example, 80 parts by mass or less, or preferably 50 parts by mass or less.

Furthermore, the phosphor resin composition can also contain a filler.

An example of the filler includes a known filler excluding a reflecting component to be described later. To be specific, examples of the filler include organic microparticles such as silicone particles and inorganic microparticles such as silica, talc, alumina, aluminum nitride, and silicon nitride. The mixing ratio of the filler with respect to 100 parts by mass of the curable resin is, for example, 0.1 parts by mass or more, or preferably 0.5 parts by mass or more, and is, for example, 70 parts by mass or less, or preferably 50 parts by mass or less.

In order to prepare the phosphor sheet 25, a curable resin and a phosphor, and a filler, which is blended as required, are blended to prepare a phosphor resin composition. Next, the phosphor resin composition is applied to the surface of a release sheet, which is not shown, to be then heated.

When the curable resin contains a two-step curable type silicone resin, the curable resin is brought into a B-stage state (a semi-cured state) by the above-described heating. That is, the phosphor sheet 25 in a B-stage state is prepared.

The phosphor sheet 25 has a compressive elastic modulus at 23° C. of, for example, 0.01 MPa or more, or preferably 0.04 MPa or more, and of, for example, 1.0 MPa or less, or preferably 0.2 MPa or less.

When the compressive elastic modulus of the phosphor sheet 25 is not more than the above-described upper limit, sufficient flexibility is secured and the LEDs 4 (ref: FIG. 1 (b)) to be described later can be embedded. When the compressive elastic modulus of the phosphor sheet 25 is not less than the above-described lower limit, the outer shape of the phosphor sheet 25 is surely retained and handling ability of the phosphor sheet 25 can be improved.

Then, the phosphor sheet 25 is laminated on the upper surface of the pressure-sensitive adhesive layer 3.

In this way, the phosphor layer 5 is disposed on the support sheet 1.

Thereafter, the release sheet, which is not shown, is peeled from the phosphor layer 5.

[Embedding Step]

In the embedding step, first, as shown by phantom lines in FIG. 1 (b), a plurality of the LEDs 4 are prepared.

The LEDs 4 are optical semiconductor elements that convert electrical energy to light energy. Each of the LEDs 4 is, for example, formed into a generally rectangular shape in sectional view with the thickness shorter than the length in the plane direction (the maximum length) and a generally rectangular shape in plane view (ref: FIG. 2). An example of the LEDs 4 includes blue light emitting diode elements that emit blue light. A part of the upper surface of each of the LEDs 4 is formed of a terminal that is not shown.

The length of one side in the plane direction of the LED 4 is, for example, 0.1 mm or more and 3 mm or less. The thickness of the LED 4 is, for example, 0.05 mm or more and 1 mm or less.

Next, as shown by arrows in FIG. 1 (b), the prepared LEDs 4 are disposed on the upper surface of the phosphor layer 5.

To be specific, a plurality of the LEDs 4 are disposed on the upper surface of the phosphor layer 5 so as to be disposed at spaced intervals to each other in the plane direction.

After the disposition of the LEDs 4 on the phosphor layer 5, subsequently, the LEDs 4 are embedded in the phosphor layer 5 so that the upper surfaces thereof are exposed. To be specific, the LEDs 4 are embedded in the upper portion of the phosphor layer 5 so that the upper surfaces thereof are exposed.

To be specific, in order to embed the LEDs 4 in the phosphor layer 5, first, a release sheet 13 is disposed on the upper surfaces of the LEDs 4. That is, the release sheet 13 is disposed on the upper surfaces of a plurality of the LEDs 4 so as to be overlapped with a plurality of the LEDs 4 when projected in the thickness direction. To be more specific, one piece of the release sheet 13 having the same as or larger dimension than that of the support sheet 1 is disposed on the upper surfaces of the LEDs 4.

Examples of the release sheet 13 include a polymer film such as a polyethylene film and a polyester film (PET or the like), a ceramic sheet, and a metal foil. Preferably, a polymer film is used. The surface of the release sheet 13 can be also subjected to release treatment such as fluorine treatment.

Next, a laminate made of the support sheet 1, the LEDs 4, and the release sheet 13 are pressed by a pressing device including two pieces of flat plates that are disposed in opposed relation to each other.

The pressure in the pressing is, for example, 0.1 MPa or more, or preferably 0.5 MPa or more, and is, for example, 50 MPa or less, or preferably 10 MPa or less.

Along with the pressing, the phosphor layer 5 can be also heated. That is, the phosphor layer 5 and the LEDs 4 can be hot pressed. The heating temperature is, for example, 80° C. or more, or preferably 100° C. or more, and is, for example, 200° C. or less, or preferably 180° C. or less.

By the pressing, the upper surfaces of the LEDs 4 are covered with the release sheet 13 and the LEDs 4 are pressed into the upper portion of the phosphor layer 5. The side surfaces and the lower surfaces of the LEDs 4 are covered with the phosphor layer 5.

In the phosphor layer 5 around the LEDs 4, the upper surface thereof is pressed by the release sheet 13 around the LEDs 4, while the upper surfaces of the LEDs 4 are covered with the release sheet 13, so that the phosphor layer 5 around the LEDs 4 is not in contact with the upper surfaces of the LEDs 4.

The upper surface of the phosphor layer 5 is formed to be flush with the upper surface of each of the LEDs 4.

Thereafter, as shown in FIG. 1 (c), the release sheet 13 is peeled from the phosphor layer 5 and a plurality of the LEDs 4.

[Encapsulating Step]

In the encapsulating step, as shown in FIG. 1 (d), the phosphor layer 5 is cured. When the curable resin is a thermosetting resin, the phosphor layer 5 is thermally cured. To be specific, the phosphor layer 5 is heated at, for example, 80° C. or more, or preferably 100° C. or more, and at, for example, 200° C. or less, or preferably 180° C. or less. When the phosphor layer 5 is thermally cured, in the above-described hot pressing in FIG. 1 (c), the embedding of a plurality of the LEDs 4 into the phosphor layer 5 can be also performed with the thermal curing.

When the thermosetting resin contains a two-step curable type silicone resin and when the phosphor layer 5 that embeds the LEDs 4 is in a B-stage state, the phosphor layer 5 is completely cured to be brought into a C-stage state by the above-described heating.

When the thermosetting resin contains a one-step curable type silicone resin, the phosphor layer 5 is completely cured to be brought into a C-stage state by the above-described heating.

When the curable resin is an active energy ray curable resin, an active energy ray is applied to the phosphor layer 5.

The cured (completely cured) phosphor layer 5 has flexibility. To be specific, the cured (completely cured) phosphor layer 5 has a compressive elastic modulus at 23° C. of, for example, 0.5 MPa or more, or preferably 1.0 MPa or more, and of, for example, 100 MPa or less, or preferably 10 MPa or less.

When the compressive elastic modulus of the phosphor layer 5 is not more than the above-described upper limit, the flexibility can be surely secured and in the cutting step (ref: FIG. 1 (e)) to be described next, for example, the phosphor layer 5 can be cut using a cutting device (described later). When the compressive elastic modulus of the phosphor layer 5 is not less than the above-described lower limit, the shape of the phosphor layer 5 after being cut can be retained.

In this way, the side surfaces and the lower surfaces of the LEDs 4 are covered with the phosphor layer 5 in tight contact with each other. That is, the LEDs 4 are encapsulated by the phosphor layer 5 in a C-stage state. The upper surfaces of the LEDs 4 are exposed from the phosphor layer 5 around the LEDs 4.

[Cutting Step]

As shown in FIG. 1 (c), in the cutting step, the flexible phosphor layer 5 around the LED 4 is cut along the thickness direction. As shown by dash-dot lines in FIG. 2, for example, the phosphor layer 5 is cut into a generally rectangular shape in plane view that surrounds each of the LEDs 4.

In order to cut the phosphor layer 5, for example, a dicing device using a disc-shaped dicing saw (dicing blade) 31, which is shown in FIG. 1 (d), a cutting device using a cutter, a laser irradiation device, or the like is used.

The phosphor layer 5 is cut, while the position of the LEDs 4 is checked from the upper side. To be specific, in the phosphor layer 5, the position of the LEDs 4 is checked, while the LEDs 4 are visually confirmed with, for example, a camera. As shown in FIG. 2, the phosphor layer 5 is cut so that cuts 8 that define a region surrounding each of the LEDs 4 are formed in plane view.

As shown in FIG. 1 (d), in the cutting of the phosphor layer 5, for example, the phosphor layer 5 is cut from the upper surface toward the lower surface so that the cuts 8 fail to pass through the support sheet 1, to be specific, fail to pass through the pressure-sensitive adhesive layer 3.

As referred in FIG. 2, a gap between the cuts 8 that are opposed to each other in the right-left direction and a gap between the cuts 8 that are opposed to each other in the front-rear direction are, for example, 0.1 mm or more, or preferably 0.3 mm or more, and is, for example, 5 mm or less, or preferably 3 mm or less.

By the cutting step, as shown in FIG. 1 (d), the phosphor layer-covered LEDs 10, each of which includes one LED 4 and the phosphor layer 5 that embeds the LED 4, are obtained in a state of being in tight contact with the support sheet 1.

In the phosphor layer-covered LED 10, the lower surface and the side surfaces of the LED 4 are covered with the phosphor layer 5 in tight contact with each other, while a terminal that forms a part of the upper surface of the LED 4 is exposed.

[Peeling Step]

In FIG. 1 (e), in the peeling step, each of the phosphor layer-covered LEDs 10 is peeled from the upper surface of the pressure-sensitive adhesive layer 3. That is, each of the phosphor layer-covered LEDs 10 is peeled from the support board 2 and the pressure-sensitive adhesive layer 3 so that an interfacial peeling occurs between the phosphor layer 5 and the pressure-sensitive adhesive layer 3.

To be specific, when the pressure-sensitive adhesive layer 3 is formed of an active energy ray irradiation release sheet, an active energy ray is applied to the pressure-sensitive adhesive layer 3. Or, when the pressure-sensitive adhesive layer 3 is formed of a thermal release sheet, the pressure-sensitive adhesive layer 3 is heated.

By those treatments, the phosphor layer-covered LED 10 that is peeled from the support sheet 1 is obtained.

[Mounting Step]

Thereafter, after the phosphor layer-covered LED 10 is selected in accordance with emission wavelength and luminous efficiency, as shown in FIG. 1 (g), the selected phosphor layer-covered LED 10 is mounted on a substrate 9. In this way, an LED device 15 is obtained.

To be specific, the phosphor layer-covered LED 10 is reversed upside down and is disposed in opposed relation to the substrate 9 so that a terminal (not shown) that forms a part of the lower surface of the phosphor layer-covered LED 10 is opposed to a terminal (not shown) provided on the upper surface of the substrate 9. That is, the LED 4 in the phosphor layer-covered LED 10 is flip-chip mounted on the substrate 9.

In this way, the LED device 15 including the substrate 9 and the phosphor layer-covered LED 10 that is mounted on the substrate 9 is obtained.

Thereafter, as shown by the phantom line in FIG. 1 (f), an encapsulating protective layer 20 that encapsulates the phosphor layer-covered LED 10 is provided in the LED device 15 as required.

According to the above-described method for producing the phosphor layer-covered LED 10, in the embedding step, the lower surfaces and the side surfaces of the LEDs 4 are covered with the phosphor layer 5 so that one surfaces thereof are exposed, to be more specific, the LEDs 4 are embedded in the phosphor layer 5, so that after the embedding step, each of the LEDs 4 having the upper surface exposed is visually confirmed and the phosphor layer 5 is capable of being accurately cut corresponding to each of the LEDs 4. Thus, the phosphor layer-covered LED 10 to be obtained has excellent dimension stability. As a result, the LED device 15 including the phosphor layer-covered LED 10 has excellent luminous stability.

According to the method for producing the phosphor layer-covered LED 10, the wavelength of light that is emitted from the LED 4 is capable of being converted by the phosphor layer 5. Thus, the luminous efficiency of the LED device 15 is capable of being improved.

In the embedding step, a plurality of the LEDs 4 are embedded in the phosphor layer 5 so as to expose one surface of each of the LEDs 4 and in the cutting step, the phosphor layer 5 is cut corresponding to each of the LEDs 4 to obtain a plurality of the phosphor layer-covered LEDs 10. That is, the phosphor layer 5 is cut corresponding to a plurality of the phosphor layer-covered LEDs 10, so that each of the singulated phosphor layer-covered LEDs 10 having excellent dimension stability is capable of being obtained.

When, in the disposing step, the phosphor layer 5 is formed of the phosphor sheet 25 in a B-stage state containing a curable resin, in the embedding step, the LEDs 4 are capable of being easily and surely embedded in the phosphor layer 5 in a B-stage state and furthermore, in the encapsulating step, the phosphor layer 5 is cured to be brought into a C-stage state and the LEDs 4 are capable of being surely encapsulated by the phosphor layer 5 in a C-stage state.

Thus, the phosphor layer-covered LED 10 having excellent reliability is capable of being obtained.

When the phosphor layer 5 is formed of the phosphor sheet 25, a plurality of the LEDs 4 are capable of being collectively embedded in the phosphor sheet 25. Thus, the production efficiency of the phosphor layer-covered LED 10 is capable of being improved.

The phosphor layer-covered LED 10 obtained in the above-described method has excellent dimension stability.

The LED device 15 includes the phosphor layer-covered LED 10 having excellent dimension stability, so that it has excellent luminous stability.

Modified Example

In the first embodiment, after the LEDs 4 are disposed on the phosphor layer 5, the release sheet 13 is disposed on the LEDs 4. Alternatively, for example, the release sheet 13 in which the LEDs 4 are laminated in alignment is prepared and thereafter, the prepared release sheet 13 is capable of being reversed upside down to be subsequently laminated on the phosphor layer 5.

In the first embodiment, as shown in FIG. 1 (*b*), the release sheet 13 is disposed on the upper surfaces of the LEDs 4. Alternatively, for example, though not shown, the release sheet 13 is capable of being provided on the lower surface of the upper plate of the pressing device, which is not shown. Preferably, as shown in FIG. 1 (*b*), the release sheet 13 is disposed on the upper surfaces of the LEDs 4 that are laminated on the phosphor layer 5 in advance.

In the first embodiment, the phosphor sheet 25 and the phosphor layer 5 are formed from a phosphor resin composition that contains a phosphor. Alternatively, for example, an encapsulating sheet 25 and an encapsulating layer 5 are also capable of being formed from a resin composition that does not contain a phosphor. In such a case, the phosphor layer-covered LED 10 is obtained as an encapsulating layer-embedded LED 10.

In the first embodiment, a plurality of the LEDs 4 are embedded in the phosphor layer 5. Alternatively, for example, a single piece of the LED 4 is capable of being embedded in the phosphor layer 5.

In such a case, in the cutting step shown in FIG. 1 (*d*), the phosphor layer 5 around the LED 4 is trimmed (is subjected to trimming) so as to have a desired size.

In the embodiment in FIG. 1, first, as shown by dashed lines in FIG. 1 (*d*), the cutting step is performed in which the phosphor layers 5 are singulated into the phosphor layer-covered LEDs 10 each including one LED 4. Alternatively, for example, though not shown, the phosphor layers 5 are not singulated into the phosphor layer-covered LEDs 10 each including one LED 4 and the phosphor layer-covered LED 10 including a plurality of the LEDs 4 is capable of being obtained. In the cutting step shown in FIG. 1 (*d*), the phosphor layer 5 that embeds a plurality of the LEDs 4 is trimmed (is subjected to trimming) so as to have a desired size.

In the first embodiment, the LED 4, the phosphor layer-covered LED 10, and the LED device 15 are described as one example of the optical semiconductor element, the encapsulating layer-covered optical semiconductor element, and the optical semiconductor device of the present invention, respectively. Alternatively, for example, the optical semiconductor element, the encapsulating layer-covered optical semiconductor element, and the optical semiconductor device of the present invention can also include an LD (laser diode) 4, a phosphor layer-covered LD 10, and a laser diode device 15, respectively.

Second Embodiment

In the views in the second embodiment, the same reference numerals are provided for members and steps corresponding to each of those in the first embodiment, and their detailed description is omitted.

In the first embodiment, as shown in FIGS. 1 (*a*) and 2, the support board 2 is formed into a flat plate shape. Alternatively, for example, as shown in FIGS. 3 (*a*) and 4, through holes 21 can be also formed in the support board 2.

[Disposing Step]

The through holes 21 are insertion holes so as to allow a pressing member 14 (ref: FIG. 3 (*e'*)) to be described later to insert thereinto. As shown in FIG. 4, a plurality of the through holes 21 are provided at spaced intervals to each other in the support board 2 corresponding to the LEDs 4 that are subsequently disposed. The through holes 21 are, for example, disposed so as to allow each of the phosphor layer-covered LEDs 10 to be pressed when the phosphor layer-covered LEDs 10 are singulated.

To be more specific, a plurality of the through holes 21 are disposed in alignment in the support sheet 1 so as to be spaced apart from each other at equal intervals in the front-rear and the right-left directions in plane view.

The shape of each of the through holes 21 is, for example, formed into a circular shape in plane view. In the size thereof, the hole diameter is, for example, 0.1 mm or more, or preferably 0.2 mm or more, and is, for example, 1 mm or less, or preferably 0.7 mm or less.

The size (the plane area) of each of the through holes 21 with respect to that (the plane area) of each of the LEDs 4 is, for example, 10% or more, or preferably 20% or more, and is, for example, 90% or less, or preferably 80% or less.

The pressure-sensitive adhesive layer 3 is laminated on the upper surface of the support board 2 so as to cover the through holes 21.

[Embedding Step]

As shown in FIG. 3 (*b*), in the embedding step, first, a plurality of the LEDs 4 are disposed on portions of the upper surface of the phosphor layer 5 that correspond to the through holes 21. Subsequently, the LEDs 4 are embedded in the phosphor layer 5 so that the upper surfaces thereof are exposed.

[Peeling Step]

In the peeling step, as shown in FIG. 3 (*e*), each of the phosphor layer-covered LEDs 10 is peeled from the pressure-sensitive adhesive layer 3. In the peeling step, as shown in FIG. 3 (*e'*), the pressure-sensitive adhesive layer 3 is pressed by the pressing member 14 via the through hole 21 using a pick-up device 17 that is provided with the pressing member 14 such as a needle and an absorbing member 16 such as a collet, so that each of the phosphor layer-covered LEDs 10 is peeled from the support board 2 and the pressure-sensitive adhesive layer 3.

To be more specific, first, the support sheet 1 is placed in the pick-up device 17. Then, the pressing member 14 is disposed from the lower side in opposed relation to the through hole 21 corresponding to the phosphor layer-covered LED 10 that is intended to be peeled off.

The pressing member 14 is inserted into the through hole 21 from the lower side.

Then, the pressure-sensitive adhesive layer 3 corresponding to the through hole 21 is pressed relatively toward the upper side with respect to the support board 2 and the pressure-sensitive adhesive layer 3 is pushed up along with the phosphor layer-covered LED 10.

The pushed-up phosphor layer-covered LED 10 is absorbed by the absorbing member 16.

The phosphor layer-covered LED 10 is absorbed by the absorbing member 16 and is further moved relatively toward the upper side with respect to the support board 2. Thereafter, the phosphor layer-covered LED 10 is peeled from the pressure-sensitive adhesive layer 3.

Before the peeling step, the pressure-sensitive adhesive force of the pressure-sensitive adhesive layer 3 is reduced by application of ultraviolet ray, a chemical solution, or heating as required and then, each of the phosphor layer-covered LEDs 10 can be also easily peeled off.

In this way, as shown in FIG. 3 (e), each of the phosphor layer-covered LEDs 10 that is peeled from the support sheet 1 is obtained.

Modified Example

In the embodiment in FIG. 2, first, in the cutting step, as shown by the dashed lines in FIG. 3 (d), the phosphor layers 5 are singulated into the phosphor layer-covered LEDs 10 each including one LED 4. Next, in the peeling step, as shown in FIG. 3 (e), each of a plurality of the phosphor layer-covered LEDs 10 is peeled from the pressure-sensitive adhesive layer 3. Alternatively, as shown in FIG. 5, in the cutting step, a plurality of the LEDs 4 and the respective phosphor layers 5 are not singulated and in the peeling step, the phosphor layer-covered LED 10 including a plurality of the LEDs 4 can be also peeled from the pressure-sensitive adhesive layer 3.

In such a case, as shown in FIG. 5, the pick-up device 17 is provided with a plurality of the pressing members 14 and a plurality of the absorbing members 16 corresponding to a plurality of the LEDs 4. A plurality of the pressing members 14 move relative to one another in the up-down direction at the same time.

In order to peel a plurality of the LEDs 4, first, a plurality of the LEDs 4 are placed in the pick-up device 17 and each of a plurality of the pressing members 14 is disposed from the lower side in opposed relation to each of a plurality of the through holes 21.

A plurality of the pressing members 14 are simultaneously inserted into a plurality of the through holes 21 from the lower side.

Then, the entire pressure-sensitive adhesive layer 3 is pressed relatively toward the upper side with respect to the support board 2 and the entire pressure-sensitive adhesive layer 3 is pushed up along with a plurality of the LEDs 4 and the phosphor layer 5.

The pushed-up plurality of the LEDs 4 and phosphor layer 5 are absorbed by a plurality of the absorbing members 16.

A plurality of the LEDs 4 and the phosphor layer 5 are absorbed by a plurality of the absorbing members 16 and are further moved relatively toward the upper side with respect to the support board 2. Thereafter, a plurality of the LEDs 4 and the phosphor layer 5 are peeled from the pressure-sensitive adhesive layer 3.

Third Embodiment

In the views in the third embodiment, the same reference numerals are provided for members and steps corresponding to each of those in the first and the second embodiments, and their detailed description is omitted.

In the peeling step (ref: FIG. 1 (e)) in the first embodiment, each of the phosphor layer-covered LEDs 10 is peeled from the support board 2 and the pressure-sensitive adhesive layer 3. Alternatively, for example, as shown in FIG. 6 (e), first, the support board 2 is peeled from the pressure-sensitive adhesive layer 3 and thereafter, as shown in FIG. 6 (f), each of the phosphor layer-covered LEDs 10 can be peeled from the pressure-sensitive adhesive layer 3 only.

That is, the method for producing the phosphor layer-covered LED 10 includes the same steps of disposing step (ref: FIG. 6 (b)), embedding step (ref: FIG. 6 (c)), encapsulating step (ref: FIG. 6 (d)), cutting step (the dashed lines in FIG. 6 (d)), and peeling step (ref: FIG. 6 (f)) as those in the first embodiment. In addition, as shown in FIG. 6 (e), the method for producing the phosphor layer-covered LED 10 further includes a support board peeling step in which the support board 2 is peeled from the pressure-sensitive adhesive layer 3 after the cutting step (ref: FIG. 6 (d)) and before the peeling step (ref: FIG. 6 (f)).

[Support Board Peeling Step]

As shown in FIG. 6 (e), in the support board peeling step, the support board 2 is peeled from the lower surface of the pressure-sensitive adhesive layer 3.

In order to peel the support board 2 from the pressure-sensitive adhesive layer 3, for example, the pressure-sensitive adhesive layer 3 is formed from a pressure-sensitive adhesive in which the pressure-sensitive adhesive force is capable of being reduced by application of an active energy ray such as an ultraviolet ray and the active energy ray is applied to the pressure-sensitive adhesive layer 3, so that the pressure-sensitive adhesive force of the pressure-sensitive adhesive layer 3 is reduced. Thereafter, the support board 2 is peeled from the pressure-sensitive adhesive layer 3.

Alternatively, the pressure-sensitive adhesive layer 3 is formed from a pressure-sensitive adhesive in which the pressure-sensitive adhesive force is capable of being reduced by heating and the pressure-sensitive adhesive layer 3 is heated, so that the pressure-sensitive adhesive force of the pressure-sensitive adhesive layer 3 is reduced. Thereafter, the support board 2 is peeled from the pressure-sensitive adhesive layer 3.

[Peeling Step]

Next, in the peeling step shown by the arrow in FIG. 6 (f), each of the phosphor layer-covered LEDs 10 is peeled from the pressure-sensitive adhesive layer 3.

To be specific, as shown in FIG. 6 (f'), each of the phosphor layer-covered LEDs 10 is peeled from the pressure-sensitive adhesive layer 3 with the pick-up device 17. In the pick-up device 17, the pressing member 14 presses (pushes up) the pressure-sensitive adhesive layer 3 corresponding to the phosphor layer-covered LED 10 that is intended to be peeled off from the lower side thereof. In this way, the phosphor layer-covered LED 10 that is intended to be peeled off is pushed up upwardly, and the pushed-up phosphor layer-covered LED 10 is peeled from the pressure-sensitive adhesive layer 3, while being absorbed by the absorbing member 16 such as a collet.

In this way, as shown in FIG. 6 (f), each of the phosphor layer-covered LEDs 10 that is peeled from the support sheet 1 is obtained.

According to the third embodiment, in the peeling step, each of the phosphor layer-covered LEDs 10 is peeled from the pressure-sensitive adhesive layer 3, that is, in the support sheet 1, the hard support board 2 is already peeled from the pressure-sensitive adhesive layer 3, so that the phosphor layer-covered LED 10 can be easily and surely peeled from the pressure-sensitive adhesive layer 3 using the above-described pick-up device 17.

Fourth Embodiment

In the views in the fourth embodiment, the same reference numerals are provided for members and steps corresponding to each of those in the first to third embodiments, and their detailed description is omitted.

In the peeling step (ref: FIG. 1 (e)) in the first embodiment, each of the phosphor layer-covered LEDs 10 is peeled from the support sheet 1 and in the mounting step (ref: FIG. 1 (f)), the peeled phosphor layer-covered LED 10 is then mounted on the substrate 9. Alternatively, for example, as shown in FIGS. 7 (e) and 7 (f), the phosphor layer-covered LEDs 10 are sequentially transferred onto a transfer sheet 11 and a stretchable support sheet 12, and thereafter, as shown in FIG. 7 (g), each of the phosphor layer-covered LEDs 10 can be peeled from the stretchable support sheet 12.

[Peeling Step]

The peeling step includes a transfer step of transferring the phosphor layer-covered LEDs 10 onto the stretchable support sheet 12 (ref: FIG. 7 (f)) and a re-pealing step of peeling the phosphor layer-covered LEDs 10 from the stretchable support sheet 12, while stretching the stretchable support sheet 12 in the plane direction (ref: FIGS. 7 (g) and 7 (g')).

[Transfer Step]

In order to transfer the phosphor layer-covered LEDs 10 onto the stretchable support sheet 12, as shown by the arrows in FIG. 7 (d), and in FIG. 7 (e), the phosphor layer-covered LEDs 10 after the cutting step (ref: the dashed lines in FIG. 7 (d)) are transferred onto the transfer sheet 11 in advance (a first transfer step).

The transfer sheet 11 is formed of the same material and with the same thickness as those in the stretchable support sheet 12 to be described next.

By the transfer of the phosphor layer-covered LEDs 10 onto the transfer sheet 11, the lower surfaces of the LEDs 4 in which terminals that are not shown are formed on a part of the lower surfaces are brought into contact with (are brought into tight contact with) the upper surface of the transfer sheet 11.

Thereafter, as shown in FIG. 7 (f), the phosphor layer-covered LEDs 10 are transferred onto the stretchable support sheet 12 (a second transfer step).

The stretchable support sheet 12 is a stretchable pressure-sensitive adhesive sheet that is capable of stretching in the plane direction. Examples thereof include an active energy ray irradiation release sheet in which the pressure-sensitive adhesive force is capable of being reduced by application of an active energy ray (to be specific, an active energy ray irradiation release sheet described in Japanese Unexamined Patent Publication No. 2005-286003 or the like) and a thermal release sheet in which the pressure-sensitive adhesive force is capable of being reduced by heating (to be specific, a thermal release sheet such as REVALPHA (registered trademark, manufactured by NITTO DENKO CORPORATION)). Preferably, an active energy ray irradiation release sheet or the like is used.

The stretchable support sheet 12 has a tensile elasticity at 23° C. of, for example, 0.01 MPa or more, or preferably 0.1 MPa or more, and of, for example, 10 MPa or less, or preferably 1 MPa or less.

The thickness of the stretchable support sheet 12 is, for example, 0.1 mm or more and 1 mm or less.

A commercially available product can be used as the stretchable support sheet 12. To be specific, the UE series (manufactured by NITTO DENKO CORPORATION) or the like is used.

By the transfer of the phosphor layer-covered LEDs 10 onto the stretchable support sheet 12, the upper surfaces of the LEDs 4 in which terminals that are not shown are formed on a part of the upper surfaces are exposed from the phosphor layer 5.

[Re-Peeling Step]

After the transfer step, as shown in FIG. 7 (g), the stretchable support sheet 12 is stretched in the plane direction and each of the phosphor layer-covered LEDs 10 is peeled from the stretchable support sheet 12.

To be specific, first, as shown by the arrows in FIG. 7 (f), the stretchable support sheet 12 is stretched outwardly in the plane direction. In this way, as shown in FIG. 7 (g), in a state where the phosphor layer-covered LEDs 10 are in tight contact with the stretchable support sheet 12, the tensile stress is concentrated in the cuts 8; thus, the cuts 8 expand; and the LEDs 4 are separated from each other, so that gaps 19 are formed. Each of the gaps 19 is formed into a generally lattice shape (a generally grid shape) in plane view so as to separate the LEDs 4.

Subsequently, as shown in FIG. 7 (g'), the stretchable support sheet 12 corresponding to the phosphor layer-covered LED 10 that is intended to be peeled off is pushed up from the lower side thereof by the pressing member 14. In this way, the phosphor layer-covered LED 10 is pushed up upwardly, and the pushed-up phosphor layer-covered LED 10 is peeled from the stretchable support sheet 12, while being absorbed by the absorbing member 16.

When the stretchable support sheet 12 is an active energy ray irradiation release sheet, in a case where each of the phosphor layer-covered LEDs 10 is peeled from the stretchable support sheet 12, an active energy ray is applied to the stretchable support sheet 12. When the stretchable support sheet 12 is a thermal release sheet, the stretchable support sheet 12 is heated. The pressure-sensitive adhesive force of the stretchable support sheet 12 is reduced by those treatments, so that each of the phosphor layer-covered LEDs 10 can be easily and surely peeled from the stretchable support sheet 12.

In this way, each of the phosphor layer-covered LEDs 10 that is peeled from the support sheet 1 is obtained.

In the fourth embodiment, the stretchable support sheet 12 is stretched in the plane direction and each of the phosphor layer-covered LEDs 10 is peeled from the stretchable support sheet 12.

Thus, the gaps 19 are formed around each of the phosphor layer-covered LEDs 10, so that each of the phosphor layer-covered LEDs 10 can be further easily and surely peeled from the stretchable support sheet 12 using the pick-up device 17.

Additionally, the gap 19 is formed between the phosphor layer-covered LED 10 that is intended to be peeled off and the phosphor layer-covered LED 10 that is adjacent thereto. Thus, it can be prevented that when the absorbing member 16 is brought into contact with the phosphor layer-covered LED 10 that is intended to be peeled off, the absorbing member 16 comes in contact with the phosphor layer-covered LED 10 that is adjacent thereto to cause a damage to the phosphor layer-covered LED 10.

Fifth Embodiment

In the views in the fifth embodiment, the same reference numerals are provided for members and steps corresponding to each of those in the first to fourth embodiments, and their detailed description is omitted.

In the fifth embodiment, as shown in FIG. 8 (*a*), first, the stretchable support sheet 12 is prepared instead of the support sheet 1 as a support and subsequently, a disposing step (ref: FIG. 8 (*b*)), an embedding step (ref: FIG. 8 (*c*)), an encapsulating step (ref: FIG. 8 (*c*)), a cutting step (ref: the dashed lines in FIG. 8 (*c*)), and a peeling step (ref: FIG. 8 (*d*)) are sequentially performed. The method for producing the LED device 15 in the fifth embodiment includes a mounting step (ref: FIG. 8 (*e*)).

[Disposing Step]

As shown in FIG. 8 (*b*), in the disposing step, the phosphor sheet 25 is laminated on the upper surface of the stretchable support sheet 12, so that the phosphor layer 5 is formed on the upper surface of the stretchable support sheet 12.

[Cutting Step]

As shown by the dashed lines in FIG. 8 (*c*), in the cutting step, the phosphor layer 5 that is supported by the stretchable support sheet 12 is cut.

Sixth Embodiment

In the views in the sixth embodiment, the same reference numerals are provided for members and steps corresponding to each of those in the first to fifth embodiments, and their detailed description is omitted.

As shown in FIGS. 9 (*a*) to 9 (*e*), the method for producing the phosphor layer-covered LED 10 in the sixth embodiment includes a disposing step (ref: FIGS. 9 (*a*) and 9 (*b*)), an embedding step (ref: FIG. 9 (*c*)), an encapsulating step (ref: FIG. 9 (*c*)) of encapsulating the LEDs 4 by the phosphor layer 5 by application of an active energy ray to the phosphor layer 5, a cutting step (ref: FIG. 9 (*d*)), and a peeling step (ref: FIG. 9 (*e*)). The method for producing the LED device 15 in the sixth embodiment includes a mounting step (ref: FIG. 9 (*f*)).

In the following, the steps of the sixth embodiment are described in detail.

<Disposing Step>

As shown in FIG. 9 (*a*), in the disposing step, a support sheet 32 is formed into a sheet shape extending in the plane direction (a direction perpendicular to the thickness direction). The support sheet 32 is formed into a generally rectangular shape in plane view that is the same as or larger than the phosphor layer 5 to be described next and to be specific, is formed into a generally rectangular sheet shape in plane view.

The support sheet 32 is not required to have heat resistance with respect to the heating and curing of the phosphor layer 5 to be described later, so that it can be also selected from a sheet having low heat resistance. The support sheet 32 can also have transparency. The support sheet 32 is capable of supporting the phosphor layer 5 and is also capable of stretching in the plane direction. Examples thereof may include a thermal release sheet in which the pressure-sensitive adhesive force is capable of being reduced by heating (to be specific, a thermal release sheet such as REVALPHA (registered trademark, manufactured by NITTO DENKO CORPORATION)) or an active energy ray irradiation release sheet in which the pressure-sensitive adhesive force is capable of being reduced by application of an active energy ray (for example, an ultraviolet ray and an electron beam) (to be specific, an active energy ray irradiation release sheet described in Japanese Unexamined Patent Publication No. 2005-286003 or the like). When the support sheet 32 is an active energy ray irradiation release sheet, the active energy ray curable resin and the irradiation conditions are selected so as not to reduce the pressure-sensitive adhesive force of the support sheet 32 by application of the active energy ray to the phosphor layer 5.

The length of one side of the support sheet 32 is, for example, 10 mm or more and 300 mm or less.

The support sheet 32 has a tensile elasticity at 23° C. of, for example, $1 \times 10^4$ Pa or more, or preferably $1 \times 10^5$ Pa or more, and of, for example, $1 \times 10^9$ Pa or less. When the tensile elasticity of the support sheet 32 is not less than the above-described lower limit, the stretchability of the support sheet 32 in the plane direction is secured and the stretching (ref: FIG. 9 (*e*)) of the support sheet 32 in the plane direction to be described later can be smoothly performed.

The thickness of the support sheet 32 is, for example, 0.1 mm or more, or preferably 0.2 mm or more, and is, for example, 1 mm or less, or preferably 0.5 mm or less.

The phosphor layer 5 shown in FIG. 9 (*b*) is formed from a phosphor resin composition containing an active energy ray curable resin and a phosphor.

The active energy ray curable resin is a curable resin that is capable of being cured by application of an active energy ray. To be specific, an example thereof includes a silicone semi-cured material. The silicone semi-cured material is obtained as a sheet by heating a first silicone resin composition or a second silicone resin composition.

In the following, the first silicone resin composition and the second silicone resin composition are described in detail.

[First Silicone Resin Composition]

The first silicone resin composition contains, for example, a first polysiloxane containing at least one pair of condensable substituted groups that is capable of condensation by heating and at least one addable substituted group that is capable of addition by an active energy ray and a second polysiloxane containing at least one addable substituted group that is capable of addition by an active energy ray and makes one pair with the addable substituted group in the first polysiloxane.

An example of the one pair of condensable substituted groups includes combination (a first combination group) of at least one substituted group selected from the group consisting of a hydroxyl group (—OH), an alkoxy group, an acyloxy group, an amino group (—NH$_2$), an alkylamino group, an alkenyloxy group, and a halogen atom and a hydroxyl group.

The alkoxy group is represented by —OR$^1$. R$^1$ represents an alkyl group or a cycloalkyl group. An example of the alkyl group includes a straight chain or branched chain alkyl group having 1 or more and 20 or less carbon atoms such as a methyl group, an ethyl group, a propyl group, an isopropyl group, a butyl group, an isobutyl group, a pentyl group, and a hexyl group. Preferably, an alkyl group having 1 or more carbon atoms is used, more preferably, an alkyl group having 10 or less carbon atoms is used, or further more preferably, an alkyl group having 6 or less carbon atoms is used. An example of the cycloalkyl group includes a cycloalkyl group having 3 or more and 6 or less carbon atoms such as a cyclopentyl group and a cyclohexyl group.

An example of the alkoxy group includes an alkoxy group containing a straight chain or branched chain alkyl group having 1 or more and 20 or less carbon atoms such as a methoxy group, an ethoxy group, a propoxy group, an isopropoxy group, a butoxy group, an isobutoxy group, a pentyloxy group, and a hexyloxy group.

An example of the alkoxy group also includes an alkoxy group containing a cycloalkyl group having 3 or more and 6 or less carbon atoms such as a cyclopentyloxy group and a cyclohexyloxy group.

As the alkoxy group, preferably, in view of easy preparation and thermal stability, an alkoxy group containing an alkyl group having 1 or more carbon atoms is used, more preferably, an alkoxy group containing an alkyl group having 10 or less carbon atoms is used, further more preferably, an alkoxy group containing an alkyl group having 6 or less carbon atoms is used, or even more preferably, a methoxy group is used.

The acyloxy group is represented by —OCOR$^1$. R$^1$ represents the above-described alkyl group or cycloalkyl group. Preferably, as R$^1$, an alkyl group is used.

Examples of the acyloxy group include an acetoxy group (—OCOCH$_3$), —OCOC$_2$H$_5$, and —OCOC$_3$H$_7$. Preferably, an acetoxy group is used.

Examples of the alkylamino group include a monoalkylamino group and a dialkylamino group.

The monoalkylamino group is represented by —NR$^2$H. R$^2$ represents an alkyl group or a cycloalkyl group. Preferably, as R$^2$, an alkyl group is used. An example of the monoalkylamino group includes a monoalkylamino group having 1 or more and 10 or less carbon atoms of an N-substituted alkyl group such as a methylamino group, an ethylamino group, an n-propylamino group, and an isopropylamino group.

The dialkylamino group is represented by —NR$^2{}_2$. R$^2$ represents alkyl groups or cycloalkyl groups that may be the same or different from each other. R$^2$ is the same as that described above. An example of the dialkylamino group includes a dialkylamino group having 1 or more and 10 or less carbon atoms of an N,N-substituted alkyl such as a dimethylamino group, a diethylamino group, a di-n-propylamino group, a diisopropylamino group, an ethylmethylamino group, a methyl-n-propylamino group, and a methylisopropylamino group.

As the alkylamino group, preferably, a dialkylamino group is used, more preferably, a dialkylamino group having the same number of carbon atoms of N,N-substituted alkyl is used, or further more preferably, a dimethylamino group is used.

The alkenyloxy group is represented by —OCOR$^3$. R$^3$ represents an alkenyl group or a cycloalkenyl group. An example of the alkenyl group includes an alkenyl group having 2 or more and 10 or less carbon atoms such as a vinyl group, an allyl group, a propenyl group, an isopropenyl group, a butenyl group, a pentenyl group, a hexenyl group, a heptenyl group, and an octenyl group. An example of the cycloalkenyl group includes a cycloalkenyl group having 3 or more and 10 or less carbon atoms such as a cyclohexenyl group, a cyclooctenyl group, and a norbornenyl group.

As the alkenyloxy group, preferably, an alkenyloxy group containing an alkenyl group having 2 or more and 10 or less carbon atoms is used, or more preferably, an isopropenyloxy group is used.

Examples of the halogen atom include a fluorine atom, a chlorine atom, a bromine atom, and an iodine atom. Preferably, a chlorine atom is used.

To be specific, an example of the first combination group includes one pair of combinations such as combination of hydroxyl groups with themselves, combination of an alkoxy group and a hydroxyl group, combination of an acyloxy group and a hydroxyl group, combination of an amino group and a hydroxyl group, combination of an alkylamino group and a hydroxyl group, combination of an alkenyloxy group and a hydroxyl group, and combination of a halogen atom and a hydroxyl group.

Furthermore, an example of the first combination group also includes two pairs (to be specific, the total of two pairs of one pair of an alkoxy group and a hydroxyl group and the other pair of an acyloxy group and a hydroxyl group) or more of combinations such as combination of an alkoxy group, an acyloxy group, and a hydroxyl group.

As the first combination group, preferably, combination of hydroxyl groups with themselves and combination of an alkoxy group and a hydroxyl group are used, more preferably, combination of an alkoxy group and a hydroxyl group is used, further more preferably, combination of an alkoxy group containing an alkyl group having 1 or more and 10 or less carbon atoms and a hydroxyl group is used, or particularly preferably, combination of a methoxy group and a hydroxyl group is used.

In the one pair of condensable substituted groups made of the first combination group, two silicon atoms are bonded to each other via an oxide atom by condensation represented by the following formula (1), that is, silanol condensation.

Formula (1):

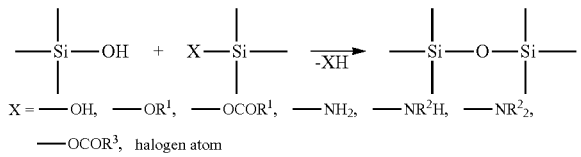

(where, in formula, R$^1$ to R$^3$ are the same as those described above.)

An example of the one pair of condensable substituted groups includes combination (a second combination group) of at least one substituted group selected from a hydroxyl group and an alkoxy group and a hydrogen atom.

An example of the alkoxy group includes the alkoxy group illustrated in the first combination group.

To be specific, an example of the second combination group includes one pair of combinations such as combination of a hydroxyl group and a hydrogen atom and combination of an alkoxy group and a hydrogen atom.

Furthermore, an example of the second combination group also includes two pairs (to be specific, the total of two pairs of one pair of a hydroxyl group and a hydrogen atom and the other pair of an alkoxy group and a hydrogen atom) or more of combinations such as combination of a hydroxyl group, an alkoxy group, and a hydrogen atom.

In one pair of condensable substituted groups made of the second combination group, two silicon atoms are bonded to each other via an oxide atom by condensation represented by the following formula (2), that is, hydrosilane condensation.

Formula (2):

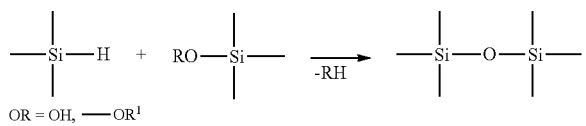

(where, in formula, R$^1$ is the same as that described above.)

The above-described first combination groups and second combination groups can be contained in the first polysiloxane alone or in combination of a plurality of groups.

Each of the condensable substituted groups is bonded to a silicon atom that is at the end of the main chain, which constitutes a molecule in the first polysiloxane; in the middle of the main chain; and/or in a side chain that branches off from the main chain. Preferably, one condensable substituted group (preferably, a hydroxyl group) is bonded to the silicon atoms at both ends of the main chain and the other condensable substituted group (preferably, an alkoxy group) is bonded to the silicon atom in the middle of the main chain (ref: Formula (16) to be described later).

In one pair of addable substituted groups, at least one piece of one addable substituted group is contained in the first polysiloxane and at least one piece of the other addable substituted group is contained in the second polysiloxane.

Examples of the one pair of addable substituted groups include combination of a hydrosilyl group and an ethylenically unsaturated group-containing group, combination of (meth)acryloyl group-containing groups with themselves, combination of epoxy group-containing groups with themselves, and combination of a thiol group-containing group and an ethylenically unsaturated group-containing group.

The hydrosilyl group is represented by —SiH and is a group in which a hydrogen atom is directly bonded to a silicon atom.

The ethylenically unsaturated group-containing group contains, in a molecule, an ethylenically unsaturated group. Examples of the ethylenically unsaturated group-containing group include the above-described alkenyl group and cycloalkenyl group. Preferably, an alkenyl group is used, or more preferably, a vinyl group is used.

The (meth)acryloyl group-containing group contains, in a molecule, a methacryloyl group ($CH_2=C(CH_3)COO-$) and/or an acryloyl group ($CH_2=CHCOO-$) and to be specific, is represented by the following formula (3).

Formula (3)

$$CH_2=CYCOO-R^4- \quad (3)$$

(where, in formula, Y represents a hydrogen atom or a methyl group and $R^4$ represents a divalent hydrocarbon group selected from a saturated hydrocarbon group and an aromatic hydrocarbon group.)

Examples of the divalent saturated hydrocarbon group include an alkylene group having 1 or more and 6 or less carbon atoms such as a methylene group, an ethylene group, a propylene group, and a butylene group and a cycloalkylene group having 3 or more and 8 or less carbon atoms such as a cyclopentylene group and a cyclohexylene group.

An example of the divalent aromatic hydrocarbon group includes an arylene group having 6 or more and 10 or less carbon atoms such as a phenylene group and a naphthylene group.

As the divalent hydrocarbon group, preferably, a divalent saturated hydrocarbon group is used, more preferably, an alkylene group is used, or further more preferably, a propylene group is used.

To be specific, an example of the (meth)acryloyl group-containing group includes a 3-(meth)acryloxypropyl group.

The epoxy group-containing group contains, in a molecule, an epoxy group. Examples of the epoxy group-containing group include an epoxy group, a glycidyl ether group, and an epoxy cycloalkyl group. Preferably, a glycidyl ether group and an epoxy cycloalkyl group are used.

The glycidyl ether group is a glycidoxy alkyl group, for example, represented by formula (4).

Formula (4):

$$-R^4-O-CH_2-CH\underset{O}{\overset{}{\diagdown}}CH_2 \quad (4)$$

(where, in formula (4), $R^4$ represents a divalent hydrocarbon group selected from a saturated hydrocarbon group and an aromatic hydrocarbon group.)

The divalent hydrocarbon group represented by $R^4$ is the same as the divalent hydrocarbon group in the above-described formula (3).

An example of the glycidyl ether group includes a 3-glycidoxypropyl group.

An example of the epoxy cycloalkyl group includes an epoxy cyclohexyl group represented by the following formula (5).

Formula (5):

$$-R^4-\left\langle\begin{array}{c}CH\\|\\CH\end{array}\right\rangle O \quad (5)$$

(where, in formula, $R^4$ represents a divalent hydrocarbon group selected from a saturated hydrocarbon group and an aromatic hydrocarbon group.)

An example of the divalent saturated hydrocarbon group includes the divalent hydrocarbon group in the above-described formula (3). Preferably, the above-described alkylene group having 1 or more and 6 or less carbon atoms is used, or more preferably, an ethylene group is used.

To be specific, an example of the epoxy cycloalkyl group includes a 2-(3,4-epoxy cyclohexyl)ethyl group.

The thiol group-containing group contains, in a molecule, a thiol group (—SH). Examples thereof include a thiol group and a mercaptoalkyl group such as mercaptomethyl, mercaptoethyl, and mercaptopropyl.

One addable substituted group is replaced with the end, the middle, and/or a side chain of the main chain in the first polysiloxane. The other addable substituted group is replaced with or positioned at the end, the middle, and/or a side chain of the main chain in the second polysiloxane.

An example of the addable substituted group includes one pair or two or more pairs of combinations described above.

As one pair of addable substituted groups, in view of heat resistance and transparency, preferably, combination of a hydrosilyl group and an alkenyl group is used.

As shown in the following formulas (6) to (9), one pair of addable substituted groups is subjected to addition.

Formula (6):

$$-\underset{|}{\overset{|}{Si}}-\!\!\diagup\!\!\diagup \ + \ H-\underset{|}{\overset{|}{Si}}- \ \longrightarrow \ -\underset{|}{\overset{|}{Si}}\diagup\!\diagdown\underset{|}{\overset{|}{Si}}- \quad (6)$$

Formula (7):

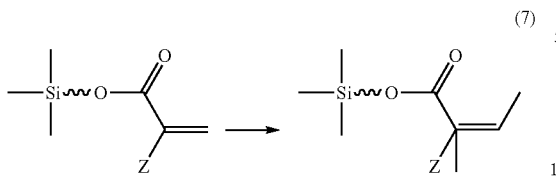

(7)

(where, in formula, Z represents a hydrogen atom or a methyl group.)

Formula (8):

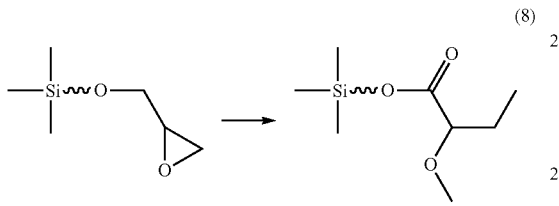

(8)

Formula (9):

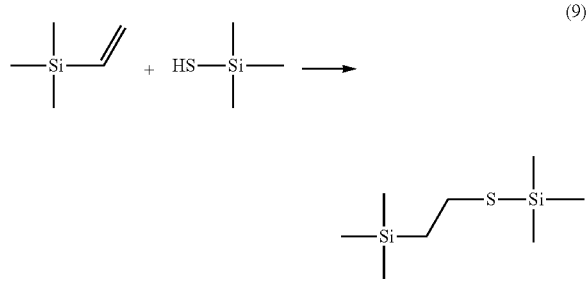

(9)

To be specific, when one pair of addable substituted groups is combination of a hydrosilyl group and an alkenyl group (to be specific, a vinyl group), as shown by the above-described formula (6), hydrosilylation (hydrosilylation addition) is performed.

When one pair of addable substituted groups is combination of (meth)acryloyl groups with themselves, as shown by the above-described formula (7), polymerization (addition polymerization) is performed.

When one pair of addable substituted groups is combination of glycidyl ether groups with themselves, as shown by the above-described formula (8), ring-opening addition is performed based on ring opening of an epoxy group.

When one pair of addable substituted groups is combination of a thiol group and an alkenyl group (to be specific, a vinyl group), as shown by the above-described formula (9), a thiol-ene reaction (addition) is performed.

To be specific, the first polysiloxane is represented by the following formula (10).

Formula (10):

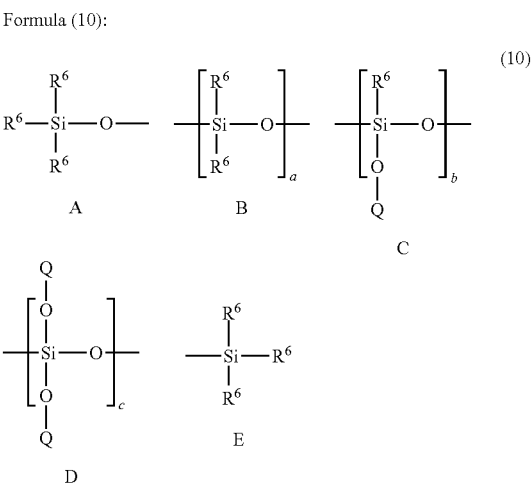

(10)

(where, in formula, $R^6$ represents a monovalent hydrocarbon group selected from a saturated hydrocarbon group and an aromatic hydrocarbon group; a condensable substituted group; and/or an addable substituted group. $SiR^6$ may represent an addable substituted group. A to E represent a constituent unit, A and E represent an end unit, and B to D represent a repeating unit. Q represents a constituent unit of B to E. "a"+"b"+"c" is an integer of 1 or more. Of a plurality of $R^6$s, at least one pair of $R^6$s represents a condensable substituted group, and at least one $R^6$ or at least one $SiR^6$ represents an addable substituted group.)

In formula (10), of the monovalent hydrocarbon groups represented by $R^6$, examples of the monovalent saturated hydrocarbon group include an alkyl group and a cycloalkyl group. Examples of the alkyl group and the cycloalkyl group include the same alkyl group and cycloalkyl group as those illustrated in the above-described $R^1$, respectively.

In formula (10), of the monovalent hydrocarbon groups represented by $R^6$, an example of the monovalent aromatic hydrocarbon group includes an aryl group having 6 or more and 10 or less carbon atoms such as a phenyl group and a naphthyl group.

As the monovalent hydrocarbon group, preferably, methyl and phenyl are used.

"a" is, for example, an integer of 0 or more, preferably an integer of 1 or more, or more preferably an integer of 2 or more. "a" is also, for example, an integer of 100000 or less or preferably an integer of 10000 or less.

"b" is, for example, an integer of 0 or more and 100000 or less, or preferably an integer of 0 or more and 10000 or less.

"c" is, for example, an integer of 0 or more and 100000 or less, or preferably an integer of 0 or more and 10000 or less.

"a"+"b"+"c" is preferably an integer of 1 or more and 100000 or less, or more preferably an integer of 1 or more and 10000 or less. That is, of "a" to "c", at least one is an integer of 1 or more.

Examples of the condensable substituted group represented by $R^6$ and the addable substituted group represented by $R^6$ or $SiR^6$ include the above-described condensable substituted group and addable substituted group, respectively.

The first polysiloxane is, for example, prepared by allowing a first silicon compound containing both at least one condensable substituted group and at least one addable substituted group, and a second silicon compound containing at least one condensable substituted group to be partially subjected to condensation (ref: formula (16) to be described later).

The first silicon compound is, for example, represented by the following formula (11).

Formula (11)

$$R^7SiB_nX^1_{3-n} \tag{11}$$

(where, in formula, $R^7$ or $SiR^7$ represents an addable substituted group; B represents a monovalent hydrocarbon group selected from a saturated hydrocarbon group and an aromatic hydrocarbon group; and $X^1$ represents a condensable substituted group. "n" represents 0 or 1.)

As the addable substituted group represented by $R^7$ or $SiR^7$, for example, the above-described addable substituted group is used; preferably, one of the substituted groups constituting one pair of addable substituted groups is used; more preferably, an ethylenicaly unsaturated group-containing group, a (meth)acryloyl group-containing group, and an epoxy group-containing group are used; further more preferably, an ethylenically unsaturated group-containing group is used; particularly preferably, an alkenyl group is used; or most preferably, a vinyl group is used.

As the condensable substituted group represented by $X^1$, for example, the above-described condensable substituted group is used; preferably, one of the substituted groups constituting one pair of condensable substituted groups is used; more preferably, a hydroxyl group, an alkoxy group, an acyloxy group, an amino group, an alkylamino group, an alkenyloxy group, and a halogen atom are used; or further more preferably, an alkoxy group is used.

As the alkoxy group represented by $X^1$, for example, in view of reactivity, preferably, an alkoxy group containing an alkyl group having 1 or more and 10 or less carbon atoms is used, or more preferably, an alkoxy group containing an alkyl group having 1 or more and 6 or less carbon atoms is used. To be specific, a methoxy group is used.

The monovalent hydrocarbon group represented by B is the same monovalent hydrocarbon group as that illustrated by $R^6$ in formula (10).

When "n" is 0, the first silicon compound is represented by the following formula (12) and is defined as a trifunctional silicon compound containing three condensable substituted groups.

Formula (12)

$$R^7SiX^1_3 \tag{12}$$

(where, in formula, $R^7$ or $SiR^7$ represents an addable substituted group and $X^1$ represents a condensable substituted group.)

Examples of the trifunctional silicon compound include a vinyltrimethoxysilane, a vinyltriethoxysilane, an allyltrimethoxysilane, a propenyltrimethoxysilane, a norbornenyltrimethoxysilane, an octenyltrimethoxysilane, a 3-acryloxypropyltrimethoxysilane, a 3-methacryloxypropyltriethoxysilane, a 3-methacryloxypropyltrimethoxysilane, a 3-glycidoxypropyltriethoxysilane, a 3-glycidoxypropyltrimethoxysilane, and a 2-(3,4-epoxycyclohexyl)ethyltrimethoxysilane.

These trifunctional silicon compounds can be used alone or in combination of two or more.

As the trifunctional silicon compound, preferably, a vinyltrimethoxysilane in which $R^7$ is a vinyl group and all of the $X^1$s are methoxy groups in the above-described formula (12) is used.

On the other hand, in the above-described formula (11), when "n" is 1, the first silicon compound is represented by the following formula (13) and is defined as a bifunctional silicon compound containing two condensable substituted groups.

Formula (13)

$$R^7SiBX^1_2 \tag{13}$$

(where, in formula, $R^7$ or $SiR^7$ represents an addable substituted group; B represents a monovalent hydrocarbon group selected from a saturated hydrocarbon group and an aromatic hydrocarbon group; and $X^1$ represents a condensable substituted group.)

$R^7$, $SiR^7$, B, and $X^1$ are the same as those described above.

Examples of the bifunctional silicon compound include a vinyldimethoxymethylsilane, a vinyldiethoxymethylsilane, an allyldimethoxymethylsilane, a propenyldimethoxymethylsilane, a norbornenyldimethoxymethylsilane, an octenyldimethoxymethylsilane, an octenyldiethoxymethylsilane, a 3-acryloxypropyldimethoxymethylsilane, a 3-methacryloxypropyldimethoxymethylsilane, a 3-methacryloxypropyldimethoxymethylsilane, a 3-glycidoxypropyldiethoxymethylsilane, a 3-glycidoxypropyldimethoxymethylsilane, and a 2-(3,4-epoxycyclohexyl)ethyldimethoxymethylsilane.

These bifunctional silicon compounds can be used alone or in combination of two or more.

As the bifunctional silicon compound, preferably, a vinyldimethoxymethylsilane in which $R^7$ is a vinyl group, B is a methyl group, and all of the $X^1$s are methoxy groups in the above-described formula (13) is used.

A commercially available product can be used as the first silicon compound and a first silicon compound synthesized in accordance with a known method can be also used.

These first silicon compounds can be used alone or in combination of two or more.

To be specific, a trifunctional silicon compound is used alone, a bifunctional silicon compound is used alone, or a trifunctional silicon compound and a bifunctional silicon compound are used in combination. Preferably, a trifunctional silicon compound is used alone, and a trifunctional silicon compound and a bifunctional silicon compound are used in combination.

An example of the second silicon compound includes a polysiloxane containing at least two condensable substituted groups, to be specific, containing a condensable substituted group bonded to a silicon atom at the end of the main chain and/or a condensable substituted group bonded to a silicon atom in a side chain that branches off from the main chain.

Preferably, the second silicon compound contains a condensable substituted group bonded to the silicon atoms at both ends of the main chain (a bifunctional silicon compound).

The second silicon compound is a dual-end type polysiloxane (a bifunctional polysiloxane) represented by the following formula (14).

Formula (14):

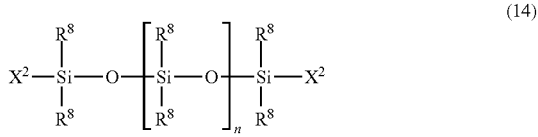

(where, in formula, $R^8$ represents a monovalent hydrocarbon group selected from a saturated hydrocarbon group and an aromatic hydrocarbon group; $X^2$ represents a condensable substituted group; and "n" represents an integer of 1 or more.)

In formula (14), an example of the monovalent hydrocarbon group represented by $R^8$ includes the monovalent hydrocarbon group illustrated by $R^6$ in the above-described formula (10). Preferably, methyl and phenyl are used.

In formula (14), an example of the condensable substituted group represented by $X^2$ includes the condensable substituted group illustrated by $R^6$ in the above-described formula (10). Preferably, a hydroxyl group and a hydrogen atom are used, or more preferably, a hydroxyl group is used.

When the condensable substituted group is a hydroxyl group, the dual-end type polysiloxane is defined as a polysiloxane containing silanol groups at both ends (a silicone oil containing silanol groups at both ends) represented by the following formula (15).

Formula (15):

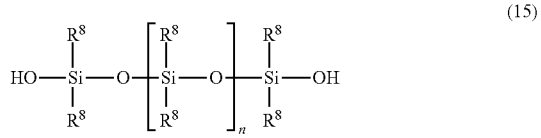

(where, in formula, $R^8$ represents a monovalent hydrocarbon group selected from a saturated hydrocarbon group and an aromatic hydrocarbon group. "n" represents an integer of 1 or more.)

$R^8$ is the same as that described above.

In the above-described formulas (14) and (15), "n" is, in view of stability and/or handling ability, preferably an integer of 1 or more and 10000 or less, or more preferably an integer of 1 or more and 1000 or less.

To be specific, examples of the dual-end type polysiloxane include a polydimethylsiloxane containing silanol groups at both ends, a polymethylphenylsiloxane containing silanol groups at both ends, and a polydiphenylsiloxane containing silanol groups at both ends.

A commercially available product can be used as the second silicon compound and a second silicon compound synthesized in accordance with a known method can be also used.

The number average molecular weight of the second silicon compound is, in view of stability and/or handling ability, for example, 100 or more, or preferably 200 or more, and is, for example, 1000000 or less, or preferably 100000 or less. The number average molecular weight is calculated by conversion based on standard polystyrene with a gel permeation chromatography. The number average molecular weight of materials, other than the second silicon compound, is also calculated in the same manner as described above.

In order to allow the first silicon compound and the second silicon compound to be partially subjected to condensation, a condensation material made of those is blended with a condensation catalyst.

The mixing ratio of the second silicon compound with respect to 100 parts by mass of the total amount of the first silicon compound and the second silicon compound (that is, the total amount of the condensation material) is, for example, 1 part by mass or more, preferably 50 parts by mass or more, or more preferably 80 parts by mass or more, and is, for example, 99.99 parts by mass or less, preferably 99.9 parts by mass or less, or more preferably 99.5 parts by mass or less.

The molar ratio $(X^2/X^1)$ of the condensable substituted group ($X^2$ in the above-described formula (14), to be specific, a hydroxyl group) in the second silicon compound to the condensable substituted group ($X^1$ in the above-described formula (11), to be specific, an alkoxy group) in the first silicon compound is, for example, 20/1 or less, or preferably 10/1 or less, and is, for example, 1/5 or more, preferably 1/2 or more, or most preferably substantially 1/1.

When the molar ratio is above the above-described upper limit, in a case where the first polysiloxane is obtained by allowing the first and the second silicon compounds to be partially subjected to condensation and thereafter, the first and the second polysiloxanes are completely subjected to condensation, a silicone semi-cured material having an appropriate toughness may not be obtained. On the other hand, when the molar ratio is below the above-described lower limit, the mixing proportion of the first silicon compound is excessively large, so that the heat resistance of a silicone cured material to be obtained may be reduced.

When the molar ratio is within the above-described range (preferably, substantially 1/1), the condensable substituted group (to be specific, an alkoxy group) in the first silicon compound and the condensable substituted group (to be specific, a hydroxyl group) in the second silicon compound can be completely subjected to condensation neither too much nor too little.

When the trifunctional silicon compound and the bifunctional silicon compound are used in combination, the ratio (the number of parts by mass of the bifunctional silicon compound/the number of parts by mass of the trifunctional silicon compound) of the bifunctional silicon compound to the trifunctional silicon compound, based on mass, is, for example, 70/30 or less, or preferably 50/50 or less, and is, for example, 1/99 or more, or preferably 5/95 or more. When the trifunctional silicon compound and the bifunctional silicon compound are used in combination, the molar ratio $(X^2/X^1)$ of the condensable substituted group ($X^2$ in the above-described formula (14), to be specific, a hydroxyl group) in the second silicon compound to the condensable substituted group ($X^1$ in the above-described formula (12), to be specific, an alkoxy group) in the trifunctional silicon compound is, for example, 20/1 or less, preferably 10/1 or less, and is, for example, 1/5 or more, preferably 1/2 or more, or most preferably substantially 1/1. On the other hand, when the trifunctional silicon compound and the bifunctional silicon compound are used in combination, the molar ratio $(X^2/X^1)$ of the condensable substituted group ($X^2$ in the above-described formula (14), to be specific, a hydroxyl group) in the second silicon compound to the condensable substituted group ($X^1$ in the above-described formula (13), to be specific, an alkoxy group) in the bifunctional silicon compound is, for example, 20/1 or less, or preferably 10/1 or less, and is, for example, 1/5 or more, preferably 1/2 or more, or most preferably substantially 1/1.

The condensation catalyst is not particularly limited as long as it is a catalyst that promotes condensation of the first silicon compound with the second silicon compound. Examples of the condensation catalyst include an acid, a base, and a metal catalyst.

An example of the acid includes an inorganic acid (a Broensted acid) such as a hydrochloric acid, an acetic acid, a formic acid, and a sulfuric acid. The acid includes a Lewis acid and an example of the Lewis acid includes an organic Lewis acid such as pentafluorophenyl boron, scandium triflate, bismuth triflate, scandium trifurylimide, oxovanadium triflate, scandium trifurylmethide, and trimethylsilyl trifurylimide.

Examples of the base include an inorganic base such as potassium hydroxide, sodium hydroxide, and potassium carbonate and tetramethylammonium hydroxide. Preferably, an organic base such as tetramethylammonium hydroxide is used.

Examples of the metal catalyst include an aluminum-based catalyst, a titanium-based catalyst, a zinc-based catalyst, and a tin-based catalyst. Preferably, a tin-based catalyst is used.

Examples of the tin-based catalyst include a carboxylic acid tin salt such as di (or bis)(carboxylic acid)tin (II) containing a straight chain or branched chain carboxylic acid having 1 or more and 20 or less carbon atoms including di(2-ethylhexanoate)tin (II), dioctanoate tin (II) (dicaprylic acid tin (II)), bis(2-ethylhexanoate)tin, bis(neodecanoate)tin, and tin oleate and an organic tin compound such as dibutylbis (2,4-pentanedionate)tin, dimethyltindiversatate, dibutyltindiversatate, dibutyltindiacetate (dibutyldiacetoxytin), dibutyltindioctoate, dibutylbis(2-ethylhexylmaleate)tin, dioctyldilauryltin, dimethyldineodecanoatetin, dibutyltindioleate, dibutyltindilaulate, dioctyltindilaulate, dioctyltindiversatate, dioctyltinbis (mercaptoacetic acid isooctyl ester) salt, tetramethyl-1,3-diacetoxydistannoxane, bis(triethyltin) oxide, tetramethyl-1,3-diphenoxydistannoxane, bis (tripropyltin)oxide, bis(tributyltin)oxide, bis(tributyltin) oxide, bis(triphenyltin)oxide, poly(dibutyltin maleate), diphenyltindiacetate, dibutyltin oxide, dibutyltindimethoxide, and dibutylbis(triethoxy)tin.

As the tin-based catalyst, preferably, a carboxylic acid tin salt is used, more preferably, di(carboxylic acid)tin (II) containing a straight chain or branched chain carboxylic acid having 1 or more and 20 or less carbon atoms is used, further more preferably, di(carboxylic acid)tin (II) containing a straight chain or branched chain carboxylic acid having 4 or more and 14 or less carbon atoms is used, or particularly preferably, di(carboxylic acid)tin (II) containing a branched chain carboxylic acid having 6 or more and 10 or less carbon atoms is used.

These condensation catalysts can be used alone or in combination.

A commercially available product can be used as the condensation catalyst. A condensation catalyst synthesized in accordance with a known method can be also used.

The condensation catalyst can be, for example, solved in a solvent to be prepared as a condensation catalyst solution. The concentration of the condensation catalyst in the condensation catalyst solution is adjusted to be, for example, 1 mass % or more and 99 mass % or less.

The mixing ratio of the condensation catalyst with respect to 100 mol of the second silicon compound is, for example, 0.001 mol or more, or preferably 0.01 mol or more, and is, for example, 50 mol or less, or preferably 5 mol or less.

Next, in this method, after the blending of the first silicon compound, the second silicon compound, and the condensation catalyst, the mixture is stirred and mixed at a temperature of, for example, 0° C. or more, or preferably 10° C. or more, and of, for example, 80° C. or less, or preferably 75° C. or less for, for example, 1 minute or more, or preferably 2 hours or more, and of, for example, 24 hours or less, or preferably 10 hours or less.

By the above-described mixing, the first and the second silicon compounds are partially subjected to condensation in the presence of the condensation catalyst.

To be specific, the condensable substituted group ($X^1$ in the above-described formula (11)) in the first silicon compound and the condensable substituted group ($X^2$ in the above-described formula (14)) in the second silicon compound are partially subjected to condensation.

To be more specific, when the condensable substituted group in the first silicon compound is an alkoxy group and the condensable substituted group in the second silicon compound is a hydroxyl group, as shown by the following formula (16), they are partially subjected to condensation.

Formula (16):

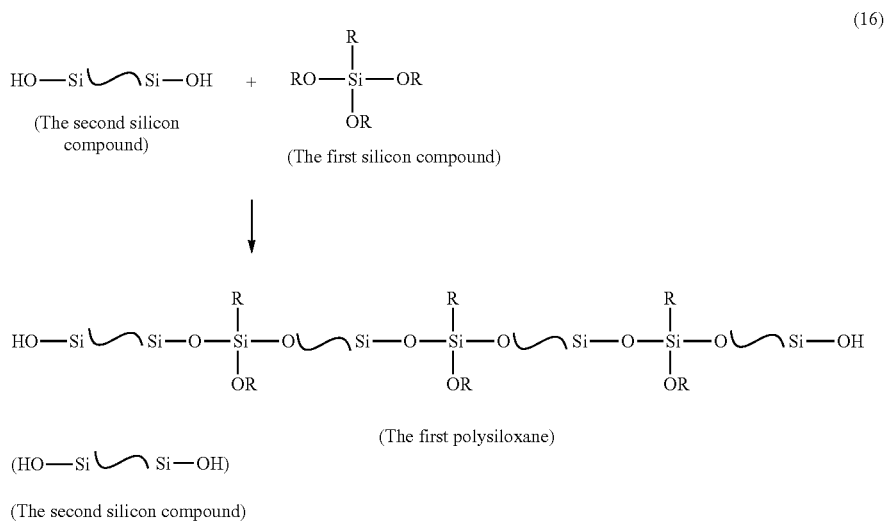

A portion in the second silicon compound is not subjected to condensation and remains to be subjected to condensation with the condensable substituted group in the first polysiloxane by next further condensation (a complete curing step).

The first polysiloxane obtained in this way is in a liquid state (in an oil state) and in an A-stage state.

An example of the second polysiloxane includes a side-chain type polysiloxane that is represented by the following formula (17) and contains at least one condensable substituted group in a side chain.

Formula (17):

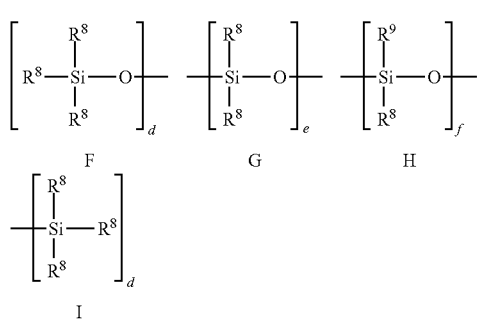

(where, in formula, F to I represent a constituent unit; F and I represent an end unit; and G and H represent a repeating unit. $R^8$ represents a monovalent hydrocarbon group selected from a saturated hydrocarbon group and an aromatic hydrocarbon group, and $R^9$ or $SiR^9$ represents an addable substituted group. "d" is 0 or 1, "e" is an integer of 0 or more, and "f" is an integer of 1 or more. All of the $R^8$s or the $R^9$s may be the same or different from each other.)

In formula (17), an example of the monovalent hydrocarbon group represented by $R^8$ includes the monovalent hydrocarbon group illustrated by $R^6$ in the above-described formula (10). Preferably, methyl and phenyl are used.

In formula (17), as the addable substituted group represented by $R^9$ or $SiR^9$, for example, the above-described addable substituted group is used; preferably, the other of the substituted groups constituting one pair of addable substituted groups is used; more preferably, a hydrosilyl group and an ethylenically unsaturated group-containing group (to be specific, a vinyl group) are used; or further more preferably, a hydrosilyl group is used.

When "d" is 1, the side-chain type polysiloxane is a straight chain polysiloxane and when "d" is 0, the side-chain type polysiloxane is a cyclic polysiloxane.

Preferably, "d" is 1.

"e" represents the number of repeating unit in the constituent unit G and is, in view of reactivity, preferably an integer of 0 or more, or more preferably an integer of 1 or more, and is preferably an integer of 100000 or less, or more preferably an integer of 10000 or less.

"f" represents the number of repeating unit in the constituent unit H and is, in view of reactivity, preferably an integer of 1 or more, or more preferably an integer of 2 or more, and is, preferably an integer of 100000 or less, or more preferably an integer of 10000 or less.

The number average molecular weight of the side-chain type polysiloxane is, for example, in view of stability and handling ability, 100 or more and 1000000 or less, or preferably 100 or more and 100000 or less.

To be specific, examples of the side-chain type polysiloxane include a methylhydrogenpolysiloxane, a methylvinylpolysiloxane, a dimethylpolysiloxane-co-methylhydrogenpolysiloxane, a dimethylpolysiloxane-co-vinylmethylpolysiloxane, an ethylhydrogenpolysiloxane, a methylhydrogenpolysiloxane-co-methylphenylpolysiloxane, a methylvinylpolysiloxane-co-methylphenylpolysiloxane, a 2,4,6,8-tetramethyl-2,4,6,8-tetravinylcyclotetrasiloxane, and a 1,3,5,7-tetramethylcyclotetrasiloxane.

These side-chain type polysiloxanes can be used alone or in combination of two or more.

Preferably, a straight chain side-chain type polysiloxane in which $R^8$ is a methyl group; $R^9$ is a hydrogen atom (that is, $SiR^9$ is a hydrosilyl group) or a vinyl group; "d" is 1; "e" is an integer of 1 or more; and "h" is an integer of 2 or more is used.

An example of the second polysiloxane includes a dual-end type polysiloxane (a polysiloxane containing addable substituted groups at both ends) that is represented by the following formula (18) and contains the addable substituted groups at both ends of a molecule.

Formula (18):

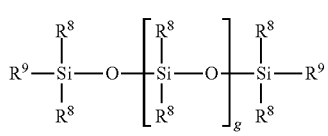

(where, in formula, $R^8$ represents a monovalent hydrocarbon group selected from a saturated hydrocarbon group and an aromatic hydrocarbon group; $R^9$ or $SiR^9$ represents an addable substituted group; and "g" represents an integer of 1 or more. All of the $R^8$s or the $R^9$s may be the same or different from each other.)

An example of the monovalent hydrocarbon group represented by $R^8$ includes the monovalent hydrocarbon group illustrated by $R^6$ in the above-described formula (10). Preferably, methyl and phenyl are used.

As the addable substituted group represented by $R^9$ or $SiR^9$, for example, the above-described addable substituted group is used; preferably, the other of the substituted groups constituting one pair of addable substituted groups is used; more preferably, a hydrosilyl group and an ethylenically unsaturated group-containing group (to be specific, a vinyl group) are used; or further more preferably, a hydrosilyl group is used.

"g" is, in view of reactivity, preferably an integer of 1 or more, or more preferably an integer of 2 or more, and is preferably an integer of 100000 or less, or more preferably an integer of 10000 or less.

The number average molecular weight of the dual-end type polysiloxane is, for example, in view of stability and handling ability, 100 or more and 1000000 or less, or preferably 100 or more and 100000 or less.

Examples of the dual-end type polysiloxane include a polydimethylsiloxane containing hydrosilyl groups at both ends, a polydimethylsiloxane containing vinyl groups at both ends, a polymethylphenylsiloxane containing hydrosilyl groups at both ends, a polymethylphenylsiloxane containing vinyl groups at both ends, a polydiphenylsiloxane containing hydrosilyl groups at both ends, a polydimethylsiloxane containing vinyl groups at both ends, and a polydiphenylsiloxane containing vinyl groups at both ends.

These dual-end type polysiloxanes can be used alone or in combination of two or more.

Preferably, a polydimethylsiloxane containing hydrosilyl groups at both ends (an organohydrogenpolysiloxane) or a polydimethylsiloxane containing vinyl groups at both ends in which all of the $R^8$s are methyl groups; $R^9$ is a hydrogen atom (that is, $SiR^9$ is a hydrosilyl group) or a vinyl group; and "g" is an integer of 2 or more and 10000 or less is used.

Of the above-described side-chain type polysiloxane and dual-end type polysiloxane, as the second polysiloxane, preferably, a dual-end type polysiloxane is used.

A commercially available product can be used as the second polysiloxane. A second polysiloxane synthesized in accordance with a known method can be also used.

In order to prepare the first silicone resin composition, the first polysiloxane and the second polysiloxane are blended. Preferably, the first polysiloxane and the second polysiloxane are blended with an addition catalyst.

The molar ratio ($R^7/SiR^9$) of the addable substituted group (one side, preferably a vinyl group ($R^7$ in formula (11)) in the first polysiloxane to the addable substituted group (the other side, preferably a hydrosilyl group ($SiR^9$ in formula (18)) in the second polysiloxane is, for example, 20/1 or less, preferably 10/1 or less, or more preferably 5/1 or less and is, for example, 1/20 or more, preferably 1/10 or more, or more preferably 1/5 or more.

The mixing ratio of the second polysiloxane with respect to 100 parts by mass of the total amount of the first polysiloxane and the second polysiloxane is, for example, 1 part by mass or more, preferably 50 parts by mass or more, or more preferably, 80 parts by mass or more, and is, for example, 99.99 parts by mass or less, preferably 99.9 parts by mass or less, or more preferably 99.5 parts by mass or less.

The addition catalyst is not particularly limited as long as it is a catalyst that promotes addition of the addable substituted group in the first polysiloxane with the addable substituted group in the first polysiloxane, to be specific, addition in the above-described formulas (6) to (9). Preferably, in view of promoting condensation by an active energy ray, a photocatalyst having active properties with respect to the active energy ray is used.

An example of the photocatalyst includes a hydrosilylation catalyst.

The hydrosilylation catalyst promotes a hydrosilylation addition reaction of a hydrosilyl group with an alkenyl group. An example of the hydrosilylation catalyst includes a transition element catalyst. To be specific, examples thereof include a platinum-based catalyst; a chromium-based catalyst (hexacarbonyl chromium ($Cr(CO)_6$ and the like); an iron-based catalyst (carbonyltriphenylphosphine iron ($Fe(CO)PPh_3$ and the like), tricarbonylbisphenylphosphine iron (trans-$Fe(CO)_3(PPh_3)_2$), polymer-substrate-(aryl-diphenylphosphine)$_5$-n[carbonyl iron] (polymer substrate-(Ar—$PPh_2)_5$-n[$Fe(CO)_n$]), pentacarbonyl iron ($Fe(CO)_5$), and the like); a cobalt-based catalyst (tricarbonyltriethylsilylcobalt ($Et_3SiCo(CO)_3$), tetracarbonyltriphenylsilylcobalt ($Ph_3SiCo(CO)_4$), octacarbonylcobalt ($Co_2(CO)_8$), and the like); a molybdenum-based catalyst (hexacarbonylmolybdenum ($Mo(CO)_6$ and the like); a palladium-based catalyst; and a rhodium-based catalyst.

As the hydrosilylation catalyst, preferably, a platinum-based catalyst is used. Examples thereof include inorganic platinum such as platinum black, platinum chloride, and chloroplatinic acid and a platinum complex such as a platinum olefin complex, a platinum carbonyl complex, a platinum cyclopentadienyl complex, and a platinum acetylacetonate complex.

Preferably, in view of reactivity, a platinum complex is used, or more preferably, a platinum cyclopentadienyl complex and a platinum acetylacetonate complex are used.

Examples of the platinum cyclopentadienyl complex include trimethyl (methylcyclopentadienyl) platinum (IV) and a trimethyl (cyclopentadienyl) platinum (IV) complex.

An example of the platinum acetylacetonate complex includes 2,4-pentanedionato platinum (II) (platinum (II) acetylacetonate).

An example of the transition element catalyst can also include one described in the following document.

Document: ISSN 1070-3632, Russian Journal of General Chemistry, 2011, Vol. 81, No. 7, pp. 1480 to 1492, "Hydrosilylation on Photoactivated Catalysts", D. A. de Vekki These addition catalysts can be used alone or in combination.

A commercially available product can be used as the addition catalyst. An addition catalyst synthesized in accordance with a known method can be also used.

The addition catalyst can be, for example, solved in a solvent to be prepared as an addition catalyst solution. The concentration of the addition catalyst in the addition catalyst solution is, for example, 1 mass % or more and 99 mass % or less. When the addition catalyst is a transition element catalyst, the concentration of the transition element is adjusted to be, for example, 0.1 mass % or more and 50 mass % or less.

The mixing ratio of the addition catalyst with respect to 100 parts by mass of the total of the first silicone resin composition is, for example, $1.0 \times 10^{-11}$ parts by mass or more, or preferably, $1.0 \times 10^{-9}$ parts by mass or more, and is, for example, 0.5 parts by mass or less, or preferably 0.1 parts by mass or less.

The addition catalyst can be also used in combination with a photoassistance agent such as a photoactive agent, a photoacid generator, and a photobase generator with an appropriate amount as required.

Each of the components containing the first polysiloxane and the second polysiloxane, respectively is blended at the above-described mixing proportion to be stirred and mixed, so that the first silicone resin composition can be obtained.

The first silicone resin composition contains a part of the second silicon compound that remains in the preparation of the first polysiloxane.

The first silicone resin composition obtained as described above is, for example, in a liquid state, or preferably, in an oil state (in a viscous liquid state). The viscosity thereof under conditions of 25° C. and one atmosphere is, for example, 100 mPa·s or more, or preferably 1000 mPa·s or more, and is, for example, 100000 mPa·s or less, or preferably 50000 mPa·s or less. The viscosity thereof is measured under the conditions of one atmosphere using a rheometer. The viscosity is measured by adjusting a temperature of the first silicone resin composition to 25° C. and using an E-type cone at a number of revolutions of 99 s$^{-1}$.

To be specific, in order to obtain the first silicone resin composition, first, the polydimethylsiloxane containing silanol groups at both ends, the vinyltrimethoxysilane, and di(2-ethylhexanoate)tin (II) (the condensation catalyst) are blended to prepare the first polysiloxane in an oil state. Thereafter, the polydimethylsiloxane containing hydrosilyl groups at both ends (the second polysiloxane) and a solution of the trimethyl (methylcyclopentadienyl) platinum (IV) or the platinum (II) acetylacetonate (the addition catalyst) are blended thereto.

Alternatively, first, the polydimethylsiloxane containing silanol groups at both ends, the vinyltrimethoxysilane, and di(2-ethylhexanoate)tin (II) (the condensation catalyst) are blended to prepare the first polysiloxane in an oil state. Thereafter, the polydimethylsiloxane containing hydrosilyl groups at both ends (the second polysiloxane) and a solution of the trimethyl (methylcyclopentadienyl) platinum (IV) complex or the platinum (II) acetylacetonate (the addition catalyst) are blended thereto.

[Second Silicone Resin Composition]

The second silicone resin composition contains a third polysiloxane containing at least one pair of condensable substituted groups that is capable of condensation by heating and at least one pair of addable substituted groups that is capable of addition by an active energy ray.

An example of the one pair of condensable substituted groups includes the same one pair of condensable substituted groups as that in the first polysiloxane in the first silicone resin composition. The one pair of condensable substituted groups is replaced with the end, the middle, and/or a side chain of the main chain in the third polysiloxane.

An example of the one pair of addable substituted groups includes the same one pair of addable substituted groups as that in the first and the second polysiloxanes in the first silicone resin composition. The one pair of addable substituted groups is replaced with the end, the middle, and/or a side chain of the main chain in the third polysiloxane.

The third polysiloxane is represented by, for example, the following formula (19).

Formula (19):

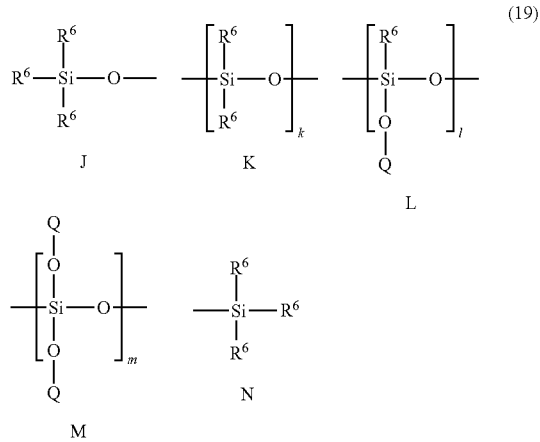

(where, in formula, $R^6$ represents a monovalent hydrocarbon group selected from a saturated hydrocarbon group and an aromatic hydrocarbon group; a condensable substituted group; and/or an addable substituted group. J to N represent a constituent unit, J and N represent an end unit, and K to M represent a repeating unit. P represents a constituent unit of K to M. "k"+"l"+"m" is an integer of 1 or more. $R^6$ contains at least one pair of condensable substituted groups and at least one pair of addable substituted groups.)

Examples of the monovalent hydrocarbon group, the condensable substituted group, and the addable substituted group represented by $R^6$ include the monovalent hydrocarbon group, the condensable substituted group, and the addable substituted group illustrated in the above-described formula (10), respectively.

"k"+"l"+"m" is, in view of stability and handling ability, preferably an integer of 1 or more and 100000 or less, or more preferably an integer of 1 or more and 10000 or less.

"k" is, for example, an integer of 0 or more, or preferably an integer of 1 or more, and is, for example, an integer of 100000 or less, or preferably an integer of 10000 or less.

"l" is, for example, an integer of 0 or more and 100000 or less, or preferably an integer of 0 or more and 10000 or less.

"m" is, for example, an integer of 0 or more and 100000 or less, or preferably an integer of 0 or more and 10000 or less.

The number average molecular weight of the third polysiloxane is, for example, 100 or more, or preferably 200 or more, and is, for example, 1000000 or less, or preferably 100000 or less.

A commercially available product can be used as the third polysiloxane. A third polysiloxane synthesized in accordance with a known method can be also used.

The content ratio of the third polysiloxane with respect to the second silicone resin composition is, for example, 60 mass % or more, or preferably 90 mass % or more, and is, for example, 100 mass % or less.

In order to obtain a silicone semi-cured material from the second silicone resin composition, under the same conditions as those of the first silicone resin composition, the third polysiloxane is heated with the condensation catalyst and thereafter, the addition catalyst is added thereto.

[Phosphor]

An example of the phosphor includes the same phosphor as that illustrated in the first embodiment. The mixing ratio of the phosphor with respect to 100 parts by mass of the active energy ray curable resin is, for example, 0.1 parts by mass or more, or preferably 0.5 parts by mass or more, and is, for example, 80 parts by mass or less, or preferably 50 parts by mass or less.

[Filler]

Furthermore, the phosphor resin composition can also contain a filler. An example of the filler includes the same filler as that illustrated in the first embodiment. The mixing ratio of the filler with respect to 100 parts by mass of the active energy ray curable resin is, for example, 0.1 parts by mass or more, or preferably 0.5 parts by mass or more, and is, for example, 70 parts by mass or less, or preferably 50 parts by mass or less.

[Fabrication of Phosphor Layer 5]

In order to fabricate the phosphor layer 5, a first silicone resin composition or a second silicone resin composition in an A-stage state and a phosphor, and a filler, which is blended as required, are blended. The obtained mixture is applied to the surface of the release sheet 13 to be thereafter heated, so that the phosphor resin composition is prepared into a sheet shape. In the preparation of the first silicone resin composition or the second silicone resin composition in an A-stage state, the phosphor and the filler, which is blended as required, can be added at any timing of blending of the components or before, during, or after the reaction.

Examples of the release sheet 13 include a polymer film such as a polyethylene film and a polyester film (PET or the like), a ceramic sheet, and a metal foil. Preferably, a polymer film is used. The surface of the release sheet 13 can be also subjected to release treatment such as fluorine treatment.

In the application of the mixture, an application method such as a casting, a spin coating, or a roll coating is used.

The heating conditions are as follows: a heating temperature of, for example, 40° C. or more, or preferably 60° C. or more, and of, for example, 180° C. or less, or preferably 150° C. or less and a heating duration of, for example, 0.1 minutes or more, and of, for example, 180 minutes or less, or preferably 60 minutes or less.

When the heating conditions are within the above-described range, a low molecular weight component (for example, a solvent including water or the like) is surely removed to terminate condensation, so that the first silicone resin composition or the second silicone resin composition can be brought into a semi-cured state (a B-stage state).

When the mixture is prepared from the first silicone resin composition, at least one pair of condensable substituted groups contained in the first polysiloxane is subjected to condensation by the above-described heating. In this way, when the condensable substituted group in the first silicon compound is an alkoxy group and the condensable substituted group in the second silicon compound is a hydroxyl group, as shown in the following formula (20), the molecular weight of the first polysiloxane is increased, so that the first silicone resin composition is gelated. That is, the first silicone resin composition is brought into a semi-cured state (a B-stage state), so that a silicone semi-cured material is obtained.

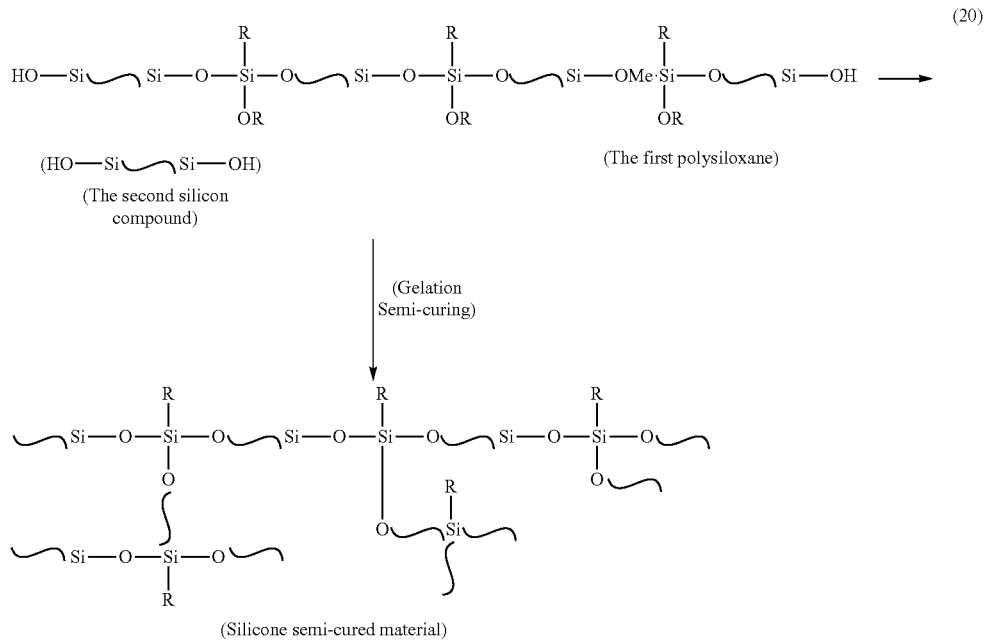

When the mixture is prepared from the second silicone resin composition, at least one pair of condensable substituted groups contained in the third polysiloxane is subjected to condensation by the above-described heating. In this way, the molecular weight of the third polysiloxane is increased, so that the second silicone resin composition is gelated. That is, the second silicone resin composition is brought into a semi-cured state (a B-stage state), so that a silicone semi-cured material is obtained.

In this way, the phosphor layer 5 is obtained from the phosphor sheet 25 formed from the phosphor resin composition containing the silicone semi-cured material and the phosphor (and the filler blended as required).

The phosphor layer 5 (the phosphor sheet 25) has a compressive elastic modulus at 23° C. of, for example, 0.01 MPa or more, or preferably 0.04 MPa or more, and of, for example, 1.0 MPa or less.

When the compressive elastic modulus of the phosphor layer 5 is not more than the above-described upper limit, sufficient flexibility can be secured. On the other hand, when the compressive elastic modulus of the phosphor layer 5 is not less than the above-described lower limit, the application of an excessive stress to the LEDs 4 is prevented and the LEDs 4 can be embedded.

The phosphor layer 5 has a light transmittance at the wavelength of 400 nm or less of, for example, 50% or more, or preferably 60% or more.

When the light transmittance of the phosphor layer 5 is not less than the above-described lower limit, the light transmission properties can be surely secured and the LED device 15 (described later) having excellent brightness can be obtained.

The thickness of the phosphor layer 5 is, for example, 10 μm or more, or preferably 100 μm or more, and is, for example, 5000 μm or less, or preferably 2000 μm or less.

In this way, as shown in FIG. 9 (a), the phosphor layer 5 is fabricated (prepared).

<Embedding Step>

As shown in FIG. 9 (a), in the embedding step, first, a plurality of the LEDs 4 are disposed on the upper surface of the phosphor layer 5. Thereafter, as shown in FIG. 9 (b), a plurality of the LEDs 4 are embedded in the phosphor layer 5 so as to expose the upper surfaces thereof.

<Encapsulating Step>

As shown by the arrow in FIG. 9 (c), an active energy ray is applied to the phosphor layer 5 in the encapsulating step.

Examples of the active energy ray include an ultraviolet ray and an electron beam. An example of the active energy ray also includes an active energy ray having a spectral distribution in a wavelength region of, for example, 180 nm or more, or preferably 200 nm or more, and of, for example, 460 nm or less, or preferably 400 nm or less.

In the application of the active energy ray, an application device is used. Examples thereof include a chemical lamp, an excimer laser, a black light, a mercury arc, a carbon arc, a low pressure mercury lamp, a medium pressure mercury lamp, a high pressure mercury lamp, an extra-high pressure mercury lamp, and a metal halide lamp. Also, an example thereof includes an application device capable of generating an active energy ray that is in the longer wavelength side or in the shorter wavelength side than in the above-described wavelength region.

The amount of irradiation is, for example, 0.001 J/cm² or more, and is, for example, 100 J/cm² or less, or preferably 10 J/cm² or less.

The irradiation duration is, for example, 10 minutes or less, or preferably 1 minute or less, and is, for example, 5 seconds or more.

The active energy ray is applied from, for example, the upper side and/or the lower side toward the phosphor layer 5. Preferably, as shown by the arrow in FIG. 9 (c), the active energy ray is applied from the lower side toward the phosphor layer 5. To be specific, the active energy ray is applied from the lower side to the phosphor layer 5 so as to transmit through the support sheet 32.

In the application of the active energy ray toward the phosphor layer 5, when the support sheet 32 is an active energy ray irradiation release sheet, the active energy ray irradiation release sheet and the irradiation conditions are selected so as not to reduce the pressure-sensitive adhesive force of the support sheet 32 by application of the active energy ray to the phosphor layer 5.

Along with the above-described application of the active energy ray, heating can be also performed.

The timing of the heating may be at the same time with the application of the active energy ray, or before or after the application of the active energy ray. Preferably, the heating is performed after the application of the active energy ray.

The heating conditions are as follows: a temperature of, for example, 50° C. or more, or preferably 100° C. or more, and of, for example, 250° C. or less, or preferably 200° C. or less, and a heating duration of, for example, 0.1 minutes or more, and of, for example, 1440 minutes or less, or preferably 180 minutes or less.

The phosphor layer 5 is completely cured by the above-described application of the active energy ray (and heating performed as required) to be brought into a C-stage state.

To be specific, when the silicone semi-cured material is prepared from the first silicone resin composition, as shown by the following formula (21), in a case where the addable substituted group in the first polysiloxane is a vinyl group and the addable substituted group in the second polysiloxane is a hydrosilyl group, they are subjected to addition (hydrosilylation addition) by application of the active energy ray (and heating performed as required).

Formula (21):

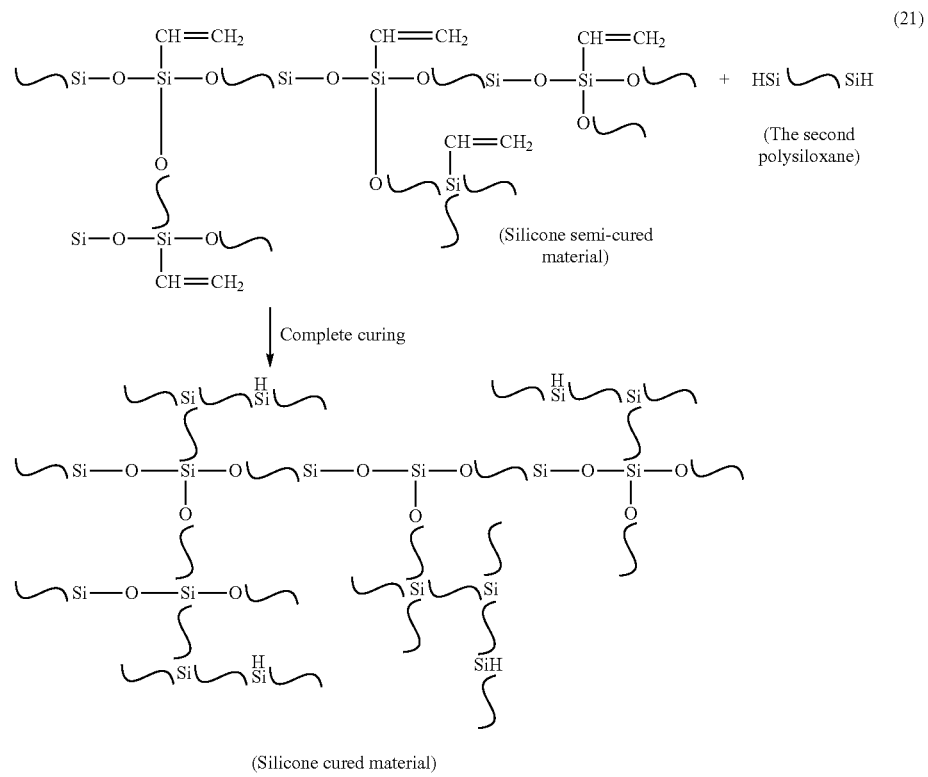

(Silicone cured material)

Alternatively, when the silicone semi-cured material is prepared from the second silicone resin composition, in a case where the addable substituted group in the third polysiloxane is a vinyl group and a hydrosilyl group, they are subjected to addition (hydrosilylation addition) by application of the active energy ray (and heating performed as required).

In this way, the silicone semi-cured material is completely cured. That is, the phosphor layer 5 is completely cured (brought into a C-stage state).

The degree of progress of the addition in the complete curing can be checked with the peak intensity derived from the addable substituted group with, for example, a solid NMR measurement.

The phosphor layer 5 that is brought into a C-stage state (completely cured) has flexibility. To be specific, the phosphor layer 5 that is brought into a C-stage state (completely cured) has a compressive elastic modulus at 23° C. of, for example, 0.5 MPa or more, or preferably 1.0 MPa or more, and of, for example, 100 MPa or less, or preferably 10 MPa or less.

When the compressive elastic modulus of the phosphor layer 5 is not more than the above-described upper limit, the flexibility can be surely secured and in the cutting step (ref: the dashed lines in FIG. 9 (d)) to be described next, for example, the phosphor layer 5 can be cut, while being confirmed from the upper side, using a relatively cheap cutting device. When the compressive elastic modulus of the phosphor layer 5 is not less than the above-described lower limit, the shape of the phosphor layer 5 after being cut can be retained.

In this way, the side surfaces and the lower surfaces of the LEDs 4 are covered with the phosphor layer 5 in tight contact with each other. That is, the LEDs 4 are encapsulated by the phosphor layer 5 in a C-stage state.

<Cutting Step>

After the encapsulating step, as shown by the dashed lines in FIG. 9 (d), in the cutting step, the flexible phosphor layer 5 around the LED 4 is cut along the thickness direction, while being confirmed from the upper side. The phosphor layer 5 is, for example, cut into a generally rectangular shape in plane view that surrounds each of the LEDs 4.

In this way, the phosphor layer-covered LEDs 10, each of which includes the LED 4 and the phosphor layer 5 that encapsulates the LED 4, are obtained in a state of being in tight contact with the support sheet 32.

<Peeling Step>

After the cutting step, as shown in FIG. 9 (e), the support sheet 32 is stretched in the plane direction and each of the phosphor layer-covered LEDs 10 is peeled from the support sheet 32.

To be specific, first, as shown by the arrows in FIG. 9 (d), the support sheet 32 is stretched outwardly in the plane direction. In this way, as shown in FIG. 9 (e), in a state where the phosphor layer-covered LEDs 10 are in tight contact with the support sheet 32, the tensile stress is concentrated in the cuts 8; thus, the cuts 8 expand; and the LEDs 4 are separated from each other, so that the gaps 19 are formed. Each of the gaps 19 is formed into a generally lattice shape in plane view so as to separate the LEDs 4.

Thereafter, each of the phosphor layer-covered LEDs 10 is peeled from the upper surface of the support sheet 32.

To be specific, as shown in FIG. 9 (e'), for example, each of the phosphor layer-covered LEDs 10 is peeled from the support sheet 32 with the pick-up device 17 that is provided with the pressing member 14 such as a needle and the absorbing member 16 such as a collet. In the pick-up device 17, the pressing member 14 presses (pushes up) the support sheet 32 corresponding to the phosphor layer-covered LED 10 that is intended to be peeled off from the lower side thereof. In this way, the phosphor layer-covered LED 10 that is intended to be peeled off is pushed up upwardly, and the pushed-up phosphor layer-covered LED 10 is peeled from the support sheet 32, while being absorbed by the absorbing member 16 such as a collet.

When the support sheet 32 is stretched in the plane direction, the gap 19 is formed between the phosphor layer-covered LED 10 that is intended to be peeled off and the phosphor layer-covered LED 10 that is adjacent thereto. Thus, it can be prevented that when the absorbing member 16 is brought into contact with the phosphor layer-covered LED 10 that is intended to be peeled off, the absorbing member 16 comes in contact with the phosphor layer-covered LED 10 that is adjacent thereto to cause a damage to the phosphor layer-covered LED 10.

When the above-described support sheet 32 is a thermal release sheet, instead of the stretching of the support sheet 32 described above or in addition to the stretching of the support sheet 32, the support sheet 32 can be also heated at, for example, 50° C. or more, or preferably 70° C. or more, and at, for example, 200° C. or less, or preferably 150° C. or less.

When the above-described support sheet 32 is an active energy ray irradiation release sheet, instead of the stretching of the support sheet 32 described above or in addition to the stretching of the support sheet 32, an active energy ray can be also applied to the support sheet 32.

The pressure-sensitive adhesive force of the support sheet 32 is reduced by those treatments, so that each of the phosphor layer-covered LEDs 10 can be further easily peeled from the support sheet 32.

In this way, as shown in FIG. 9 (e), each of the phosphor layer-covered LEDs 10 that is peeled from the support sheet 32 is obtained.

<Mounting Step>

After the peeling step, after the phosphor layer-covered LED 10 is selected in accordance with emission wavelength and luminous efficiency, as shown in FIG. 9 (f), the selected phosphor layer-covered LED 10 is mounted on the substrate 9. In this way, the LED device 15 is obtained.

Thereafter, as shown by the phantom line in FIG. 9 (f), the encapsulating protective layer 20 that encapsulates the phosphor layer-covered LED 10 is provided in the LED device 15 as required.

In the method for producing the phosphor layer-covered LED 10 in the sixth embodiment, the LEDs 4 are embedded in the phosphor layer 5 that is formed from a phosphor resin composition containing an active energy ray curable resin, which is capable of being cured by application of an active energy ray, and a phosphor. Thereafter, the active energy ray is applied to the phosphor layer 5 and the LEDs 4 are encapsulated by the phosphor layer 5. Thus, a damage to the support sheet 32 is suppressed and the LEDs 4 are encapsulated, so that the phosphor is capable of being uniformly dispersed around the LEDs 4.

That is, the phosphor layer 5 is cured by application of the active energy ray thereto without heating the phosphor layer 5 or by reducing the heating thereof, so that the LEDs 4 can be encapsulated. Thus, the support sheet 32 that supports the phosphor layer 5 is not required to have heat resistance, that is, the support sheet 32 having low heat resistance can be used.

Additionally, when the phosphor layer 5 is completely cured, the irradiation duration for applying an active energy ray can be set to be short, compared to a case where the phosphor layer 5 is completely cured by heating only.

Also, by cutting the phosphor layer 5 corresponding to each of the LEDs 4, while being confirmed from the upper side, the phosphor layer-covered LEDs 10, each of which includes the LED 4 and the phosphor layer 5 that embeds the LED 4, are obtained. Thereafter, each of the phosphor layer-covered LEDs 10 is peeled from the support sheet 32. Thus, the phosphor layer 5 supported by the support sheet 32 in which a damage is suppressed is cut with excellent dimension stability, so that the phosphor layer-covered LED 10 having excellent dimension stability can be obtained.

When the phosphor layer 5 is cut while being supported by the support sheet 32 in the cutting step and thereafter, the support sheet 32 is heated in the peeling step, the support sheet 32 that supports the phosphor layer 5 in the cutting step and completes its role is heated and then, each of the phosphor layer-covered LEDs 10 is peeled off. In this way, the phosphor layer-covered LED 10 having excellent dimension stability can be efficiently obtained.

Consequently, the phosphor layer-covered LED 10 has excellent dimension stability.

The LED device 15 includes the phosphor layer-covered LED 10 having excellent dimension stability, so that it has excellent reliability and thus, its luminous efficiency is improved.

Modified Example

In the above-descried sixth embodiment, the support sheet 32 is formed of one layer. Alternatively, for example, though not shown, the support sheet 32 can be also formed of two layers of a hard support board that is incapable of stretching in the plane direction and a pressure-sensitive adhesive layer that is laminated on the support board.

Examples of a hard material for forming the support board include an oxide such as a silicon oxide (silica or the like) and a metal such as stainless steel. The thickness of the support board is, for example, 0.1 mm or more, or preferably 0.3 mm or more, and is, for example, 5 mm or less, or preferably 2 mm or less.

The pressure-sensitive adhesive layer is formed on the entire upper surface of the support board. An example of a pressure-sensitive adhesive material for forming the pressure-sensitive adhesive layer includes a pressure-sensitive adhesive such as an acrylic pressure-sensitive adhesive. The thickness of the pressure-sensitive adhesive layer is, for example, 0.1 mm or more, or preferably 0.2 mm or more, and is, for example, 1 mm or less, or preferably 0.5 mm or less.

Preferably, as shown by the upper side view in FIG. 9 (*a*), the support sheet 32 that is capable of stretching in the plane direction is formed of one layer.

According to this, in the peeling step shown in FIG. 9 (*e*), the support sheet 32 is stretched in the plane direction and each of the phosphor layer-covered LEDs 10 is peeled from the support sheet 32. Thus, as shown in FIG. 9 (*e'*), the phosphor layer-covered LED 10 can be easily and surely peeled from the support sheet 32 using the above-described pick-up device 17.

A hard support board is not provided in the support sheet 32, so that as referred in FIG. 9 (*e'*), the support sheet 32 and the corresponding phosphor layer-covered LED 10 can be pushed up from the lower side by the pressing member 14 in the pick-up device 17.

Additionally, a hard support board is not required to be laminated on the pressure-sensitive adhesive layer, so that the production process can be simplified.

Seventh Embodiment

In the views in the seventh embodiment, the same reference numerals are provided for members and steps corresponding to each of those in the first to sixth embodiments, and their detailed description is omitted.

The method for producing the phosphor layer-covered LED 10 in the seventh embodiment includes a step (ref: FIG. 10 (*a*)) of preparing the support sheet 1, an attaching step (ref: FIG. 10 (*b*), one example of the disposing step) of attaching the phosphor layer 5 to the support board 2 via the pressure-sensitive adhesive layer 3, an embedding step (ref: FIG. 10 (*c*)), an encapsulating step (ref: FIG. 10 (*d*)), a cutting step (ref: the dashed lines in FIG. 10 (*d*)), and a peeling step (ref: FIG. 10 (*e*)). The method for producing the LED device 15 in the seventh embodiment includes a mounting step (ref: FIG. 10 (*f*)).

In the following, the steps of the seventh embodiment are described in detail.

<Step of Preparing Support Sheet 1>

As shown in FIG. 10 (*a*), the support sheet 1 includes the support board 2 and the pressure-sensitive adhesive layer 3 that is laminated on the upper surface of the support board 2.

An example of the support board 2 includes the same support board 2 as that in the first embodiment.

The pressure-sensitive adhesive layer 3 is formed from a material in which the pressure-sensitive adhesive force is capable of being reduced by application of an active energy ray as an active energy ray irradiation release layer (sheet). To be specific, an example of the pressure-sensitive adhesive layer 3 includes a pressure-sensitive adhesive layer such as an acrylic pressure-sensitive adhesive layer. Also, the pressure-sensitive adhesive layer 3 can be formed of an active energy ray irradiation release layer (sheet) described in Japanese Unexamined Patent Publication No. 2001-308116.

The thickness of the pressure-sensitive adhesive layer 3 is, for example, 0.01 mm or more, or preferably 0.02 mm or more, and is, for example, 1 mm or less, or preferably 0.5 mm or less.

In order to prepare the support sheet 1, for example, the support board 2 is attached to the pressure-sensitive adhesive layer 3. Also, the pressure-sensitive adhesive layer 3 can be directly laminated on the support board 2 by an application method or the like in which first, the support board 2 is prepared and next, a varnish is applied to the support board 2.

The thickness of the support sheet 1 is, for example, 0.2 mm or more, or preferably 0.5 mm or more, and is, for example, 6 mm or less, or preferably 2.5 mm or less.

<Attaching Step>

The attaching step is performed after the step of preparing the support sheet 1.

As shown in FIG. 10 (*b*), in the attaching step, for example, the phosphor sheet 25 is attached to the upper surface of the pressure-sensitive adhesive layer 3. In this way, the phosphor layer 5 is formed in a state of being attached to the pressure-sensitive adhesive layer 3.

In FIG. 10 (*b*), the phosphor layer 5 is formed from the same phosphor resin composition as that in the first embodiment into a sheet shape extending in the plane direction.

<Embedding Step>

The embedding step is performed after the attaching step.

As shown in FIG. 10 (*c*), in order to encapsulate the LEDs 4 by the phosphor layer 5, first, as shown by the phantom lines in FIG. 10 (*b*), a plurality of the LEDs 4 are prepared.

Next, as shown in FIG. 10 (*c*), the release sheet 13 is disposed on the LEDs 4 and next, the LEDs 4 are embedded in the phosphor layer 5.

Thereafter, as shown by the phantom line in FIG. 10 (*c*), the release sheet 13 is peeled from the upper surface of the phosphor layer 5.

<Encapsulating Step>

The encapsulating step is performed after the embedding step.

Thereafter, as shown in FIG. 10 (*d*), the phosphor layer 5 is cured. When the curable resin is a thermosetting resin, the phosphor layer 5 is thermally cured. To be specific, the phosphor layer 5 is heated at, for example, 80° C. or more, or preferably 100° C. or more, and at, for example, 200° C. or less, or preferably 180° C. or less.

When the thermosetting resin contains a two-step curable type silicone resin and when the phosphor layer 5 that embeds the LEDs 4 is in a B-stage state, the phosphor layer 5 is completely cured to be brought into a C-stage state by the above-described heating.

When the thermosetting resin contains a one-step curable type silicone resin, the phosphor layer 5 is completely cured to be brought into a C-stage state by the above-described heating.

When the curable resin is an active energy ray curable resin, an active energy ray is applied to the phosphor layer 5 from the upper side. When the active energy ray is applied from the upper side, the curable resin and the irradiation conditions are selected so as not to reduce the pressure-sensitive adhesive force of the pressure-sensitive adhesive layer 3 by the application of the active energy ray to the phosphor layer 5.

The cured (completely cured) phosphor layer 5 has flexibility. The phosphor layer 5 has a light transmittance at the wavelength of 400 nm or less of, for example, 50% or more, or preferably 60% or more. When the light transmittance of the phosphor layer 5 is not less than the above-described lower limit, the transmission properties of the active energy ray in the phosphor layer 5 are secured, so that the active energy ray can transmit through the phosphor layer 5 to reach the pressure-sensitive adhesive layer 3. At the same time, the LED device 15 (described later) having excellent brightness can be obtained.

In this way, the side surfaces and the lower surfaces of the LEDs 4 are covered with the phosphor layer 5 in tight contact with each other. That is, the LEDs 4 are encapsulated by the phosphor layer 5 in a C-stage state.

<Cutting Step>

After the encapsulating step, as shown by the dashed lines in FIG. 10 (d), in the cutting step, the phosphor layer 5 around the LED 4 is cut along the thickness direction. As shown by the dash-dot lines in FIG. 2, for example, the phosphor layer 5 is cut into a generally rectangular shape in plane view that surrounds each of the LEDs 4, while being confirmed from the upper side.

By the cutting step, the phosphor layer-covered LEDs 10, each of which includes the LED 4 and the phosphor layer 5 that embeds the LED 4, are obtained in a state of being in tight contact with the support sheet 1. That is, the phosphor layers 5 are singulated corresponding to each of the LEDs 4.

<Peeling Step>

After the cutting step, in FIG. 10 (e), in the peeling step, each of the phosphor layer-covered LEDs 10 is peeled from the upper surface of the pressure-sensitive adhesive layer 3.

In order to peel each of the phosphor layer-covered LEDs 10 from the upper surface of the pressure-sensitive adhesive layer 3, first, as shown by a down arrow in FIG. 10 (e), an active energy ray is applied from the upper side to the pressure-sensitive adhesive layer 3 via the phosphor layer 5.

Examples of the active energy ray include an ultraviolet ray and an electron beam. An example of the active energy ray also includes an active energy ray having a spectral distribution in a wavelength region of, for example, 180 nm or more, or preferably 200 nm or more, and of, for example, 460 nm or less, or preferably 400 nm or less.

In the application of the active energy ray, an application device is used. Examples thereof include a chemical lamp, an excimer laser, a black light, a mercury arc, a carbon arc, a low pressure mercury lamp, a medium pressure mercury lamp, a high pressure mercury lamp, an extra-high pressure mercury lamp, and a metal halide lamp. Also, an example thereof includes an application device capable of generating an active energy ray that is in the longer wavelength side or in the shorter wavelength side than in the above-described wavelength region.

The amount of irradiation is, for example, 0.001 J/cm² or more, or preferably 0.01 J/cm² or more, and is, for example, 100 J/cm² or less, or preferably 10 J/cm² or less. When the amount of irradiation is not less than the above-described lower limit, the pressure-sensitive adhesive force of the pressure-sensitive adhesive layer 3 can be surely and efficiently reduced. On the other hand, when the amount of irradiation is not more than the above-described upper limit, an increase in cost can be suppressed and a damage to a device can be effectively prevented.

The irradiation duration is, for example, 10 minutes or less, or preferably 1 minute or less, and is, for example, 5 seconds or more. When the upper limit of the irradiation duration is not more than the above-described upper limit, a duration required for the peeling step can be shortened.

All or a part of the active energy ray transmits through the phosphor layer 5 from the upper side to be applied to the pressure-sensitive adhesive layer 3.

By the application of the active energy ray, the pressure-sensitive adhesive force of the pressure-sensitive adhesive layer 3 is reduced.

In this state, as shown by an up arrow in FIG. 10 (e), each of the phosphor layer-covered LEDs 10 is peeled from the pressure-sensitive adhesive layer 3. In order to peel each of the phosphor layer-covered LEDs 10 from the pressure-sensitive adhesive layer 3, though not shown, a pick-up device that is provided with an absorbing member such as a collet can be used as required. To be specific, each of the phosphor layer-covered LEDs 10 can be peeled from the pressure-sensitive adhesive layer 3, while being absorbed by an absorbing member.

In the peeling of each of the phosphor layer-covered LEDs 10 from the pressure-sensitive adhesive layer 3, the lower surface of the phosphor layer 5 is peeled from the upper surface of the pressure-sensitive adhesive layer 3.

In this way, each of the phosphor layer-covered LEDs 10 that is peeled from the pressure-sensitive adhesive layer 3 is obtained.

[Mounting Step]

After the peeling step, after the phosphor layer-covered LED 10 is selected in accordance with emission wavelength and luminous efficiency, as shown in FIG. 10 (f), the selected phosphor layer-covered LED 10 is mounted on the substrate 9. In this way, the LED device 15 is obtained.

In this way, the LED device 15 including the substrate 9 and the phosphor layer-covered LED 10 that is mounted on the substrate 9 is obtained.

Thereafter, as shown by the phantom line in FIG. 10 (f), the encapsulating protective layer 20 that encapsulates the phosphor layer-covered LED 10 is provided in the LED device 15 as required.

According to the seventh embodiment, in the peeling step, an active energy ray is applied from the upper side to the pressure-sensitive adhesive layer 3 via the phosphor layer 5. Then, the active energy ray transmits through the phosphor layer 5 to be applied to the pressure-sensitive adhesive layer 3. Thus, it is not required that the support board 2 is formed from a substrate material that allows an active energy ray to transmit therethrough and the active energy ray transmits through the support board 2. As a result, as the support board 2, not only an active energy ray transmissive support board is used, but also an active energy ray blocking support board can be selected.

After the cutting step, the peeling step is performed. That is, in the cutting step, the phosphor layer 5 can be cut, while the phosphor layer 5 is supported by the support sheet 1 including the hard support board 2. Thus, the phosphor layer-covered LED 10 having excellent dimension stability can be obtained.

Furthermore, in this method, an active energy ray is applied to the pressure-sensitive adhesive layer 3 in the peeling step, so that deformation of the support sheet 1 caused by heating is prevented and the dimension stability can be further improved, compared to a method in which the pressure-sensitive adhesive force of the pressure-sensitive adhesive layer 3 is reduced by heating of the pressure-sensitive adhesive layer 3.

Consequently, the phosphor layer-covered LED 10 has excellent dimension stability.

The LED device 15 includes the phosphor layer-covered LED 10 having excellent dimension stability, so that it has excellent reliability and thus, its luminous efficiency is improved.

Modified Example

In the peeling step in the embodiment in FIG. 10 (*e*), an active energy ray is applied from the upper side only to the pressure-sensitive adhesive layer 3. However, in the seventh embodiment, an active energy ray may be applied at least from the upper side. For example, when the support board 2 is formed from an active energy ray transmissive material or an active energy ray semi-transmissive material, an active energy ray can be also applied from both of the upper side and the lower side to the pressure-sensitive adhesive layer 3. In such a case, of the active energy ray applied from the lower side of the support sheet 1, all or a part of the active energy ray transmits through the support board 2 to reach the pressure-sensitive adhesive layer 3.

According to the modified example, in the peeling step, a duration required for reducing the pressure-sensitive adhesive force of the pressure-sensitive adhesive layer 3, that is, the irradiation duration of an active energy ray can be further shortened and the production efficiency of the phosphor layer-covered LED 10 can be improved.

Eighth Embodiment

In the first embodiment, as shown in FIG. 1 (*b*), the phosphor layer 5 is formed of the phosphor sheet 25 in which a phosphor is uniformly (uniformly at least in the plane direction) dispersed. Alternatively, for example, as shown in FIGS. 11 (*b*) and 12, an embedding-reflector sheet 24 that includes embedding portions 33 containing a phosphor as cover portions and a reflector portion 34 surrounding the embedding portions 33 can be also illustrated as an encapsulating sheet.

As shown in FIG. 12, a plurality of the embedding portions 33 are provided at spaced intervals to each other as portions that embed a plurality of the LEDs 4 in the embedding-reflector sheet 24. Each of the embedding portions 33 is formed into a generally circular shape in plane view. To be specific, as shown in FIG. 11 (*b*), each of the embedding portions 33 is formed into a generally conical trapezoidal shape in which its width is gradually reduced toward the upper side.

The diameter (the maximum length) of the upper end portion of each of the embedding portions 33 is larger than the maximum length in the plane direction of each of the LEDs 4. To be specific, the diameter (the maximum length) of the upper end portion thereof with respect to the maximum length in the plane direction of each of the LEDs 4 is, for example, 200% or more, preferably 300% or more, or more preferably 500% or more, and is, for example, 3000% or less. To be more specific, the diameter (the maximum length) of the upper end portion of each of the embedding portions 33 is, for example, 5 mm or more, or preferably 7 mm or more, and is, for example, 300 mm or less, or preferably 200 mm or less.

The diameter (the maximum length) of the lower end portion of each of the embedding portions 33 is larger than the diameter (the maximum length) of the upper end portion thereof. To be specific, the diameter (the maximum length) of the lower end portion thereof is, for example, 7 mm or more, or preferably 10 mm or more, and is, for example, 400 mm or less, or preferably 250 mm or less.

Furthermore, the gap between the embedding portions 33 (the minimum gap, to be specific, the gap between the lower end portions of the embedding portions 33) is, for example, 20 mm or more, or preferably 50 mm or more, and is, for example, 1000 mm or less, or preferably 200 mm or less.

The embedding portions 33 are formed from the above-described phosphor resin composition. When the phosphor resin composition contains a thermosetting resin, the embedding portions 33 are formed in a B-stage state.

As shown in FIG. 12, the reflector portion 34 is continuous at the circumference end portion of the embedding-reflector sheet 24 and is disposed between the embedding portions 33. The reflector portion 34 is formed into a generally lattice shape in plane view surrounding each of the embedding portions 33.

The reflector portion 34 is formed from a reflecting resin composition containing a light reflecting component to be described later.

Next, a method for producing the embedding-reflector sheet 24 is described with reference to FIGS. 12 and 13 (*a*)-(*e*).

In this method, first, as shown in FIG. 13 (*a*), a pressing device 35 is prepared.

The pressing device 35 is provided with a support board 36 and a die 37 that is disposed in opposed relation to the upper side of the support board 36.

The support board 36 is, for example, formed of a metal such as stainless steel into a generally rectangular flat plate shape.

The die 37 integrally includes a flat plate portion 38 and extruded portions 39 that are formed to be extruded downwardly from the flat plate portion 38.

The flat plate portion 38 is formed into the same shape as that of the support board 36 in plane view.

In the die 37, a plurality of the extruded portions 39 are disposed at spaced intervals to each other in the plane direction so as to correspond to the embedding portions 33. That is, each of the extruded portions 39 is formed into a generally conical trapezoidal shape in which its width is gradually reduced from the lower surface of the flat plate portion 38 toward the lower side. To be specific, each of the extruded portions 39 is formed into a tapered shape in which its width is gradually reduced toward the lower side in front sectional view and side sectional view. That is, each of the extruded portions 39 is formed into the same shape as that of each of the embedding portions 33.

As shown in FIG. 13 (*a*), a spacer 40 is provided on the upper surface of the circumference end portion of the support board 36. The spacer 40 is, for example, formed of a metal such as stainless steel and is disposed so as to surround a plurality of the embedding portions 33 when projected in the thickness direction. The spacer 40 is disposed on the support board 36 so as to be included in the die 37, to be specific, to be overlapped with the circumference end portion of the flat plate portion 38, when projected in the thickness direction.

The thickness of the spacer 40 is set so as to be the total thickness of the thickness of a releasing sheet 49 to be described later and that of each of the extruded portions 39. To be specific, the thickness of the spacer 40 is, for example, 0.3 mm or more, or preferably 0.5 mm or more, and is, for example, 5 mm or less, or preferably 3 mm or less.

In the pressing device 35, the die 37 is configured to be replaceable with that having a different shape. To be specific, in the pressing device 35, the die 37 having the extruded portions 39 shown in FIG. 13 (*a*) is configured to be replaceable with the die 37 in a flat plate shape having no extruded portion 39 shown in FIG. 13 (*c*) to be described later.

As shown in FIG. 13 (*a*), the releasing sheet 49 is disposed at the inner side of the spacer 40 on the upper surface of the support board 36. The circumference end surfaces of the releasing sheet 49 are, on the upper surface of the support board 36, formed so as to be in contact with the inner side surfaces of the spacer 40. The thickness of the releasing sheet 49 is, for example, 10 µm or more, or preferably 30 µm or more, and is, for example, 200 µm or less, or preferably 150 µm or less.

Next, in the pressing device 35 shown in FIG. 13 (*a*), a reflector sheet 42 is disposed on the upper surface of the releasing sheet 49.

In order to dispose the reflector sheet 42 on the upper surface of the releasing sheet 49, for example, the following method is used: that is, a laminating method in which the reflector sheet 42 formed from a reflecting resin composition is laminated on the upper surface of the releasing sheet 49 or an application method in which a liquid reflecting resin composition is applied to the upper surface of the releasing sheet 49.

The reflecting resin composition contains, for example, a resin and a light reflecting component.

An example of the resin includes a thermosetting resin such as a thermosetting silicone resin, an epoxy resin, a thermosetting polyimide resin, a phenol resin, a urea resin, a melamine resin, an unsaturated polyester resin, a diallyl phthalate resin, and a thermosetting urethane resin. Preferably, a thermosetting silicone resin and an epoxy resin are used.

The light reflecting component is, for example, a white compound. To be specific, an example of the white compound includes a white pigment.

An example of the white pigment includes a white inorganic pigment. Examples of the white inorganic pigment include an oxide such as a titanium oxide, a zinc oxide, and a zirconium oxide; a carbonate such as white lead (lead carbonate) and calcium carbonate; and a clay mineral such as kaolin (kaolinite).

As the white inorganic pigment, preferably, an oxide is used, or more preferably, a titanium oxide is used.

To be specific, the titanium oxide is $TiO_2$ (titanium oxide (IV), titanium dioxide).

A crystal structure of the titanium oxide is not particularly limited. Examples of the crystal structure thereof include a rutile type, a brookite type (pyromelane), and an anatase type (octahedrite). Preferably, a rutile type is used.

A crystal system of the titanium oxide is not particularly limited. Examples of the crystal system thereof include a tetragonal system and an orthorhombic system. Preferably, a tetragonal system is used.

When the crystal structure and the crystal system of the titanium oxide are the rutile type and the tetragonal system, respectively, it is possible to effectively prevent a reduction of the reflectivity with respect to light (to be specific, visible light, among all, the light around the wavelength of 450 nm) even in a case where the reflector portion 34 is exposed to a high temperature for a long time.

The light reflecting component is in the form of a particle. The shape thereof is not limited and examples of the shape thereof include a sphere shape, a plate shape, and a needle shape. The average value of the maximum length (in the case of a sphere shape, the average particle size) of the light reflecting component is, for example, 1 nm or more and 1000 nm or less. The average value of the maximum length is measured using a laser diffraction scattering particle size analyzer.

The mixing ratio of the light reflecting component with respect to 100 parts by mass of the resin is, for example, 0.5 parts by mass or more, or preferably 1.5 parts by mass or more, and is, for example, 90 parts by mass or less, or preferably 70 parts by mass or less.

The above-described light reflecting component is uniformly dispersed and mixed in the resin.

Also, the above-described filler can be further added to the reflecting resin composition. That is, the filler can be used in combination with the light reflecting component (to be specific, a white pigment).

An example of the filler includes a known filler excluding the above-described white pigment. To be specific, examples of the filler include organic microparticles such as silicone particles and inorganic microparticles such as silica, talc, alumina, aluminum nitride, and silicon nitride.

The addition ratio of the filler is adjusted so that the total amount of the filler and the light reflecting component with respect to 100 parts by mass of the resin is, for example, 10 parts by mass or more, preferably 25 parts by mass or more, or more preferably 40 parts by mass or more, and is, for example, 80 parts by mass or less, preferably 75 parts by mass or less, or more preferably 60 parts by mass or less.

In the laminating method, the reflecting resin composition is prepared in an A-stage state by blending the above-described resin and light reflecting component, and the filler, which is added as required, to be uniformly mixed.

Subsequently, in the laminating method, the reflecting resin composition in an A-stage state is applied to the surface of a release sheet that is not shown by an application method such as a casting, a spin coating, or a roll coating and thereafter, the applied product is heated to be brought into a B-stage state or C-stage state. Examples of the release sheet include a polymer film such as a polyethylene film and a polyester film (PET or the like), a ceramic sheet, and a metal foil. Preferably, a polymer film is used. The surface of the release sheet can be also subjected to release treatment such as fluorine treatment.

Alternatively, for example, the reflecting resin composition in an A-stage state is applied to the surface of a release sheet that is not shown using a screen printing or the like by the above-described application method and thereafter, the applied product is heated to form the reflector sheet 42 in a B-stage state or C-stage state.

Thereafter, the reflector sheet 42 is transferred onto the releasing sheet 49. Subsequently, the release sheet that is not shown is peeled off.

On the other hand, in the application method, the above-described reflecting resin composition in an A-stage state is applied to the upper surface of the releasing sheet 49 using a screen printing or the like and thereafter, the applied product is heated to form the reflector sheet 42 in a B-stage state.

The thickness of the reflector sheet 42 is, for example, 0.3 mm or more, or preferably 0.5 mm or more, and is, for example, 5 mm or less, or preferably 3 mm or less.

Subsequently, as shown by the arrows in FIG. 13 (a), and in FIG. 13 (b), the reflector sheet 42 is pressed by the pressing device 35.

To be specific, the die 37 is pushed down with respect to the support board 36. To be more specific, the die 37 is pushed downwardly so that the extruded portions 39 pass through the reflector sheet 42 in the thickness direction. Along with this, the circumference end portion of the flat plate portion 38 in the die 37 is brought into contact with the upper surface of the spacer 40.

In this way, as shown in FIG. 13 (b), in the reflector sheet 42, through holes 41, which pass through the reflector sheet 42 in the thickness direction and are in shapes corresponding to the extruded portions 39, are formed.

In the pushing down of the die 37, when the reflecting resin composition contains a thermosetting resin in a B-stage state, a heater (not shown) is built in the die 37 in advance and the reflector sheet 42 can be also heated by the heater. In this way, the reflecting resin composition is completely cured (is brought into a C-stage state).

The heating temperature is, for example, 80° C. or more, or preferably 100° C. or more, and is, for example, 200° C. or less, or preferably 180° C. or less.

In this way, the reflector portion 34 is formed on the releasing sheet 49.

Thereafter, as shown in FIG. 13 (c), a pressing state of the pressing device 35 is released. To be specific, the die 37 is pulled up.

Subsequently, the die 37 including the flat plate portion 38 and the extruded portions 39 is replaced with the die 37 including the flat plate portion 38 only.

Along with this, the phosphor sheet 25 is disposed on the reflector portion 34.

To be specific, the phosphor sheet 25 is disposed on the upper surface of the reflector portion 34 so as to cover the through holes 41.

When the phosphor resin composition contains a thermosetting resin, the phosphor sheet 25 in a B-stage state is disposed on the reflector portion 34. The phosphor sheet 25 in a B-stage state can retain its flat plate shape to some extent, so that it is disposed on the upper surface of the reflector portion 34 so as to cover the through holes 41 without falling into the inside of the through holes 41.

The phosphor sheet 25 is formed to be more flexible than the reflector portion 34 (to be specific, the reflector portion 34 in a C-stage state when the reflecting resin composition of the reflector sheet 42 contains a thermosetting resin). To be specific, the reflector portion 34 is formed to have non-deformable hardness by the next pressing (ref: FIG. 13 (d)), while the phosphor sheet 25 is formed to have deformable flexibility by the next pressing.

Next, as shown in FIG. 13 (d), the phosphor sheet 25 is pressed by the pressing device 35. To be specific, the die 37 made of the flat plate portion 38 is pushed down toward the support board 36. Along with this, the circumference end portion of the flat plate portion 38 is brought into contact with the upper surface of the spacer 40. The lower surface of the flat plate portion 38 is in contact with the upper surface of the reflector portion 34.

In this way, the relatively flexible phosphor sheet 25 is pressed from the upper side by the flat plate portion 38 to fill the through holes 41. On the other hand, the relatively hard reflector portion 34 is not deformed and houses the embedding portions 33 in the through holes 41 therein.

The phosphor sheet 25 can be also heated by a heater that is built in the flat plate portion 38.

In this way, the embedding portions 33 are formed in the through holes 41 in the reflector portion 34.

In this way, the embedding-reflector sheet 24 including the embedding portions 33 and the reflector portion 34 is obtained between the support board 36 and the die 37.

Thereafter, as shown in FIG. 13 (e), the die 37 is pulled up and subsequently, the embedding-reflector sheet 24 is peeled from the releasing sheet 49.

Next, using the embedding-reflector sheet 24 shown in FIG. 13 (e), a method for producing the phosphor layer-covered LED 10 and the LED device 15, which has different steps from those in the above-described embodiment, is described in detail with reference to FIGS. 11 (a)-(f).

[Disposing Step]

As shown in FIG. 11 (b), the embedding-reflector sheet 24 is disposed on the support sheet 1 so that each of the embedding portions 33 is formed into a tapered shape in which its width is gradually reduced toward the upper side.

[Embedding Step]

In the embedding step, first, as shown in FIG. 11 (b), each of a plurality of the LEDs 4 is disposed in opposed relation to each of a plurality of the embedding portions 33. To be specific, each of the LEDs 4 is disposed to be opposed to the center of each of the embedding portions 33 and each of the LEDs 4 is also disposed at spaced intervals to the inner side of the upper end portion of the reflector portion 34 in plane view.

As shown in FIG. 11 (c), thereafter, the release sheet 13 is disposed on the upper surfaces of the LEDs 4 and subsequently, the obtained laminate is pressed. In this way, each of the LEDs 4 is embedded in each of the embedding portions 33 so that the upper surface of the LED 4 is exposed.

[Encapsulating Step]

In the encapsulating step, when the phosphor resin composition contains a thermosetting resin, the phosphor layer 5 is thermally cured by heating. In this way, the embedding portions 33 are completely cured. In this way, each of the LEDs 4 is encapsulated by each of the embedding portions 33.

[Cutting Step]

As shown in FIG. 13 (d), in the cutting step, the reflector portion 34 is cut along the thickness direction. As shown by the dash-dot lines in FIG. 12, for example, the phosphor layer 5 is cut so that the reflector portion 34 is formed into a generally rectangular shape in plane view that surrounds each of the embedding portions 33. Also, the phosphor layer 5 is cut, while each of the LEDs 4 having the upper surface exposed is visually confirmed.

As shown by the dashed lines in FIG. 11 (d), by the cutting step, the phosphor layer-covered LEDs 10, each of which includes one LED 4, the embedding portion 33 that embeds the LED 4, and the reflector portion 34 that is provided around the embedding portion 33, are obtained in a state of being in tight contact with the support sheet 1. That is, each of the phosphor layer-covered LEDs 10 includes the reflector portion 34. That is, the phosphor layer-covered LED 10 is a reflector portion-including phosphor layer-covered LED 10.

[Peeling Step]

In the peeling step, as shown in FIG. 11 (e), each of the phosphor layer-covered LEDs 10 each including the reflector portion 34 is peeled from the support sheet 1.

[Mounting Step]

In the mounting step, after the phosphor layer-covered LED 10 including the reflector portion 34 is selected in accordance with emission wavelength and luminous efficiency, as shown in FIG. 11 (f), the selected phosphor layer-covered LED 10 is mounted on the substrate 9. In this way, the LED device 15 is obtained.

In this way, the LED device 15 including the substrate 9 and the phosphor layer-covered LED 10 that is mounted on the substrate 9 and includes the reflector portion 34 is obtained.

According to the eighth embodiment, the embedding-reflector sheet 24 includes the embedding portion 33 that embeds the LED 4 and the reflector portion 34 that contains a light reflecting component and is formed so as to surround the embedding portion 33, so that light emitted from the LED 4 can be reflected by the reflector portion 34. Thus, the luminous efficiency of the LED device 15 can be improved.

Modified Example

In the eighth embodiment, the embedding portion 33 is formed from a phosphor resin composition that contains a phosphor. Alternatively, for example, the embedding portion 33 can be also formed from a resin composition that does not contain a phosphor.

Ninth Embodiment

In the views in the ninth embodiment, the same reference numerals are provided for members and steps corresponding to each of those in the eighth embodiment, and their detailed description is omitted.

In the method for producing the embedding-reflector sheet 24 in the eighth embodiment, as shown in FIGS. 13 (c) and 13 (d), the embedding portions 33 are formed of the phosphor sheet 25. Alternatively, for example, as shown in FIG. 14 (c), the embedding portions 33 can be also formed by potting a varnish of a phosphor resin composition into the through holes 41 without using the phosphor sheet 25.

To be specific, first, the phosphor resin composition is prepared as a varnish. To be specific, when the phosphor resin composition contains a thermosetting resin, a varnish in an A-stage state is prepared. In this way, the phosphor resin composition in an A-stage state fills the through holes 41.

Thereafter, when the phosphor resin composition contains a thermosetting resin, the phosphor resin composition in an A-stage state is heated to be brought into a B-stage state.

In the ninth embodiment, the same function and effect as that of the eighth embodiment can be achieved.

Tenth Embodiment

In the views in the tenth embodiment, the same reference numerals are provided for members and steps corresponding to each of those in the eighth and ninth embodiments, and their detailed description is omitted.

In the eighth embodiment, as shown in FIGS. 11 (b) and 12, the upper end portion of the embedding portion 33 is formed to be larger than the LED 4 in plane view. Alternatively, for example, as shown in FIG. 15 (b), the upper end portion of the embedding portion 33 can be formed to be the same dimension as that of the LED 4.

[Embedding Step]

Each of the embedding portions 33 is, for example, formed into a generally quadrangular pyramid trapezoidal shape in which its width is gradually reduced toward the upper side.

In order to form the embedding portions 33 shown in FIG. 15 (b), each of the extruded portions 39 referred in FIGS. 13 (a)-(e) and 14 (a)-(d) is formed into a generally quadrangular pyramid trapezoidal shape in which its width is gradually reduced from the lower surface of the flat plate portion 38 toward the lower side.

Also, as shown in FIG. 15 (b), each of the LEDs 4 is disposed on the upper surface of each of embedding portions 33 so that, when projected in the thickness direction, the upper end portion of each of the embedding portions 33 is overlapped with each of the LEDs 4, to be specific, the circumference end edge of the upper end portion of each of the embedding portions 33 is set at the same position as the circumference end edge of each of the LEDs 4 in plane view.

In the tenth embodiment, the same function and effect as those of the seventh and eighth embodiments can be achieved.

Eleventh Embodiment

In the views in the eleventh embodiment, the same reference numerals are provided for members and steps corresponding to each of those in the eighth embodiment, and their detailed description is omitted.

In the eighth embodiment, as shown in FIG. 11 (b), each of the embedding portions 33 in the embedding-reflector sheet 24 is formed into a generally conical trapezoidal shape in which its width is gradually reduced toward the upper side. Alternatively, for example, as shown in FIG. 16 (b), each of the embedding portions 33 can be also formed into a generally column shape extending in the up-down direction (the thickness direction).

In order to form the embedding portions 33, a punching device 55 shown in FIGS. 17 (a) and 17 (b) is used.

The punching device 55 is provided with a support board 56 and a die 57 that is disposed in opposed relation to the upper side of the support board 56.

The support board 56 is, for example, formed of a metal such as stainless steel into a generally rectangular flat plate shape. Through holes 53 that pass through the support board 56 in the thickness direction are formed.

Each of the through holes 53 is formed into a generally circular shape in plane view.

The die 57 integrally includes a flat plate portion 58 and extruded portions 59 that are formed to be extruded downwardly from the flat plate portion 58.

The flat plate portion 58 is formed into the same shape as that of the flat plate portion 38 shown in FIG. 13 (a).

In the die 57, a plurality of the extruded portions 59 are disposed at spaced intervals to each other in the plane direction so as to correspond to the embedding portions 33 (ref: FIG. 17 (d)). That is, each of the extruded portions 59 is formed into the same shape and the same size as those of each of the through holes 53 in plane view, to be specific, into a generally column shape. Each of the extruded portions 59 is formed into the same shape as that of each of the embedding portions 33 (ref: FIG. 17 (d)). That is, each of the extruded portions 59 is formed into a generally rectangular shape in front sectional view and side sectional view.

In this way, the punching device 55 is configured to allow the extruded portions 59 to be capable of being inserted into the through holes 53 by the pushing down of the die 57.

The hole diameter of each of the through holes 53 and the diameter of each of the extruded portions 59 are, for example, 5 mm or more, or preferably 7 mm or more, and are, for example, 300 mm or less, or preferably 200 mm or less.

The spacer 40 is provided on the upper surface of the circumference end portion of the support board 56. The spacer 40 is, in plane view, disposed in a generally frame shape in plane view at the circumference end portion of the support board 56 so as to surround the through holes 53.

In order to form the embedding-reflector sheet 24 by the punching device 55 shown in FIGS. 17 (a)-(e), first, as shown in FIG. 17 (a), the reflector sheet 42 is disposed on the support board 56. To be specific, the reflector sheet 42 is disposed on the upper surface of the support board 56 so as to cover a plurality of the through holes 53.

Next, as shown in FIG. 17 (b), the reflector sheet 42 is stamped out using the punching device 55.

To be specific, the extruded portions 59 stamp out the reflector sheet 42 by pushing down the die 57.

In this way, the through holes 41 in shapes corresponding to the extruded portions 59 are formed in the reflector sheet 42.

In this way, the reflector portion 34 is formed on the support board 56.

Next, as shown in FIG. 17 (c), the die 57 is pulled up.

Thereafter, the formed reflector portion 34 is disposed in the pressing device 35 that is provided with the support board 36 and the die 37 made of the flat plate portion 38, and includes the releasing sheet 49.

Next, the phosphor sheet 25 is disposed on the reflector portion 34.

Next, as shown by the arrows in FIG. 17 (c), and in FIG. 17 (d), the phosphor sheet 25 is pressed by the pressing device 35. In this way, the embedding portions 33 are formed in the inside of the through holes 41 in the reflector portion 34.

In this way, the embedding-reflector sheet 24 including the embedding portions 33 and the reflector portion 34 is obtained between the support board 36 and the die 37.

Thereafter, the die 37 is pulled up and subsequently, as shown in FIG. 17 (e), the embedding-reflector sheet 24 is peeled from the releasing sheet 49.

In the eleventh embodiment, the same function and effect as that of the eighth embodiment can be achieved.

Twelfth Embodiment

In the views in the twelfth embodiment, the same reference numerals are provided for members and steps corresponding to each of those in the eleventh embodiment, and their detailed description is omitted.

In the method for producing the embedding-reflector sheet 24 in the eleventh embodiment, as shown in FIGS. 17 (c) and 17 (d), the embedding portions 33 are formed of the phosphor sheet 25. Alternatively, for example, as shown in FIG. 18 (c), the embedding portions 33 can be also formed by potting a varnish of a phosphor resin composition into the through holes 41 without using the phosphor sheet 25.

To be specific, the reflector portion 34 shown in FIG. 18 (b) is taken out from the punching device 55 to be subsequently, as shown in FIG. 18 (c), disposed on the upper surface of the releasing sheet 49. Then, the varnish of the phosphor resin composition is potted into the through holes 41.

In the twelfth embodiment, the same function and effect as that of the eleventh embodiment can be achieved.

Thirteenth Embodiment

In the views in the thirteenth embodiment, the same reference numerals are provided for members and steps corresponding to each of those in the eleventh embodiment, and their detailed description is omitted.

In the eleventh embodiment, as shown in FIG. 16 (c), the embedding portions 33 that embed the LEDs 4 are illustrated as cover portions. Alternatively, for example, as shown in FIG. 19 (c), cover portions 43 that cover the lower surfaces of the LEDs 4 can be also illustrated.

The cover portions 43 are provided in a cover-reflector sheet 44 so as to be surrounded by the reflector portion 34. In the cover-reflector sheet 44, each of the cover portions 43 is formed into the same shape as that of each of the embedding portions 33 shown in FIG. 16 (b) and furthermore, is formed into the same size as that of each of the LEDs 4.

As shown in FIG. 19 (b), for example, each of the cover portions 43 is disposed on the lower surface of each of the LEDs 4 so that each of the cover portions 43 is overlapped with each of the LEDs 4 when projected in the thickness direction, to be specific, the circumference end edge of each of the cover portions 43 is formed at the same position as the circumference end edge of each of the LEDs 4 in plane view.

[Covering Step]

In the thirteenth embodiment, the covering step shown in FIG. 19 (c) is performed instead of the embedding step shown in FIG. 16 (c). The conditions of the covering step are the same as those of the embedding step.

In the covering step shown in FIG. 19 (c), each of the cover portions 43 covers the lower surface of each of the LEDs 4. The LED 4 is pressed into the cover portion 43 by pressing of the LED 4, so that the cover portion 43 slightly expands outwardly in the plane direction. The degree of expansion thereof is subtle, so that in FIG. 19 (c), the lengths in the right-left direction of the cover portion 43 and the LED 4 after the pressing are shown to be the same.

In the thirteenth embodiment, the same function and effect as that of the eleventh embodiment can be achieved.

Fourteenth Embodiment

In the views in the fourteenth embodiment, the same reference numerals are provided for members and steps corresponding to each of those in the first embodiment, and their detailed description is omitted.

In the first embodiment, as shown in FIG. 1 (c), the embedding step in which the side surfaces and the lower surfaces of the LEDs 4 are covered with the phosphor layer 5 is performed. Alternatively, for example, as shown in FIG. 20 (c), the covering step in which the side surfaces only of the LEDs 4 are covered with the phosphor layer 5 can be performed instead of the embedding step.

[Disposing Step]

As shown in FIG. 20 (b), the thickness of the phosphor layer 5 that is disposed on the support sheet 1 is set to be thinner than that of each of the LEDs 4, that is, set to be, for example, 95% or less, or preferably 90% or less, and to be, for example, 10% or more with respect to the thickness of each of the LEDs 4. To be specific, the thickness of the phosphor layer 5 that is disposed on the support sheet 1 is set to be, for example, 1000 μm or less, or preferably 800 μm or less, and to be, for example, 30 μm or more, or preferably 50 μm or more.

[Covering Step]

As shown in FIG. 20 (c), each of the LEDs 4 is pressed into the phosphor layer 5 so that the upper surface of each of the LEDs 4 is covered with the release sheet 13 and the lower surface thereof is in contact with the upper surface of the pressure-sensitive adhesive layer 3 by the pressing.

The upper surface of the phosphor layer 5, which is pressed into gaps between a plurality of the LEDs 4, is formed to be flush with the upper surfaces of the LEDs 4. The lower surface of the phosphor layer 5 is also formed to be flush with the lower surfaces of the LEDs 4. That is, the thickness of the phosphor layer 5, which is pressed into gaps between a plurality of the LEDs 4, is the same as that of each of the LEDs 4.

[Peeling Step]

In FIG. 20 (e), in the peeling step, each of the phosphor layer-covered LEDs 10 is peeled from the upper surface of the pressure-sensitive adhesive layer 3. That is, each of the phosphor layer-covered LEDs 10 is peeled from the support board 2 and the pressure-sensitive adhesive layer 3 so that an interfacial peeling occurs between the phosphor layer 5 and the LEDs 4, and the pressure-sensitive adhesive layer 3.

In the phosphor layer-covered LED 10, the side surfaces of the LED 4 are covered with the phosphor layer 5, while both of a terminal that forms a part of the upper surface of the LED 4 and the lower surface of the LED 4 are exposed.

In the fourteenth embodiment, the same function and effect as that of the first embodiment can be achieved.

Fifteenth Embodiment

In the views in the fifteenth embodiment, the same reference numerals are provided for members and steps corresponding to each of those in the first embodiment, and their detailed description is omitted.

In the first embodiment, as shown in FIG. 1 (b), the phosphor layer 5 is formed of the phosphor sheet 25 that is formed in advance. Alternatively, for example, a phosphor resin composition is prepared as a varnish and the varnish can be also directly applied onto the support sheet 1 (to be specific, the upper surface of the pressure-sensitive adhesive layer 3).

In order to apply the varnish, for example, an application device such as a dispenser, an applicator, or a slit die coater is used. Preferably, a dispenser 26 shown in FIG. 21 is used.

Figure 21:
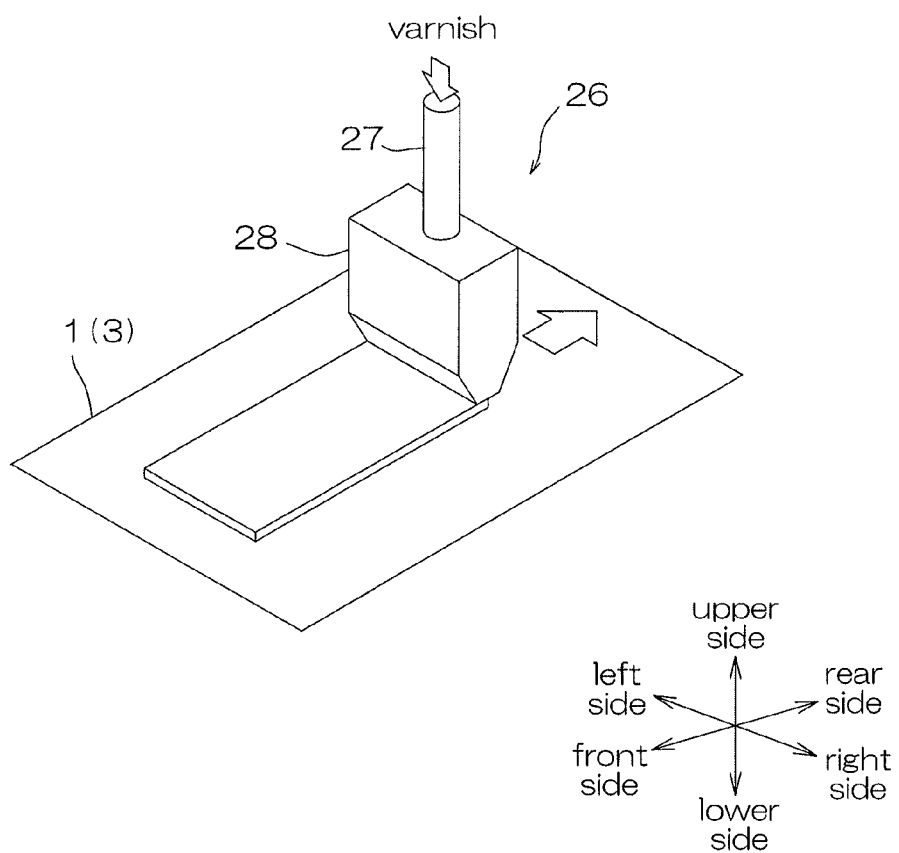
FIG. 21 shows a perspective view of a dispenser used in a fifteenth embodiment of a method for producing an encapsulating layer-covered optical semiconductor element of the present invention.

As shown in FIG. 21, the dispenser 26 integrally includes an introduction portion 27 and an application portion 28.

The introduction portion 27 is formed into a generally cylindrical shape extending in the up-down direction and the lower end portion thereof is connected to the application portion 28.

The application portion 28 is formed into a flat plate shape extending in the right-left and the up-down directions. The application portion 28 is formed into a generally rectangular shape in side view extending in the up-down direction. The introduction portion 27 is connected to the upper end portion of the application portion 28. The lower end portion of the application portion 28 is formed into a tapered shape in sectional side view in which the front end portion and the rear end portion are cut off. The lower end surface of the application portion 28 is configured to be capable of being pressed with respect to the upper surface of the pressure-sensitive adhesive layer 3. Furthermore, at the inside of the application portion 28, a broad flow path (not shown) in which a varnish introduced from the introduction portion 27 gradually expands in the right-left direction as it goes toward the lower section (downwardly) is provided.

The dispenser 26 is configured to be movable relatively in the front-rear direction with respect to the support sheet 1 extending in the plane direction.

In order to apply the varnish to the support sheet 1 using the dispenser 26, the application portion 28 is disposed in opposed relation (pressed) to the upper surface of the support sheet 1 and the varnish is supplied to the introduction portion 27. Along with this, the dispenser 26 is moved relatively toward the rear side with respect to the support sheet 1. In this way, the varnish is introduced from the introduction portion 27 into the application portion 28 and subsequently, is broadly supplied from the lower end portion of the application portion 28 to the support sheet 1. By the relative movement of the dispenser 26 toward the rear side with respect to the support sheet 1, the varnish is applied onto the upper surface of the support sheet 1 in a belt shape extending in the front-rear direction.

When the phosphor resin composition contains a thermosetting resin, the varnish is prepared in an A-stage state. When the varnish is, for example, supplied from the application portion 28 to the support sheet 1, it does not flow out of its position outwardly in the plane direction. That is, the varnish has viscous properties of keeping its position. To be specific, the viscosity of the varnish under conditions of 25° C. and one atmosphere is, for example, 1,000 mPa·s or more, or preferably 4,000 mPa·s or more, and is, for example, 1,000,000 mPa·s or less, or preferably 100,000 mPa·s or less. The viscosity is measured by adjusting a temperature of the varnish to 25° C. and using an E-type cone at a number of revolutions of 99 s$^{-1}$.

When the viscosity of the varnish is not less than the above-described lower limit, the varnish can be effectively prevented from flowing outwardly in the plane direction. Thus, it is not required to separately provide a dam member or the like in the support sheet 1, so that a simplified process can be achieved. Then, the varnish can be easily and surely applied to the support sheet 1 with a desired thickness and a desired shape with the dispenser 26.

On the other hand, when the viscosity of the varnish is not more than the above-described upper limit, the application properties (the handling ability) can be improved.

Thereafter, when the phosphor resin composition contains a thermosetting resin, the applied varnish is heated to be brought into a B-stage state (a semi-cured state). In this way, the phosphor layer 5 in a B-stage state is formed on the support sheet 1 (on the upper surface of the pressure-sensitive adhesive layer 3).

In the fifteenth embodiment, the same function and effect as that of the first embodiment can be achieved.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing an encapsulating layer-covered optical semiconductor element comprising:
    a disposing step of disposing an encapsulating layer containing a curable resin at one side in a thickness direction of a support;
    a covering step of, after the disposing step, covering a plurality of optical semiconductor elements with the encapsulating layer that is in a B-stage state so as to expose one surface of each of the optical semiconductor elements to obtain an encapsulating layer-covered optical semiconductor element;
    after the covering step, an encapsulating step in which the encapsulating layer is cured to be brought into a C-stage state and the optical semiconductor elements are encapsulated by the encapsulating layer in a C-stage state; and
    after the covering step, a cutting step in which the encapsulating layer is cut corresponding to each of the optical semiconductor elements while visually confirming each of the optical semiconductor elements having the one surface exposed to obtain a plurality of encapsulating layer-covered optical semiconductor elements.

2. The method for producing an encapsulating layer-covered optical semiconductor element according to claim 1, wherein the encapsulating layer contains a phosphor.

3. The method for producing an encapsulating layer-covered optical semiconductor elements according to claim 1, wherein the encapsulating layer includes
a cover portion that covers the optical semiconductor element and
a reflector portion that contains a light reflecting component and is formed so as to surround the cover portion.

4. The method for producing an encapsulating layer-covered optical semiconductor element according to claim 1, wherein the encapsulating layer is formed of an encapsulating sheet.

5. A method for producing an optical semiconductor device comprising:
    a step of preparing a substrate,
    a step of preparing an encapsulating layer-covered optical semiconductor element, and
    a step of mounting the encapsulating layer-covered optical semiconductor element on the substrate, wherein
    the step of preparing the encapsulating layer-covered optical semiconductor element comprises:
        a disposing step of disposing an encapsulating layer containing a curable resin at one side in a thickness direction of a support;
        a covering step of, after the disposing step, covering a plurality of optical semiconductor elements with the encapsulating layer that is in a B-stage state so as to expose one surface of each of the optical semiconductor elements to obtain an encapsulating layer-covered optical semiconductor element;
        after the covering step, an encapsulating step in which the encapsulating layer is cured to be brought into a C-stage state and the optical semiconductor elements are encapsulated by the encapsulating layer in a C-stage state; and
        after the covering step, a cutting step in which the encapsulating layer is cut corresponding to each of the optical semiconductor elements while visually confirming each of the optical semiconductor elements having the one surface exposed to obtain a plurality of encapsulating layer-covered optical semiconductor elements.

* * * * *